(12) United States Patent
Oliver et al.

(10) Patent No.: US 10,121,754 B2
(45) Date of Patent: Nov. 6, 2018

(54) INTERCONNECT STRUCTURES AND METHODS FOR FABRICATING INTERCONNECT STRUCTURES

(71) Applicant: Massachusetts Institute of Technology, Cambridge, MA (US)

(72) Inventors: William D. Oliver, Arlington, MA (US); Andrew J. Kerman, Arlington, MA (US); Rabindra N. Das, Lexington, MA (US); Donna-Ruth W. Yost, Acton, MA (US); Danna Rosenberg, Arlington, MA (US); Mark A. Gouker, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/342,444

(22) Filed: Nov. 3, 2016

(65) Prior Publication Data

US 2017/0133336 A1 May 11, 2017

Related U.S. Application Data

(60) Provisional application No. 62/251,248, filed on Nov. 5, 2015.

(51) Int. Cl.
*H01L 23/00* (2006.01)
*H01L 21/02* (2006.01)
(Continued)

(52) U.S. Cl.
CPC ............ *H01L 24/11* (2013.01); *G06N 99/002* (2013.01); *H01L 21/02063* (2013.01);
(Continued)

(58) Field of Classification Search
CPC ... H01L 24/11; H01L 39/02; H01L 21/02282; H01L 21/02345; H01L 22/26;
(Continued)

(56) References Cited

U.S. PATENT DOCUMENTS 4,316,200 A * 2/1982 Ames ................ H01L 23/53285
148/DIG. 89
4,612,083 A 9/1986 Yasumoto et al.
(Continued)

FOREIGN PATENT DOCUMENTS

WO WO 2016/025451 A1 2/2016
WO WO 2016/025478 A1 2/2016
(Continued)

OTHER PUBLICATIONS

U.S. Appl. No. 15/342,478, filed Nov. 3, 2016, Oliver, et al.
(Continued)

*Primary Examiner* — David Vu
(74) *Attorney, Agent, or Firm* — Daly, Crowley, Mofford & Durkee, LLP

(57) ABSTRACT

A method of fabricating an interconnect structure includes providing a semiconductor structure and performing a first spin resist and bake cycle. The first spin resist and bake cycle includes applying a first predetermined amount of a resist material over one or more portions of the semiconductor structure and baking the semiconductor structure to form a first resist layer portion of a resist layer. The method also includes performing a next spin resist and bake cycle. The next spin resist and bake cycle includes applying a next predetermined amount of the resist material and baking the semiconductor structure to form a next resist layer portion of the resist layer. The method additionally includes depositing a conductive material in an opening formed in the resist
(Continued)

layer and forming a conductive structure from the conductive material. An interconnect structure is also provided.

21 Claims, 14 Drawing Sheets

(51) Int. Cl.
H01L 21/66 (2006.01)
H01L 39/02 (2006.01)
G06N 99/00 (2010.01)
H01L 25/00 (2006.01)
H01L 27/18 (2006.01)
B82Y 10/00 (2011.01)
H01L 25/065 (2006.01)

(52) U.S. Cl.
CPC .. *H01L 21/02282* (2013.01); *H01L 21/02345* (2013.01); *H01L 22/26* (2013.01); *H01L 24/05* (2013.01); *H01L 25/0657* (2013.01); *H01L 25/50* (2013.01); *H01L 27/18* (2013.01); *H01L 39/02* (2013.01); *B82Y 10/00* (2013.01); H01L 24/13 (2013.01); H01L 24/81 (2013.01); H01L 25/0652 (2013.01); H01L 25/0655 (2013.01); H01L 2224/0401 (2013.01); H01L 2224/04042 (2013.01); H01L 2224/0558 (2013.01); H01L 2224/05111 (2013.01); H01L 2224/05116 (2013.01); H01L 2224/05169 (2013.01); H01L 2224/05609 (2013.01); H01L 2224/05644 (2013.01); H01L 2224/06181 (2013.01); H01L 2224/08503 (2013.01); H01L 2224/11001 (2013.01); H01L 2224/11005 (2013.01); H01L 2224/117 (2013.01); H01L 2224/1111 (2013.01); H01L 2224/11462 (2013.01); H01L 2224/11474 (2013.01); H01L 2224/11902 (2013.01); H01L 2224/13023 (2013.01); H01L 2224/13109 (2013.01); H01L 2224/16145 (2013.01); H01L 2224/16146 (2013.01); H01L 2224/17181 (2013.01); H01L 2224/32145 (2013.01); H01L 2224/48091 (2013.01); H01L 2224/48137 (2013.01); H01L 2224/48227 (2013.01); H01L 2224/73204 (2013.01); H01L 2224/73207 (2013.01); H01L 2224/80896 (2013.01); H01L 2224/8181 (2013.01); H01L 2224/81815 (2013.01); H01L 2224/92125 (2013.01); H01L 2225/0651 (2013.01); H01L 2225/06513 (2013.01); H01L 2225/06517 (2013.01); H01L 2225/06531 (2013.01); H01L 2225/06541 (2013.01); H01L 2225/06568 (2013.01); H01L 2225/06572 (2013.01)

(58) Field of Classification Search
CPC ..... H01L 21/02063; H01L 2224/11001; H01L 2224/11005; H01L 2224/1111; H01L 2224/11462; H01L 2224/11474; H01L 2224/117; H01L 2224/11902
See application file for complete search history.

(56) References Cited

U.S. PATENT DOCUMENTS

| | | | |
|---|---|---|---|
| 5,057,877 A | 10/1991 | Briley et al. | |
| 5,156,997 A | 10/1992 | Kumar et al. | |
| 5,179,070 A | 1/1993 | Harada et al. | |
| 5,371,328 A | 12/1994 | Gutierrez et al. | |
| 5,650,353 A | 7/1997 | Yoshizawa et al. | |
| 5,773,875 A | 6/1998 | Chan | |
| 6,108,214 A | 8/2000 | Fuse | |
| 6,297,551 B1 | 10/2001 | Dudderar et al. | |
| 6,324,755 B1 | 12/2001 | Borkowski et al. | |
| 6,346,469 B1 * | 2/2002 | Greer | H01L 24/03 257/772 |
| 6,355,501 B1 | 3/2002 | Fung et al. | |
| 6,396,371 B2 | 5/2002 | Streeter et al. | |
| 6,436,740 B1 | 8/2002 | Jen et al. | |
| 6,485,565 B1 | 11/2002 | Springer | |
| 6,678,167 B1 | 1/2004 | Degani et al. | |
| 6,819,000 B2 | 11/2004 | Magerlein et al. | |
| 6,825,534 B2 | 11/2004 | Chen et al. | |
| 6,838,774 B2 | 1/2005 | Patti | |
| 7,427,803 B2 | 9/2008 | Chao et al. | |
| 7,589,390 B2 | 9/2009 | Yao | |
| 7,624,088 B2 | 11/2009 | Johnson et al. | |
| 7,932,515 B2 | 4/2011 | Bunyk | |
| 7,939,926 B2 | 5/2011 | Kaskoun et al. | |
| 7,993,971 B2 | 8/2011 | Chatterjee et al. | |
| 8,202,785 B2 | 6/2012 | Castex et al. | |
| 8,354,746 B2 | 1/2013 | Huang et al. | |
| 8,466,036 B2 | 6/2013 | Brindle et al. | |
| 8,487,444 B2 | 7/2013 | Law et al. | |
| 8,492,911 B2 | 7/2013 | Bachman et al. | |
| 8,519,543 B1 | 8/2013 | Song et al. | |
| 8,546,188 B2 | 10/2013 | Liu et al. | |
| 8,564,955 B2 | 10/2013 | Schmidt et al. | |
| 8,736,068 B2 | 5/2014 | Bartley et al. | |
| 8,754,321 B2 | 6/2014 | Schroeder et al. | |
| 8,828,860 B2 | 9/2014 | Gruber et al. | |
| 8,928,128 B2 | 1/2015 | Karikalan et al. | |
| 8,954,125 B2 | 2/2015 | Corcoles Gonzalez et al. | |
| 9,076,658 B1 | 7/2015 | Brown et al. | |
| 9,171,792 B2 | 10/2015 | Sun et al. | |
| 2001/0016383 A1 | 8/2001 | Chen et al. | |
| 2002/0094661 A1 | 7/2002 | Enquist et al. | |
| 2003/0067073 A1 | 4/2003 | Akram et al. | |
| 2004/0124538 A1 | 7/2004 | Reif et al. | |
| 2004/0188845 A1 | 9/2004 | Iguchi et al. | |
| 2006/0191640 A1 | 8/2006 | Johnson | |
| 2007/0087544 A1 | 4/2007 | Chang et al. | |
| 2007/0119812 A1 | 5/2007 | Kerdiles et al. | |
| 2007/0207592 A1 | 9/2007 | Lu et al. | |
| 2008/0093747 A1 | 4/2008 | Enquist et al. | |
| 2008/0122115 A1 | 5/2008 | Popa et al. | |
| 2008/0169559 A1 | 7/2008 | Yang | |
| 2008/0230916 A1 | 9/2008 | Saito et al. | |
| 2008/0290790 A1 | 11/2008 | Jin | |
| 2008/0316714 A1 | 12/2008 | Eichelberger et al. | |
| 2009/0078966 A1 | 3/2009 | Asai et al. | |
| 2009/0173936 A1 | 7/2009 | Bunyk | |
| 2009/0186446 A1 | 7/2009 | Kwon et al. | |
| 2009/0233436 A1 | 9/2009 | Kim et al. | |
| 2010/0001399 A1 | 1/2010 | Topacio | |
| 2010/0026447 A1 | 2/2010 | Keefe et al. | |
| 2010/0122762 A1 | 5/2010 | George | |
| 2010/0130016 A1 | 5/2010 | DeVilliers | |
| 2010/0148371 A1 | 6/2010 | Kaskoun et al. | |
| 2010/0171093 A1 | 7/2010 | Kabir | |
| 2011/0049675 A1 | 3/2011 | Nagai et al. | |
| 2011/0140271 A1 | 6/2011 | Daubenspeck et al. | |
| 2011/0189820 A1 | 8/2011 | Sasaki et al. | |
| 2011/0204505 A1 | 8/2011 | Pagaila et al. | |
| 2011/0237069 A1 | 9/2011 | Miyazaki | |
| 2011/0248396 A1 | 10/2011 | Liu et al. | |
| 2012/0032340 A1 | 2/2012 | Choi et al. | |
| 2012/0074585 A1 | 3/2012 | Koo et al. | |
| 2012/0217642 A1 | 8/2012 | Sun et al. | |
| 2012/0228011 A1 | 9/2012 | Chang et al. | |
| 2012/0231621 A1 | 9/2012 | Chang et al. | |
| 2012/0252189 A1 | 10/2012 | Sadaka et al. | |
| 2012/0292602 A1 | 11/2012 | Guo et al. | |
| 2013/0029848 A1 | 1/2013 | Gonzalez et al. | |
| 2013/0093104 A1 | 4/2013 | Wu et al. | |
| 2013/0099235 A1 | 4/2013 | Han | |
| 2013/0147036 A1 | 6/2013 | Choi et al. | |
| 2013/0153888 A1 | 6/2013 | Inoue et al. | |
| 2013/0187265 A1 | 7/2013 | Shih et al. | |
| 2013/0244417 A1 | 9/2013 | Markunas et al. | |

(56) References Cited

U.S. PATENT DOCUMENTS

| | | |
|---|---|---|
| 2014/0001604 A1 | 1/2014 | Sadaka |
| 2014/0065771 A1 | 3/2014 | Gruber et al. |
| 2014/0113828 A1 | 4/2014 | Gilbert et al. |
| 2014/0246763 A1 | 9/2014 | Bunyk |
| 2014/0264890 A1* | 9/2014 | Breuer .................... H01L 24/11 257/773 |
| 2015/0041977 A1 | 2/2015 | Daubenspeck et al. |
| 2015/0054151 A1 | 2/2015 | Choi et al. |
| 2015/0054167 A1 | 2/2015 | Pendse |
| 2015/0054175 A1 | 2/2015 | Meinhold et al. |
| 2016/0364653 A1 | 12/2016 | Chow et al. |

FOREIGN PATENT DOCUMENTS

| | | | |
|---|---|---|---|
| WO | WO 2016/073049 A1 | 5/2016 | |
| WO | WO 2016/118209 A2 | 7/2016 | |
| WO | WO 2016/118210 A2 | 7/2016 | |
| WO | WO 2017/015432 A1 | 1/2017 | |

OTHER PUBLICATIONS

U.S. Appl. No. 15/342,589, filed Nov. 3, 2016, Oliver, et al.
U.S. Appl. No. 15/342,517, filed Nov. 3, 2016, Oliver, et al.
PCT International Search Report of the ISA for Appl. No. PCT/US2016/060263 dated Jan. 10, 2017; 3 pages.
PCT Written Opinion of the ISA for Appl. No. PCT/US2016/060263 dated Jan. 10, 2017; 6 pages.
Ohya, et al.; "Room Temperature Deposition of Sputtered TiN Films for Superconducting Coplanar Waveguide Resonators;" IOP Publishing—Superconductor Science and Technology; vol. 27; Mar. 26, 2014; 10 pages.
Tarniowy, et al.; "The Effect of Thermal Treatment on the Structure, Optical and Electrical Properties of Amorphous Titanium Nitride Thin Films;" Thin Solid Films 311; 1997; 8 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
PCT Search Report of the ISA for PCT/US2016/043266 dated Dec. 5, 2016; 5 pages.
PCT Written Opinion of the ISA for PCT/US2016/043266 dated Dec. 5, 2016; 9 pages.
Office Action dated Mar. 3, 2017 for U.S. Appl. No. 14/694,540; dated 16 pages.
International Preliminary Report dated Feb. 23, 2017 for PCT Application No. PCT/US2015/044608; 9 pages.
International Preliminary Report dated Feb. 23, 2017 for PCT Application No. PCT/US2015/044679; 9 pages.
International Preliminary Report dated Feb. 23, 2017 for PCT Application No. PCT/US2015/044651; 10 pages.
Office Action dated Mar. 24, 2017 for U.S. Appl. No. 15/303,800, 39 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Restriction Requirement dated May 16, 2017 for U.S. Appl. No. 15/327,249; 6 pages.
PCT International Preliminary Report on Patentability dated May 18, 2017 for PCT Appl. No. PCT/US2015/059181; 11 pages.
PCT International Preliminary Report on Patentability dated May 18, 2017 for PCT Appl. No. PCT/US2015/059200; 11 pages.
U.S. Appl. No. 14/694,540, filed Apr. 23, 2015, Das, et al.
U.S. Appl. No. 15/271,755, filed Sep. 21, 2016, Das.
U.S. Appl. No. 15/303,800, filed Oct. 13, 2016, Das, et al.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
U.S. Appl. No. 15/312,063, filed Nov. 17, 2016, Das, et al.
U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
Notice of Allowance dated Oct. 12, 2017 for U.S. Appl. No. 15/303,800; 16 pages.
Restriction Requirement for U.S. Appl. No. 15/271,755 dated Jun. 8, 2017; 6 pages.
Response to Jul. 7, 2017 Office Action for U.S. Appl. No. 15/271,755, filed Oct. 10, 2017; 33 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
International Search Report of the ISA for PCT Appl. No. PCT/US2016/060343 dated Jul. 18, 2017; 3 pages.
International Written Opinion of the ISA for PCT Appl. No. PCT/US2016/060343 dated Jul. 18, 2017; 12 pages.
Notice of Allowance for U.S. Appl. No. 15/327,235 dated Jun. 30, 2017; 17 pages.
Notice of Allowance for U.S. Appl. No. 14/694,540 dated Jul. 31, 2017; 9 pages.
Notice of Allowance for U.S. Appl. No. 15/312,063 dated Aug. 2, 2017; 17 pages.
Office Action dated Jul. 7, 2017 for U.S. Appl. No. 15/271,755; 26 pages.
Response to Office Action dated Mar. 3, 2017 for U.S. Appl. No. 14/694,540, filed Jun. 1, 2017; 24 pages.
Response to Office Action dated Mar. 24, 2017 for U.S. Appl. No. 15/303,800, filed Jun. 26, 2017; 22 pages.
Response to Restriction Requirement dated May 16, 2017 for U.S. Appl. No. 15/327,249, filed Jun. 27, 2017; 1 page.
Response to Restriction Requirement dated Jun. 8, 2017 for U.S. Appl. No. 15/271,755, filed Jun. 19, 2017; 1 page.
U.S. Final Office Action dated May 9, 2018 for U.S. Appl. No. 15/327,239; 25 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
U.S. Appl. No. 15/745,914, filed Jan. 18, 2018, Oliver, et al.
Office Action dated Jan. 11, 2018 for U.S. Appl. No. 15/327,239; 33 pages.
PCT International Preliminary Report on Patentability dated Feb. 1, 2018 for PCT Appl. No. PCT/US2016/043266; 11 pages.

(56) References Cited

OTHER PUBLICATIONS

Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
U.S. Non-Final Office Action dated Mar. 21, 2018 for U.S. Appl. No. 15/342,589; 25 pages.
Office Action dated Oct. 20, 2017 for U.S. Appl. No. 15/327,249; 30 pages.
Final Office Action dated Dec. 20, 2017 for U.S. Appl. No. 15/271,755; 25 pages.
Restriction Requirement dated Oct. 23, 2017 for U.S. Appl. No. 15/342,517; 6 pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Non-Final Office Action dated Jan. 11, 2018 for U.S. Appl. No. 15/327,239; Response filed Apr. 9, 2018; 25 Pages.
Response to U.S. Non-Final Office Action dated Oct. 20, 2017 for U.S. Appl. No. 15/327,249; Response filed Apr. 19, 2018; 19 Pages.
Response to U.S. Final Office Action dated Dec. 20, 2017 for U.S. Appl. No. 15/271,755; Response filed Apr. 23, 2018; 23 Pages.

* cited by examiner

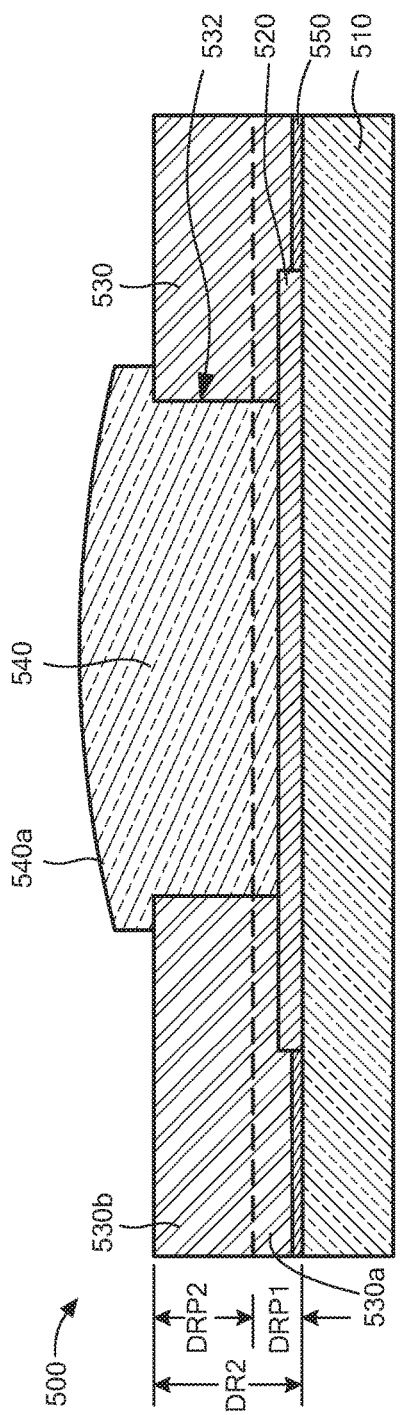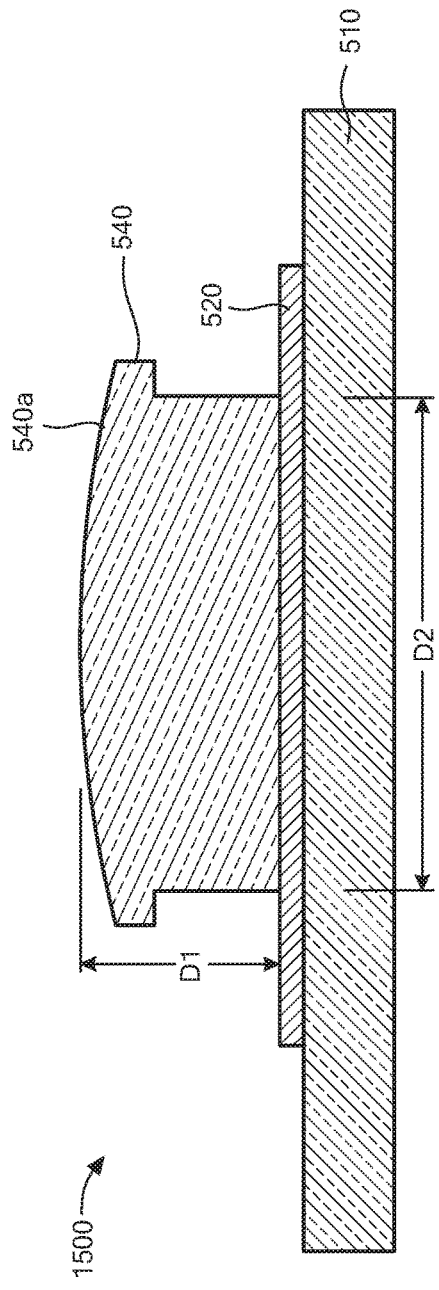
FIG. 5
FIG. 5A

INTERCONNECT STRUCTURES AND METHODS FOR FABRICATING INTERCONNECT STRUCTURES

CROSS REFERENCE TO RELATED APPLICATION

This application claims the benefit of U.S. Provisional Application No. 62/251,248 filed Nov. 5, 2015 under 35 U.S.C. § 119(e) which application is hereby incorporated herein by reference in its entirety. Also, the subject matter of application Ser. Nos. 15/342,478, 15/342,589, 15/342,517, all filed on even date herewith are hereby incorporated herein by reference in their entireties.

GOVERNMENT RIGHTS

This invention was made with Government support under Contract No. FA8721-05-C-0002 awarded by the U.S. Air Force. The Government has certain rights in the invention.

FIELD

This disclosure relates generally to interconnect structures, and more particularly, to interconnect structures and methods for fabricating interconnect structures.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life).

In particular, the foregoing trends and demand drive a need for integrated circuits which utilize superconducting materials and properties (so-called "superconducting integrated circuits"). Superconductor materials have substantially no electrical resistance below a certain critical temperature, which may provide for increased performance in integrated circuit devices. The foregoing trends and demand also drive a need for interconnects (or interconnect structures) which enable assembly of semiconductor structures including superconducting integrated circuits.

As is also known, superconducting integrated circuits are a leading candidate technology for large-scale quantum computing. Long coherence times compared to logic gate times are necessary for building a fault tolerant quantum computer. In the case of superconducting quantum bits (qubits), coherence time improvements are attributable to a number of design changes for specific superconducting materials.

One indicator of the coherence time of a superconducting quantum integrated circuit is intrinsic quality factor $Q_i$. Titanium nitride (TiN) superconducting coplanar waveguide (SCPW) resonators may be provided having high intrinsic quality factors $Q_i$. Although many studies have been done on qubits, a major technical challenge is the lack of existing high performance materials, which meet the stringent requirements of qubit applications. Such requirements include: providing materials having a high intrinsic quality factor, keeping a substantially stoichiometric thin film composition across a wafer, wafer-to-wafer reproducibility, and stability down to milli-Kelvin temperatures in addition to the mandatory requirements of scalability.

SUMMARY

Described herein are concepts, systems, circuits and techniques related to interconnect structures and methods for fabricating such interconnect structures. The described interconnect structures and techniques allow for assembly of multi-layer semiconductor structures including one or more superconducting semiconductor structures (or integrated circuits).

In one aspect of the concepts described herein, a method of fabricating an interconnect structure includes providing a single or multi-layer "semiconductor structure" (including a combination of metals, insulators, semiconductors, and superconductors) having a substrate and an interconnect pad, and performing a first spin resist and bake cycle. The first spin resist and bake cycle includes applying a first predetermined amount of a resist material over one or more portions of the semiconductor structure. The first spin resist and bake cycle also includes disposing the first predetermined amount of the resist material over one or more surfaces of the semiconductor structure using spin coating techniques. The first spin resist and bake cycle additionally includes baking the semiconductor structure to form a first resist layer portion of a resist layer.

The method of fabricating the interconnect structures also includes performing a next spin resist and bake cycle. The next spin resist and bake cycle includes applying a next predetermined amount of the resist material over one or more portions of the first resist layer portion formed during the first spin resist and bake cycle. The next spin resist and bake cycle also includes disposing the next predetermined amount of the resist material over one or more surfaces of the first resist layer portion using spin coating techniques. The next spin resist and bake cycle additionally includes baking the semiconductor structure to form a next resist layer portion over the first resist layer portion, the resist layer including at least the first resist layer portion and the next resist layer portion.

The method of fabricating the interconnect structures additionally includes forming an opening in a selected portion of the resist layer, and depositing a conductive material in the opening formed in the resist layer. The method also includes forming a conductive structure from the conductive material.

The method may also include one or more of the following features individually or in combination with other features. Disposing the first predetermined amount of the resist material over one or more surfaces of the semiconductor structure using spin coating techniques may include: rotating the semiconductor structure at a first predetermined rate and for a first predetermined time period using spin coating techniques until a first predetermined thickness of the resist material is achieved on the one or more surfaces semiconductor structure. The first predetermined thickness of the resist material may correspond to a distance between first and second opposing surfaces of the resist material. Baking the semiconductor structure to form the first resist layer portion may include: baking the semiconductor structure at a first predetermined temperature and for a first predetermined time period to form the first resist layer portion.

Disposing the next predetermined amount of the resist material over one or more surfaces of the semiconductor structure may include: rotating the semiconductor structure at a second predetermined rate and for a second predetermined time period using spin coating techniques until a second predetermined thickness of the resist material is achieved on the one or more surfaces semiconductor structure. The second predetermined thickness of the resist material may correspond to a distance between first and second opposing surfaces of the resist material. Baking the semiconductor structure to form the next resist layer portion may include: baking the semiconductor structure at a second predetermined temperature and for a second predetermined time period to form the next resist layer.

The method may further include: subsequent to performing the next spin resist and bake cycle, determining if any additional spin resist and bake cycles are needed. The method may also include: in response to there being additional spin resist and bake cycles needed, performing the next spin resist and bake cycle. Determining if any additional spin resist and bake cycles are needed may include: determining if the resist layer has a predetermined thickness. The predetermined thickness of the resist layer may correspond to a distance between first and second opposing surfaces of the resist layer. Determining if the resist layer has a predetermined thickness may include: selecting the predetermined thickness of the resist layer based upon a predetermined aspect ratio of a conductive structure to be formed in the interconnect structure.

Forming the conductive structure from the conductive material may include: forming the conductive structure by lifting-off or etching selected portions of the conductive material using lift off techniques. Forming an opening in a selected portion of the resist layer may include: forming an opening having a predetermined shape in a selected portion of the resist layer. The predetermined shape of the opening may be selected based upon a shape of the conductive structure to be formed in the opening. The method may further include: subsequent to forming the opening in the selected portion of the resist layer, cleaning one or more surfaces of the semiconductor structure through a plasma cleaning process. The method may also include: subsequent to forming the conductive structure, removing remaining portions of the resist layer from the semiconductor structure.

In another aspect of the concepts described herein, a method of fabricating an interconnect structure includes providing a semiconductor structure having a substrate and an interconnect pad. The method also includes depositing a superconducting film over selected portions of the semiconductor structure. The method further includes performing a first spin resist and bake cycle. The first spin resist and bake cycle includes applying a first predetermined amount of a resist material over one or more portions of the semiconductor structure. The first spin resist and bake cycle also includes disposing the first predetermined amount of the resist material over one or more surfaces of the semiconductor structure using spin coating techniques. The first spin resist and bake cycle additionally includes baking the semiconductor structure to form a first resist layer portion of a resist layer.

The method of fabricating the interconnect structure also includes performing a next spin resist and bake cycle. The next spin resist and bake cycle includes applying a next predetermined amount of the resist material over one or more portions of the first resist layer portion formed during the first spin resist and bake cycle. The next spin resist and bake cycle also includes disposing the next predetermined amount of the resist material over one or more surfaces of the first resist layer portion using spin coating techniques. The next spin resist and bake cycle additionally includes baking the semiconductor structure to form a next resist layer portion over the first resist layer portion of the resist layer.

The method of fabricating the interconnect structure additionally includes forming an opening in a selected portion of the resist layer. The method also includes forming a conductive structure in the opening using an electroplating process.

The method may also include one or more of the following features individually or in combination with other features. Disposing the first predetermined amount of the resist material over one or more surfaces of the semiconductor structure using spin coating techniques may include: rotating the semiconductor structure at a first predetermined rate and for a first predetermined time period using spin coating techniques until a first predetermined thickness of the resist material is achieved on the one or more surfaces semiconductor structure. The first predetermined thickness of the resist material may correspond to a distance between first and second opposing surfaces of the resist material.

Disposing the next predetermined amount of the resist material over one or more surfaces of the semiconductor structure may include: rotating the semiconductor structure at a second predetermined rate and for a second predetermined time period using spin coating techniques until a second predetermined thickness of the resist material is achieved on the one or more surfaces semiconductor structure. The second predetermined thickness of the resist material may correspond to a distance between first and second opposing surfaces of the resist material.

The method may further include: subsequent to performing the next spin resist and bake cycle, determining if any additional spin resist and bake cycles are needed. The method may also include in response to there being additional spin resist and bake cycles needed, performing the next spin resist and bake cycle. Determining if any additional spin resist and bake cycles are needed may include: determining if the resist layer has a predetermined thickness. The predetermined thickness of the resist layer may correspond to a distance between first and second opposing surfaces of the resist layer.

Determining if the resist layer has a predetermined thickness may include: selecting the predetermined thickness of the resist layer based upon a predetermined aspect ratio of a conductive structure to be formed in the interconnect structure. The method may also include: subsequent to forming the conductive structure, removing remaining portions of the resist layer from the semiconductor structure. The method may further include removing the superconducting film from the semiconductor structure.

In a further aspect of the concepts described herein, an interconnect structure formed on a semiconductor structure having a substrate and an interconnect pad includes a conductive structure having first and second opposing portions. The first portion of the conductive structure may be disposed over a surface of the interconnect pad. Additionally, the second portion of the conductive structure may extend a predetermined distance from the interconnect pad surface. The predetermined distance may be substantially greater than a thickness of a resist layer disposed over the interconnect pad surface during fabrication of the conductive structure. Additionally, the resist layer thickness may correspond to a distance between first and second opposing surfaces of the resist layer.

Superconducting electronics packaging is evolving to meet the demands of higher functionality into ever smaller packages. To accomplish this, new packaging structures and techniques are needed to be able to integrate more dies with greater functionality, higher I/O counts, and smaller die pad pitches into smaller and smaller footprints. In the present disclosure, innovative approaches are disclosed for squeezing more functionality into smaller packages. Enablers include materials selection, package designs, and integration approaches. In the disclosure a variety of integration approaches are proposed for integrated circuits formed of superconducting material(s), such as aluminum and/or niobium, to define superconducting qubits or other Josephson junction based Quantum devices.

Various designs, fabrication approaches and integration schemes of micro-bump technology with ultra-fine pitch assemblies for use in a Qubit packaging are disclosed. Choice of materials, size and shape of interconnect is key for achieving minimum or no electrical resistance through the superconducting path during system operation.

An integration approach is provided for Qubit systems where CMOS/single flux quantum (SFQ) devices and combinations thereof are attached to an MCM. A superconducting multi-chip module (MCM) may increase functionality and complexity of qubit systems by transferring signals between chips of the system with minimal/no reflections and power losses. Signal transfer (in z-direction) between two chips in a flip-chip configuration are provided by superconducting interconnect. An example interconnect is provided for a system to demonstrate minimum or no resistance for superconducting path as well as thermally conducting path for efficient heat dissipation.

An integrated approach is also provided to develop flip-chip superconducting interconnects for 3D constructions on various qubit die package configurations. This approach is suitable for high-end, expensive electronics where part of the package, if necessary, can be replaced or repaired, or even upgraded without compromising (or substantially compromising) overall electrical performance. Interconnect technology may be attractive for a range superconducting electronics. According to the disclosure, it is possible to integrate non-superconducting and superconducting IC together. Additionally, according to the disclosure, it is easy to integrate heterogeneous technologies and components on a same multi die SoC platform.

In one aspect of the disclosure, a cryogenic qubit package includes a superconducting and/or non-superconducting and/or partially superconducting substrate. Additionally, the cryogenic qubit package includes one or more superconducting integrated circuits (ICs) attached to the substrate by superconducting or partially superconducting and thermally conducting interconnects. Thermally conducting interconnects control the spacing between the ICs and substrate. At least one of the superconducting integrated circuits includes a qubit formed on high Q, low loss resonators structures preferably operated at radio frequency (RF) and/or microwave frequency region. The thermally conducting interconnects also protect the qubit surface during flip-chip bonding.

A method of fabricating a flip-chip with superconducting and thermally conducting interconnects is also provided. An Indium bump creates superconducting electrical interconnects and a gold bump acts as a spacer to control the indium bump height during flip-chip bonding. The gold bump also has a high level of thermal conductivity at or below 4K and helps to provide for efficient heat dissipation during system operation. In one embodiment, the gold bump can be replaced with a wire using wirebonding techniques. A 0.7 mil and above superconducting Al wire or goldwire can, for example, be used as spacer. An angle of a wirebonding loop formed using the wire may be close to zero in some embodiments.

In one embodiment, it is possible to use a one side open wire. Additionally, in one embodiment, it is possible to use a wire to produce 3D inductors. It is further possible to use a wire as 3D wall and possible to isolate or partially isolate Qubit. It is also possible to create a dielectric bridge using a physical, chemical and/or printing approach and a wire may be used to create 3D wall to isolate or partially isolate the qubit structures. It is further possible to use a dielectric bridge and a 3D wall to create hermetically shielded qubit or qubit chip package.

In another aspect of the disclosure, a cryogenic qubit package includes a superconducting and/or non-superconducting and/or partially superconducting substrate. The cryogenic qubit package also includes one or more superconducting integrated circuits (ICs) attached to the substrate by superconducting or partially superconducting interconnects and at least one Silicon/oxide/metal based spacer. The spacer controls the spacing between the ICs and substrate. At least one of the superconducting ICs includes a qubit formed on high Q, low loss resonator structures preferably operated at radio frequency (RF) and/or microwave frequency region. The spacer may also protect the qubit surface during flip-chip bonding. The spacer may include at least one of silicon, deposited silicon, high resistive silicon, oxide coated silicon, silicon dioxide, glass, etched silicon, annealed oxide, oxide etched recrystallized silicon, aluminum oxide, metal based spacer.

In one embodiment, an Indium bump will create superconducting electrical interconnect. Additionally, a Gold or Aluminum wire may act as a spacer to control the indium bump height during flip-chip bonding. The Gold or Al wire can also create 3D wall to isolate specific devices. The 3D wall may use dielectric bridges. An Al wire can make a superconducting 3D wall. Additionally, it is possible to create an Al and or Au gold wire for a spacer as well as an inductor. The wire can be 3D transmission line and or spiral and or solenoid inductor.

In another aspect of the disclosure, systems and methods are provided to achieve increased (i.e., faster) heat dissipation from a 3D chip stack. Efficient heat dissipation from TSV/middle chips of a 3D stack during system operation may, for example, minimize noise and provide for better performance.

In another aspect of the disclosure, systems and methods of creating a micro-bump taller than the photo resist used to define the micro-bump are provided. For an evaporated micro-bump, a tip of micro-bump or area of top surface micro-bump may be less than an area of a resist opening. Additionally, for a plated micro-bump, an area of top surface micro-bump may be more than the area of top resist opening.

In another aspect of the disclosure, a superconducting integrated circuit (IC) includes a physically deposited and or an etched spacer. The spacer may protect the IC during flip-chip bonding from scratches and also be provided as mechanical stop for the IC. Additionally, the spacer may minimize spacing for flip-chip bonded superconducting integrated circuits.

In another aspect of the disclosure, systems and methods of creating a tall microbump on a wafer using contact lithography are provided. A single thick resist coating provided on a wafer may create significant non-uniformity and edge bond which is not suitable for contact lithography.

Second or more coatings may minimize (or, ideally eliminate) non-uniformity and edge bond and make it possible to create a tall micro-bump.

In another aspect of the disclosure, systems and methods creating a variable density and pitch multi microbump are provided. A photolithography process may be used to create the bump for a lowest pitch pad structure and a same bump may be repeated multiple times on the same pad for a larger pitch structure. This approach may minimize solder spreading in a larger pad and may also minimize electrical shorts while maintaining (or providing for) a finer pitch and a larger pitch structure.

In accordance with a still further aspect of the concepts, circuits systems and techniques described herein, an interconnect structure formed on a semiconductor structure having a substrate and an interconnect pad, the interconnect structure comprising: a conductive structure having first and second opposing portions, wherein the first portion of the conductive structure is disposed over a surface of the interconnect pad and the second portion of the conductive structure extends a predetermined distance from the interconnect pad surface, and wherein the predetermined distance is substantially greater than a thickness of a resist layer disposed over the interconnect pad surface during fabrication of the conductive structure, the resist layer thickness corresponding to a distance between first and second opposing surfaces of the resist layer.

The interconnect structure may include some or all of the below features either individually or separately: a double spin coated resist layer thickness around 30 micron to produce around 6-40 micron tall interconnect structure; around 10 micron thick single resist coating that can produce around 15 micron tall interconnect structure; around 10 micron thick resist targeted for 15 micron diameter bump having a top resist opening around 10-16 and a bottom resist opening around 16-22 micron and able to produce 6-15 micron tall interconnect structure; and around 6-9 micron thick resist targeted for 5-7 micron diameter bump having a top resist opening around 4-8 and a bottom resist opening around 6-10 micron and able to produce a 4-12 micron tall interconnect structure.

In accordance with a still further aspect of the concepts, circuits systems and techniques described herein, a flip-chip includes superconducting integrated circuit (IC) having a physically deposited and or an etched spacer and superconducting MCM having tall interconnect structure. The spacer protects the superconducting integrated circuit during flip-chip bonding from scratches or other abrasions or imperfections and also may act as a mechanical stop for the IC. The spacer controls spacing for flip-chip bonded superconducting integrated circuits.

The flip-chip structure may include some or all of the below features either individually or separately: a solder coated metal bump as spacer where solder will provide superconductivity and metal will provide high thermal conductivity necessary for heat dissipation; the metal bump may be replaced with a UBM coated etched or deposited Si where solder will provide superconductivity and Si will provide high thermal conductivity necessary for heat dissipation;

More detailed embodiments of the disclosure are described below.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 5 shows a cross-section of an example semiconductor structure as may be formed in accordance with the method of FIG. 4, for example;

FIG. 5A shows a cross-section of an example interconnect structure as may be formed in accordance with the method of FIG. 4, for example;

DETAILED DESCRIPTION

Figure 1:
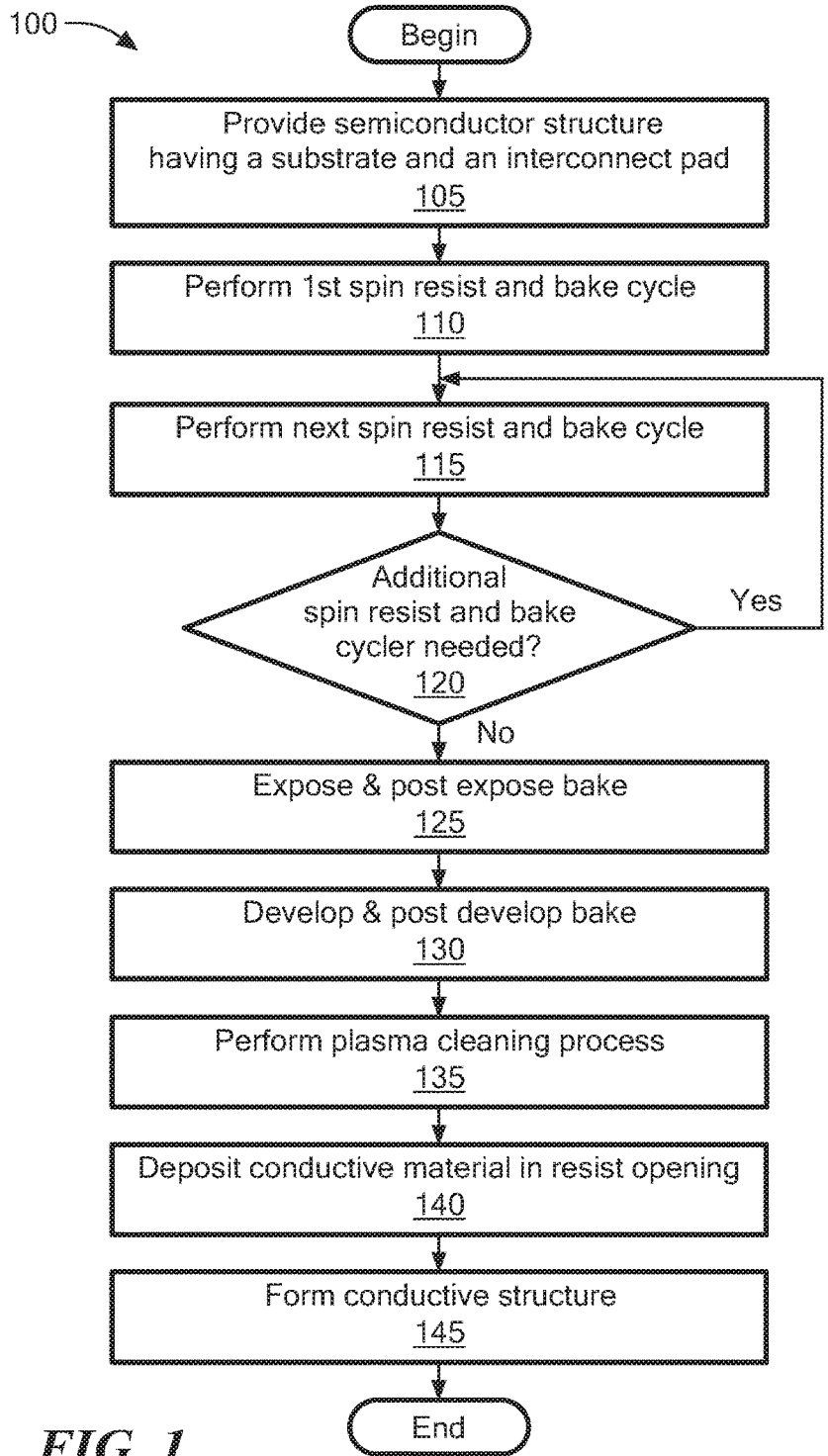
FIG. 1 is a flowchart illustrating an example method for fabricating a interconnect structure in accordance with an embodiment of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called high Q metals or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhuthenium (Re), diamond, graphine etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e. an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate.

A bit is the most basic unit of classical logic and can occupy one of two discrete states, 0 or 1. A quantum bit, or 'qubit,' on the other hand, can be an arbitrary superposition of the eigenstates |0> and |1>. A quantum computer is comprised of logic gates that operate on an ensemble of quantum bits.

Where n classical bits can only exist in one of the 2n possible states, a quantum processor with n qubits can be placed in a complex superposition state of any weighted combinations of all 2n permutations, containing an exponentially larger state space than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete and harmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements. A "superconducting device," as defined herein, includes at least one of a superconducting trace, a superconducting interconnect, a partially superconducting interconnect, a Josephson junction, a superconducting qubit and a superconducting resonator during operation.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, capacitively shunted flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-½" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states.

The term "coupler" as used herein refers to a physical device that allows one qubit to influence another qubit. An inductor and/or a Josephson junction can be a part of coupler. A coupler may be characterized by a real valued constant (strength) that indicates controls or influence exerted by one qubit on another. A coupler consists of at least one of a qubit, a resonator, a Josephson junction, an inductor and a capacitor.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes any structure capable of electrically interconnecting and/or magnetically and/or inductively and/or capacitively coupling arrays of superconducting conductors on two opposing circuitized substrates using extremely small superconductive and or partially superconductive elements such as micro-bumps, solder paste or conductive paste, as well as by using conductive and or superconductive thru-holes. Such an interposer, as defined herein, includes at least one dielectric layer (and may include many) and at least two external superconductive circuit layers (and possibly one or more internal superconductive circuit layers) wherein the layers may each include selective and or a density array of contact locations. Examples of dielectric materials include such materials as high resistive silicon, silicon oxide coated Si, silicon nitride coated Si, selective silicon oxide coated Silicon, selective silicon nitride coated Silicon, selective or entire low loss organic (e.g., BCB) coated Silicon and combination.

Examples of conductive and or superconductive thru-holes as defined herein include materials as niobium (Nb), niobium nitride (NbN), titanium-niobium-nitride (TiNbN), titanium nitride (TiN), aluminum (Al), rhenium (Re), tungsten, silicide, diamond or any other possible superconducting metal and or superconducting nitride and combination. In one example, conductive and or superconductive thru-holes as defined herein include at least single and or multilayer Titanium nitride where part of the Titanium nitride can be used as Silicon and titanium etch barrier. It is further possible to use titanium nitride single and or multilayer materials with multiple composition and or concentration gradient where at least one composition and or concentration is superconducting during device operation.

The term "superconducting multi-chip module (SMCM)" as used herein includes at least one dielectric layer (and may include many) and at least one superconductive circuit layers (and possibly one or more internal superconductive circuit layers) deposited on the base substrate (e.g. Si or high resistive Si) using thin film technology. It is further possible to include one superconductive via and or superconducting pad wherein the superconducting pad containing under bump metals. Examples of dielectric materials include such materials as silicon (Si), high resistive silicon, silicon oxide as dielectric on Si, silicon nitride as dielectric on Si, selective silicon oxide on Silicon, selective silicon nitride on Silicon, selective or entire low loss organic (e.g., BCB) coated Silicon and combination.

Examples of superconductive circuits, vias and pads as defined herein include materials as niobium (Nb), niobium nitride (NbN), titanium-niobium-nitride (TiNbN), titanium nitride (TiN), aluminum (Al), rhenium (Re), or any other possible superconducting metal and or superconducting nitride and combination. A substrate may have a Josephson junction and or an embedded Josephson junction. It is further possible to use integrated and or embedded capacitors, inductors, resistors. Patterned NbN can act as inductor. Capacitor may be planer, parallel plate, interdigitate and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and or normal via between superconducting circuits for interconnects.

A substrate, as defined herein, is used to describe a chip carrier for flip-chip and or wirebonding and or 3D circuits. The substrate can be an active and or a passive integrated circuit based carrier. Additionally, the substrate can be an active and or passive TSV and or MCM and or single chip module based chip carrier. The chip carrier can be Si based, organic based, ceramic based, Sapphire based or a combination thereof.

Superconducting multi-chip module (SMCM) can have normal UBM conductor for heterogeneous integration as well as to protect the superconducting pad. We defined "superconducting multi-chip module (SMCM)" when at least part of the circuit is normal conductor and part of superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer.

Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and or normal chips. Similarly, superconducting single-chip module (SSCM) may be used to assemble a single superconducting or normal chip. The term "superconducting module" or "superconducting substrate" includes both superconducting multi-chip module (SMCM) and superconducting single-chip module (SSCM). We use the term "normal module" or "normal substrate" which includes both multi-chip module (MCM) and single-chip module (SCM). Both superconducting and normal module able to attach superconducting and or normal conducting chips.

We defined "cryogenic electronic packaging" as integration and packaging of electronic components for cryogenic (77° K and below) applications. It is possible cryogenic electronic package can be used for room temperature electronics as well. For example interface electronics which needs to interface between cryo and room temperature electronics able to operate at both temperature zone. It also possible that cryogenic electronic package can be used for specific temperature operation (e.g., 4-10° K, below 100° mK). For example superconducting niobium electronics operates below 8° K, whereas superconducting Aluminum electronics operates at below 500° mK.

The term "under bump metal (UBM)" or "under bump metallization (UBM)" as used herein refers to structures which include materials which provide a low resistance electrical connection to the superconducting pad. A UBM may adhere well both to the underlying superconducting pad and to the surrounding superconducting circuit's passivation layer, hermetically sealing the superconducting circuits from the environment. In some cases, a UBM may provide a strong barrier to prevent the diffusion of other bump metals into the superconducting circuits.

A top layer of a UBM must be readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and or mechanical connection between two superconducting circuits. We defined "superconducting interconnect" when superconducting bump and superconducting UBM create superconducting interconnect between two superconducting circuits during operation. We also defined "superconducting interconnect" when superconducting bump and normal UBM conductor create superconducting interconnect between two superconducting circuits during operation. Here normal UBM conductor becomes superconducting due to proximity effect.

Example compositions of superconducting interconnects include: (10-400)nm Al-(3-20)nm Ti-(5-40)nm Au-(1-5)μm In-(5-40)nm Au-(5-20)nm Ti-(10-400)nm Al. In such examples, Al is used as a superconducting pad and Ti—Au or Ti—Au-thin (≤1000 nm) Indium can act as a UBM. It is possible for Au thickness in the interconnect part to be consumed by Indium and rest of the Au will superconducting based on proximity.

Additional example compositions of superconducting interconnects include: (10-400)nm Al-(3-20)nm Ti-(1-5)μm In-(5-20)nm Ti-(10-400)nm Al, (10-400)nm Al (1-5)μm In-(10-400)nm Al, (10-400)nm Al-(3-20)nm Ti-(5-40)nm Au-(1-5)μm In-(1-5)μm Sn-(5-40)nm Au-(5-20)nm Ti-(10-400)nm Al, and (10-400)nm Nb-(3-20)nm Ti-(5-40)nm Au-(1-5)μm In-(5-40)nm Au-(5-20)nm Ti-(10-400)nm Nb.

Further example compositions of superconducting interconnects include: (10-400)nm Nb-(3-20)nm Ti-(1-5)μm In-(5-20)nm Ti-(10-400)nm Al, (10-400)nm Nb-(1-5)μm In-(10-400)nm Nb, (10-400)nm Al-(3-20)nm Ti-(5-40)nm Au-(1-5)μm In-(1-5)μm Sn-(5-40)nm Au-(5-20)nm Ti-(10-400) nm Al, and (10-400)nm Al-(3-20)nm Ti-(5-200)nm TiN-(1-5)μm In-(5-200)nm TiN-(5-20)nm Ti-(10-400)nm Al, (10-400)nm Al-(3-20)nm Ti-(5-200)nm TiN-(5-40)nm Au-(1-5) μm In-(5-40 nm) Au-(5-200)nm TiN-(5-20)nm Ti-(10-400) nm Al. Additional example compositions of superconducting interconnects include: (10-400)nm Nb-(3-20)nm Ti-(5-200)nm TiN-(1-5)μm In-(5-200)nm TiN-(5-20) nm Ti-(10-400)nm Nb, (10-400)nm Nb-(3-20)nm Ti-(5-200) nm TiN-(5-40)nm Au-(1-5)μm In-(5-40 nm) Au-(5-200)nm TiN-(5-20)nm Ti-(10-400)nm Al, and combinations thereof.

We defined "partially superconducting interconnect" when superconducting bump and normal UBM conductor create normal conductor interconnect between two superconducting circuits during operation. Here normal UBM conductors dominate interconnect conductance although part of the interconnect is superconducting due to superconducting bump. In one example superconducting interconnect use as Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)-8 um In, Ti(5 nm)-Au (100 nm)-8 um In, Ti(5 nm)-Au(50 nm)-8 um In, Ti(5 nm)/Pt(20 nm)/Au(20 nm)+8 um In, Ti(5 nm)/Pt(20 nm)/ Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 um tin, 6 um Silver bump with 2 um In, 5 nmTi-6 um Ag-5 nmTi-50 nmPt-100 nmAu-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48Sn-52In etc. In one example, a total interconnect resistance for an Al based superconducting substrate may be calculated as: interface resistance of Al-UBM+interface resistance of (UBM-In)+ interface resistance of (In-UBM)+interface resistance of UBM-Al.

In this example, it is assumed that an Al pad is used for both superconducting integrated circuits and or modules for creating superconducting and or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

A Josephson junction is defined as two superconductors allowed interacting through a so-called "weak link," where the "weak link" may be provided from a thin insulating barrier, a normal metal, or a narrow superconducting constriction—respectively referred to as an S-I-S, S-N-S, or S-C-S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\phi_1$) coherently connects with that of the other electrode $\phi_2$) via the elastic tunneling of Cooper pairs through the barrier. The resulting supercurrent, I, and junction voltage, V, are related to the superconducting phase difference, $\phi=\phi_1-\phi_2$, across the junction.

A circuit quantum electrodynamics (circuit QED) may be used to address and measure a superconducting qubit. Circuit QED, superconducting qubits coupled to the electric field in a planar transmission line resonator. For cavity QED an atom in the cavity interacts with the trapped photons, and a measurement of the photons leaking out of the cavity allows one to probe the state of the atom.

In Circuit QED, the cavity is replaced by a λ/2 transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on or near resonance with the resonator-qubit system.

Superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

As used here, the term "chemically activated surface" is used to describe a surface which is minimally etched and/or damaged. The hydrophilicity or hydrophobicity of the surface may be changed with appropriate plasma and/or chemical treatment by changing or modifying surface chemistry.

As used herein, the term "circuitized substrate" is used to describe a semiconductor structure including at least one dielectric layer, the at least one dielectric layer having at least one surface on which at least one circuit is disposed. Examples of dielectric materials suitable for the at least one dielectric layer include low temperature co-fired ceramic (LTCC), ceramic (alumina), fiberglass-reinforced or non-reinforced epoxy resins (sometimes referred to simply as FR4 material, meaning its Flame Retardant rating), polytetrafluoroethylene (Teflon), polyimides, polyamides, cyanate resins, photoimagable materials, and other like materials, or combinations thereof. Examples of electrically conductive materials suitable for the at least one circuit include copper and copper alloy. If the dielectric layer is provided from a photoimagable material, it is photoimaged or photopatterned, and developed to reveal the desired circuit pattern, including the desired opening(s) as defined herein, if required. The dielectric layer may be curtain coated or screen applied, or it may be supplied as a dry film or in other sheet form.

As used herein, the term "conductive fusible metal" is used to describe a metal including one or more of tin-lead, bismuth-tin, bismuth-tin-iron, tin, indium, indium-silver-lead, indium-lead (In—Pb), Indium-lead-tin (In—Pb—Sn), tin-indium, indium-gold, tin-indium-gold, tin-silver, tin-gold, indium, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof. The metals may change forms (e.g., from a solid to a liquid) during a bonding or during post bonding annealing or reflow process.

As used herein, the term "conductive structure" is used to describe an interconnect structure for electrically coupling one or more interconnect pads, electrical connections, components, devices, modules, and semiconductor structures and devices. The conductive structure may include at least one of a micro via having a diameter which is between about one micrometer (μm) and about one-hundred fifty μm's and a sub-micron via having a diameter of less than about one μm.

As used herein, the term "via first" may be used to describe a micro via and/or a submicro via used to make at least one electrical connection between a first device layer and second device layer in a semiconductor structure including at least two device layers. Additionally, as described here, the term "via" first may also be used to describe a micro via and/or a submicro via passing through a dielectric material or layer (in some embodiments, only the dielectric material or layer) to make at least one electrical connection between a first device layer and a second device layer in a semiconductor structure including at least two device layers. For a via first process, the first device layer and the second device layer are completed separately. As one example, a partial via material is added on first and/or second opposing surfaces (i.e., top and/or bottom surfaces) of the first second device layers and subsequent bonding and/or post bonding process create a via first between the first and second device layers.

The via first may be filled with at least one metal or alloy having a high Coefficient of Thermal Expansion (CTE) to produce a rigid, robust, and conductive via first joint between the at least two device layers during the composite bonding process. High temperatures and/or high pressures may be applied and used to bond the two device layers and provide a three-dimensional (3D) interconnection (i.e., interconnect) among the device layers. The high CTE metal or alloy are expanded at relatively high temperatures and interdiffuse with each other to produce the 3D interconnect. Alternatively, the via first may be filled with a low temperature fusible metal which melts and interdiffuse during bonding or post bonding processes.

As used herein, the term "spacer" is used to describe a structure, or a combination of structures, to control spacing between a chip and a chip carrier and or protect the chip during flip-chip bonding and or when providing self-alignment marks on the chip. In one example, Gold or Aluminum wire act as a spacer to control indium bump height during flip-chip bonding. In another example, Gold or Al wire can create a wall (e.g., a 3D wall) to isolate specific devices. A 3D wall may, for example, provide isolation which is suitable for use in dielectric bridges. In one embodiment, an Al wire can make (or provide) a superconducting 3D wall.

In some embodiments, it is possible to create and use an Al and or Au wire for a spacer as well as inductor. The wire can be a 3D transmission line and or spiral and or solenoid inductor. A spacer may include at least one of a silicon, a deposited silicon, an etched silicon, a high resistive etched silicon, an oxide coated silicon, silicon dioxide, glass, etched and or deposited silicon nitride, annealed oxide, oxide etched recrystallized silicon, aluminum oxide, one or more metals and combinations thereof.

As used herein, the term "via last" is used to describe a micro via and/or a submicro via used to make at least one electrical connection between a first device layer and a second device layer in a semiconductor structure including at least two device layers. Fabrication of the first device layer is completed first, and the second device layer is deposited over the first device layer. The second device layer is completed with via last process. A pad layer which includes one or more interconnect pads may be added after via last process. In one embodiment, via last is filled. Additionally, in one embodiment, the via last can be unfilled or partially filled. Via last may pass through the device layers (e.g., second device layers) and, in some embodiments, one or more isolation layers or materials. A titanium (Ti) material having a thickness of about ten nanometers (nm) and, a metal organic chemical vapor deposition (MOCVD) Titanium Nitride (TiN) liner having a thickness of about five nm, and tungsten plugs may be used for via lasts. A MOCVD or chemical vapor deposition (CVD) $TiN_X$, with X less than or equal to 1, is preferred for better conformal coating.

As used herein, the term "through silicon via" (TSV) is used to describe a vertical interconnect which passes substantially through one or more of a silicon wafer, a silicon die, a silicon interposer, silicon active circuits, silicon passive circuits, or other silicon circuits, components or layers. TSVs can be fabricated by different methods and approaches. In Silicon (Si) via-first approaches, for example, TSVs are fabricated prior to fabrication of active devices (i.e. bipolar or MOSFET devices) to which the TSVs may be coupled. The approach includes patterning the TSVs, lining the TSVs with a high temperature dielectric (thermal oxide or chemical vapor deposition), filling the TSVs with doped polysilicon and using chemical mechanical polishing (CMP) techniques to remove excess polysilicon from one or more surfaces of the TSVs. Si via-first approaches allow for the use of high temperature processes to insulate and fill the TSVs.

In Si via-middle approaches, TSVs are fabricated after forming the active devices to which the TSVs may be coupled, but before back end of line (BEOL) stack fabrication. The approach includes patterning the TSVs after a contact process, lining the TSVs with a low temperature dielectric deposition, and then filling the TSVs with single/multiple barrier metals. Typically the TSVs are filled with Copper (Cu) and/or W. For TSVs filled with Cu, a Cu seed layer is disposed on top of a barrier layer and a subsequent Cu electroplating fills the TSVs. The TSVs are then planarized using CMP techniques. For W, chemical vapor depositing (CVD) processes are used to fill the TSVs, and CMP techniques are used to remove excess polysilicon from one or more surfaces of the TSV. W is preferred for filling high aspect ratio TSVs (e.g., TSVs with aspect ratio of height-to-width>10:1). In general, Cu is used to fill low aspect ratio TSVs (e.g., TSVs with aspect ratio<10:1). Si via-middle process are useful for fabricating TSVs with a small via pitch, TSVs having minimal blockage of wiring channels, and TSVs having a low via resistance, for example.

In front side Si via-last approaches, TSVs are fabricated at the end of the BEOL processing of the wafer. Si via-last approaches are similar to Si via middle approaches, but Si via-last approaches use low temperature dielectric depositions (<400 C) compared to higher temperature dielectric compositions (<600 C) in Si via middle approaches. Front side Si via-last approaches may be suitable for their coarse TSV feature size, which simplifies the process of integrating TSVs into semiconductor structures. The front side Si via-last approaches may also useful for wafer-to-wafer bonding. In such approaches, TSVs can be formed at the end of the wafer-to-wafer bonding process, connecting multiple layers in the multi-layer (e.g., three-dimensional (3D)) stack of wafers or semiconductor structures.

Front side Si via-last approaches may use TSV etch as well as the entire BEOL dielectric stack. Backside Si via-last approaches also use wafer to wafer (or semiconductor structure to semiconductor structure) stacking. The wafers can be bonded together using oxide bonding or polymer adhesive bonding, either front-to-front or front-to-back. The wafers can be thinned by etching and or polishing. Additionally, a TSV may be formed in the wafers by etching a via down to bond pads on a top wafer and a bottom wafer. The process includes patterning the TSVs after the contact process, lining the TSVs with a low temperature dielectric deposition, and then filling the TSVs with a single/multiple barrier metal (e.g., Cu and/or W). The TSVs are then planarized through a subsequent CMP process.

A number of inorganic and organic dielectric materials having a thickness in a range of about one hundred nanometers (nm) to about one thousand nm can be used to insulate the TSVs. TSV dielectrics may be required to have good step coverage (at least 50% through the depth of the trench), good thickness uniformity (<3% variation across the wafer), high deposition rate (>100 nm/min), low stress (<200 MPa), low leakage current (<1 nA/cm2), and high breakdown voltage (>5 MV/cm).

Plasma-enhanced chemical vapor deposition (PECVD) of SiO2 or SiN, or sub-atmospheric chemical vapor depositions (SACVD) of SiO2, are some examples of insulator deposition. The most commonly used conductors to fill TSVs are doped polysilicon (180 lohm-cm), tungsten (5.6 lohm-cm), or copper (1.7 lohm-cm). W deposited by CVD has a good fill of the TSV and can be integrated with the contacts to which the TSVs are to be coupled. A TiN liner is required to ensure that the WF6 precursor does not attack the Si substrate in the TSV. A disadvantage of W compared to Cu is that it has a high intrinsic stress (1400 MPa for W, 20 MPa for Cu). TSV can be superconducting during qubit operation. A superconducting TSV comprises a Titanium Nitride (TiN) and or poly Si and or Al and or high Q metal. TSV can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

Reactive-ion-etching (RIE) may be used to create high aspect ratio TSVs and deep trench structures in the Si (i.e., for capacitors or for isolation) in which the TSVs are provided. In one embodiment, a TSV RIE Bosch process may be used to fabricate the TSVs, with process alternating between deposition and etching steps to fabricate deep vias. SF6 isotropic etching of Si may not be suitable for forming TSVs (which require a highly anisotropic etch). Fluorocarbon chemistry (e.g., C4F8) may be used for anisotropic etching achieved through the deposition of a chemically inert passivation on the sidewall of the TSVs.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically the via, the size of the metal contacts, and thus the pitch of the vertical interconnect, is made proportional to about twice the wafer-wafer misalignment of the wafers including the first and second device layers.

We define "resist" or "photo resist" or "photo imageable polymer" as one or more photosensitive materials that when exposed to light, substantially loses its chemical structures. The materials may be attacked by an etchant or solvent or acidic or basic solutions to create nano and or sub-micro and or micro pattern (or patterns) suitable for making nano and or micro circuits.

In general, there are two types (or two major types) of photoresist: positive and negative photoresists. Positive resists (or photoresists) are currently the dominant type of resist used in integrated circuits, UBMs, and plating processes. A negative resist process is suitable for use in lift-off technique. For positive resists, when the resist is exposed with UV light, the chemical structure of the resist changes and becomes more soluble in the developer. The resist may be washed away by a developer solution, leaving windows of the bare underlying material which contains a substantially exact copy of a pattern mask disposed over the resist.

For negative resists, exposure to UV light causes the negative resist to become polymerized, and more difficult to dissolve. A developer solution removes only the unexposed un-polymerized portions. Various resists can be used for lithography including, but not limited to, resists provided by: AZ Electronic Materials, Dow, DuPont, Electra Polymers Ltd., Eternal Chemical, Fujifilm Electronic Materials, Futurrex Inc, Hitachi Chemical, HiTech Photopolymere AG, JSR Micro, Kolon Industries, MacDermid, MicroChem, Rohm and Haas (subsidiary of Dow), Sumitomo Chemical, Tokyo Ohka Kogyo Co., Ltd.

Referring to FIG. 1, a flowchart (or flow diagram) illustrating an example method 100 for fabricating an interconnect structure (e.g., interconnect structure 1200, shown in FIG. 2A) according to the concepts, systems, circuits and techniques sought to be protected herein is shown. The method 100 may, for example, be implemented in semiconductor manufacturing equipment used for fabricating interconnect structures.

Rectangular elements (typified by element 105 in FIG. 1), as may be referred to herein as "processing blocks," may represent computer software instructions or groups of instructions (e.g., as may be executed by a processor of semiconductor manufacturing equipment). Diamond shaped elements (typified by element 120 in FIG. 1), as may be referred to herein as "decision blocks," represent computer software instructions, or groups of instructions, which affect the execution of the computer software instructions represented by the processing blocks. The processing blocks and decision blocks can represent steps performed by functionally equivalent circuits such as a digital signal processor circuit or an application specific integrated circuit (ASIC).

The flow diagram does not depict the syntax of any particular programming language. Rather, the flow diagram illustrates the functional information one of ordinary skill in the art requires to fabricate interconnect structures or to generate computer software to perform the processing required to fabricate the interconnect structures. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa.

As will become apparent from the description herein below, a result of the method 100 may be an interconnect structure having an increased aspect ratio (i.e., relationship between a first selected dimension and a second selected dimension of the interconnect structure) in comparison to conventional interconnect structures. Consequently, the interconnect structures provided using method 100 may be used to form or otherwise provide multi-layer semiconductor structures (e.g., 900, shown in FIG. 9) which are not otherwise possible using conventional interconnect structures. Such multi-layer semiconductor structures may, for example, include at least one superconducting semiconductor structure or integrated circuit (IC), as will be further discussed below in connection with FIG. 9.

As illustrated in FIG. 1, an example method 100 for fabricating an interconnect structure (e.g., 1200, shown in FIG. 2A) according to a first embodiment of the disclosure begins at block 105. At block 105, a semiconductor structure including a substrate (e.g., 210, shown in FIG. 2) having at least one interconnect pad (e.g., 220, shown in FIG. 2) is provided. The substrate (e.g., a silicon (Si) substrate) may be a single or multi-layer substrate. Additionally, the interconnect pad may be provided from one or more under bump metal (UBM) materials and is disposed over a surface of the substrate.

At block 110, a first spin resist and bake cycle is performed on the semiconductor structure provided at block 105. In particular, at block 110, a first predetermined amount of resist material (e.g., a photoresist material) is disposed over one or more portions (e.g., a center portion) of the semiconductor structure. The resist material may, for example, be applied or otherwise disposed over one or more portions of a surface of the interconnect pad.

At block 110, the resist material is also disposed over one or more surfaces of the semiconductor structure using spin coating techniques as may be performed in a spin coater machine for example The spin coater machine may rotate the semiconductor structure about a platform at a predetermined rate (e.g., angular speed) and for a predetermined time period in order to spread the resist layer over interconnect pad and the substrate of the semiconductor structure. In particular, the semiconductor structure may be rotated until a desired (i.e., predetermined) thickness of the resist material (i.e., a distance between first and second surfaces of the resist material) is achieved on the semiconductor structure.

In one embodiment, the predetermined rate is about two thousand rotations per minute (RPM). Additionally, in one embodiment, the predetermined time period is about thirty seconds. It should be appreciated that the predetermined rate and the predetermined time period may be selected to provide a desired thickness of resist material over the substrate and interconnect pad. Generally, the higher the predetermined rate (i.e., angular speed) of spinning, the less the resist material thickness will be. Additionally or alternatively, a dry negative resist material (e.g., DuPont MX5000) may be applied to the semiconductor structure, and a slot die coating and/or combinations of coatings can be applied to achieve the desired resist thickness.

Further, at block 110, subsequent to the resist material being spread over the semiconductor structure, the semiconductor structure is baked (e.g., in a heat treatment oven) at a predetermined temperature and for a predetermined time period to form a resist layer (e.g., 230, shown in FIG. 2) from the resist material. In one embodiment, the predetermined temperature is about one hundred fifty degrees Celsius (C). Additionally, in one embodiment, the predetermined time period is about one minute. The resist layer formed at block 110 has first and second opposing surfaces, with the first surface of the resist layer disposed (or formed) over the second surface of the interconnect pad and over the second surface of the substrate. Generally, after the first spin resist and bake cycle, the resist layer has a non-uniform thickness. In other words, a distance between the first and second surfaces of the resist layer is generally not uniform throughout the resist layer.

At block 115, a next spin resist and bake cycle is performed on the semiconductor structure. During the next spin resist and bake cycle, a second predetermined amount of a resist material is disposed over one or more portions (e.g., a center portion) of the second surface of the resist layer formed at block 110. Additionally, during the next spin resist and bake cycle, the semiconductor structure is rotated by the spin coater machine at a second predetermined rate for a second predetermined time period. Similar to the first spin resist and bake cycle, the semiconductor structure may be rotated until a desired thickness of the resist material is achieved on the semiconductor structure (here, on the resist layer of the semiconductor structure).

At block 115, the semiconductor structure is also baked at a predetermined temperature and for a predetermined time period to form a resist layer having a thickness which is greater than a thickness of the resist layer formed at block 110. In one embodiment, the predetermined temperature is about one hundred fifty degrees Celsius (C). Additionally, in one embodiment, the predetermined time period is about one minute.

The next spin resist and bake cycle performed at block 115 may, for example, smooth resist layer surfaces (i.e., reduce non-uniformities in the resist layer). Additionally, the next spin resist and bake cycle may substantially increase (sometimes, drastically increase) the thickness of the resist layer In general, spin speeds (e.g., first and second spin speeds) may determine the total thickness of the resist layer, as described further in connection with FIG. 3.

At block 120, it is determined whether any additional spin resist and bake cycles are needed. If it is determined that additional spin resist and bake cycles are needed, the method 100 returns to block 115 and blocks 115 and 120 are repeated until it is determined that no additional spin resist and bake cycles are needed. Alternatively, if it is determined that no additional spin resist and bake cycles are needed, the method 100 may proceed to a block 125.

A number of spin resist and bake cycles performed in method 100 may, for example, be selected to achieve a resist layer having a predetermined thickness (e.g., about twenty nine μm). Additionally, the number of spin resist and bake cycles performed in method 100 may be based, at least in part, on a desired aspect ratio of a conductive structure (e.g., 1240, shown in FIG. 2A) to be formed in the interconnect structure (e.g., 1200, shown in FIG. 2A), as will be further discussed below in connection with FIGS. 2 and 2A. Let it suffice here to say that according to method 100, the resist layer should have a thickness (i.e., a distance between first and second opposing surfaces) which is less than a height (i.e., a distance between first and second opposing portions) of the conductive structure (e.g., bump) to be formed in the interconnect structure.

Referring now to block 125, at block 125 a mask is disposed over the second surface of the resist layer and the resist layer is exposed to an exposure energy (e.g., thermal energy) to form an opening (e.g., 232, shown in FIG. 2) in the resist layer. The opening, which is formed according to a pattern in the mask, has a predetermined shape which is suitable for receiving conductive materials as may be used to form a conductive structure (e.g., 1240, shown in FIG. 2A). Additionally, the exposure energy has a predetermined intensity distribution and the resist layer is exposed to the exposure energy for a predetermined time period. In one embodiment, the predetermined intensity distribution is about six hundred forty millijoules (mJ) per square centimeter (cm$^2$).

In embodiments in which the resist layer is provided from a positive photoresist material (e.g., Polymethyl methacrylate (PMMA)), exposure to the exposure energy (e.g., ultraviolet (UV) light) causes the resist layer to become more soluble (e.g., easier to dissolve when developed at block 135). In contrast, in embodiments in which the resist layer is provided from a negative photoresist material (e.g., EPON™ SU-8 epoxy resin), exposure to the exposure energy causes the resist layer to become polymerized and, thus, more difficult to dissolve.

It follows that a pattern of the mask disposed over the resist layer at block 125 is based upon the material from which the resist layer is provided. For example, the mask of a resist layer provided from a positive photoresist material should have a pattern which corresponds to a pattern of the resist layer to remain on the semiconductor structure (e.g., subsequent to development at block 130). In contrast, the mask of a resist layer provided from a negative photoresist material should have a pattern which is the inverse (i.e., a photographic negative) of a pattern of the resist layer to remain on the semiconductor structure.

At block 125, a post expose bake process is also performed on the semiconductor structure. In particular, the semiconductor structure is baked at a predetermined temperature and for a predetermined time period. In one embodiment, the predetermined temperature is about one hundred degrees C. Additionally, in one embodiment, the predetermined time period is about one minute.

At block 130, the resist layer of the semiconductor structure is developed, for example, by a resist developer, such as Resist Developer RD6 by Futurrex, Inc. The resist layer may be developed by immersing the semiconductor structure in a developer solution for a predetermined time period (e.g., about two minutes). The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 130, subsequent to the resist layer being developed in the developer solution, the semiconductor structure may also be rinsed (e.g., with deionized water) to remove the developer solution from the semiconductor structure. The semiconductor structure may also be rinsed to prepare the semiconductor structure for the post development bake process performed at block 130.

In particular, at block 130, the semiconductor structure is baked at a predetermined temperature and for a predetermined time period. In one embodiment, the predetermined temperature is about one hundred degrees C. Additionally, in one embodiment, the predetermined time period is about one minute. The post development bake process may, for example, be a very slow process which is performed at a low temperature to reduce (or, ideally eliminate) resist bubbles and or residual solvent that may exist on the semiconductor structure. The post development bake process is especially important for thicker resists. In one example, the post expose bake process is performed at a temperature of about one hundred degrees Celsius for about one minute and the post development bake process is performed at a temperature of about seventy degrees Celsius for about five minutes.

At block 135, one or more surfaces of the semiconductor structure are cleaned through a plasma cleaning process for a predetermined time period (e.g., about two minutes). In one embodiment, the resist process needs to use a dry cleaning and or etching process when evaporating conductor materials through the resist opening. The resist process can use liquid cleaning and or etching process when plating conductor materials through the resist opening. The cleaning and or etching process may, for example, prepare the semiconductor structure for receiving a conductive material or layer at block 140.

At block 140, a conductive material (e.g., a superconducting material) is deposited or otherwise disposed in the opening formed in the resist layer. The conductive material is also disposed or deposited over edges of the opening and the second surface of the resist layer. The conductive material may form a conductive layer (e.g., 240, shown in FIG. 2), which conductive layer may be electrically coupled to the interconnect pad.

At block 145, a conductive structure (e.g., 1240, shown in FIG. 2A) is formed from the conductive material or layer. For example, selected portions of the conductive material or layer may be lifted-off or etched (e.g., through a flash etch process) to produce the conductive structure. Additionally, at block 145, the resist layer of the semiconductor structure may be removed (e.g., stripped with a solvent, such as acetone) from the second surface of the interconnect pad and from the second surface of the substrate to expose the interconnect pad and the substrate.

Upon completion of block 145, the method 100 may end. The method 100 ending may, for example, be indicative of completion of the fabrication process of the interconnect structure (e.g., 1200, shown in FIG. 2A). The method 100 may be repeated (e.g., in response to a processor in the semiconductor manufacturing equipment receiving or generating a control signal) for fabricating additional interconnect structures. In one aspect of the disclosure, method 100 provides for an interconnect structure having a thicker conductive structure or bump (e.g., 1240, shown in FIG. 2A) than conventional interconnect structures).

Figure 2:
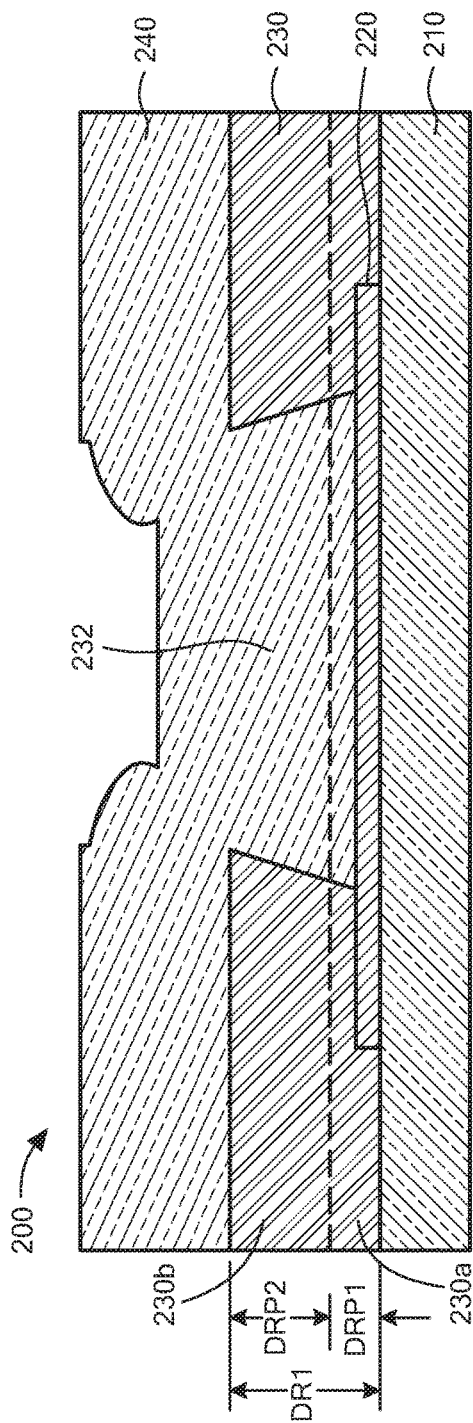
FIG. 2 shows a cross-section of an example semiconductor structure as may be formed in accordance with the method of FIG. 1, for example.
Figure 2A:
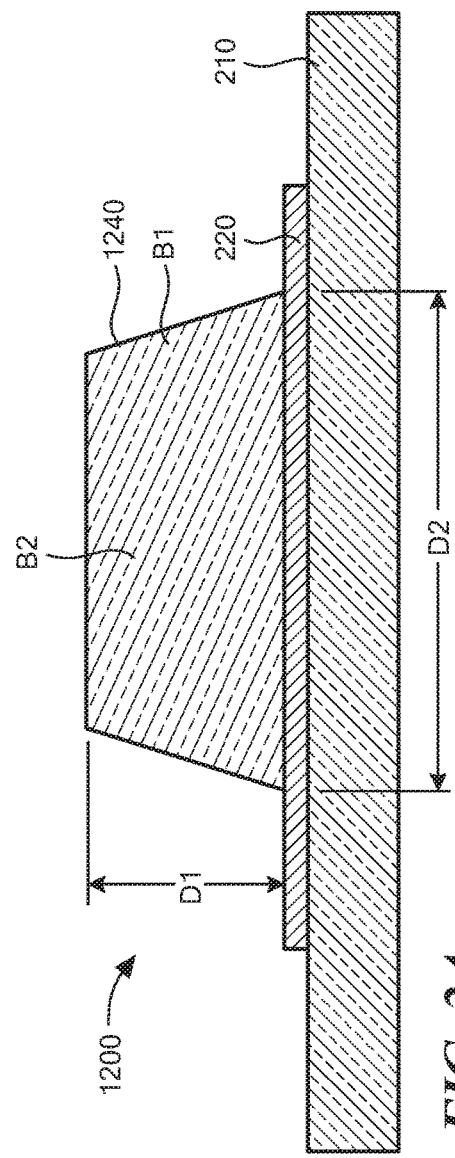
FIG. 2A shows a cross-section of an example interconnect structure as may be formed in accordance with the method of FIG. 1, for example.

Referring now to FIGS. 2 and 2A, in which like elements are provided having like reference designations, cross-sections of an example semiconductor structure (200, shown in FIG. 2) and of an example interconnect structure (1200, shown in FIG. 2A) as may be fabricated in accordance with method 100 are shown.

Referring now to FIG. 2, a semiconductor structure 200 includes a substrate 210, an interconnect pad 220, a resist layer 230 and a conductive layer 240. Substrate 210 (e.g., a Silicon (Si) substrate) has first and second opposing surfaces and a plurality of electrical connections (e.g., vias) extending between the first and second surfaces. Additionally, interconnect pad 220 (e.g., an under bump metal) has first and second opposing surfaces, with the first surface of the interconnect pad 220 disposed over or beneath (e.g., attached or otherwise coupled to) a selected portion of the second surface of the substrate 210. The first surface of the interconnect pad 220 may also be electrically coupled to selected ones of the electrical connections in substrate 210. The electrical coupling may, for example, occur through bond wires or via contacts spaced between the first surface of interconnect pad 220 and the electrical connections in a region beneath the interconnect pad 220.

The resist layer 230, which may be provided from a negative photoresist material or a positive photoresist material (or another polymer that has a property of becoming more soluble when exposed to ultraviolet light), has first and second opposing surfaces. Resist layer 230 is disposed over the second surface of interconnect pad 220 and the second surface of substrate 210. Additionally, resist layer 230 comprises a plurality of resist layer portions (here, two portions 230*a*, 230*b*). Each of the resist layer portions 230*a*, 230*b* is formed during a respective spin resist and bake cycle (e.g., first cycle 110 or next cycle 115 of method 100) of a plurality of spin resist and bake cycles (i.e., of at least two cycles). For example, resist layer portion 230*a* may be formed during first cycle 110 of method 100. Additionally, resist layer portion 230*b* may be formed during next cycle 115 of method 100.

Each of the resist layer portions 230*a*, 230*b* of resist layer 230 also has an associated height or thickness (here, distances DRP1, DRP2 between first and second opposing surfaces of resist layer portions 230*a*, 230*b*, respectively).

Additionally, a predetermined distance DR1 exists between the first and second surfaces of the resist layer 230. The predetermined distance DR1 corresponds to a height or thickness of the resist layer 230 (and a sum of the heights or thicknesses of resist layer portions 230*a*, 230*b*). In one embodiment, the predetermined distance DR1 of the resist layer 230 is selected to be less than a predetermined height or thickness of the conductive structure which will be formed in an interconnect structure according to method 100 (e.g., 1200, shown in FIG. 2A). Additionally, a number of spin and bake cycles used to produce the resist layer 230 is selected based upon the predetermined distance DR1 to be achieved.

An opening 232 having a predetermined shape is formed or otherwise provided in a selected portion of the resist layer 230 for receiving conductive materials (or a conductive layer 240, as will be discussed) as may be used to form a conductive structure (e.g., 1240, shown in FIG. 2A). In the illustrated embodiment, the opening 232 extends between the second surface of the resist layer 230 and the second surface of the interconnect pad 220 (and, thus, the first surface of the resist layer 230). Additionally, the predetermined shape of the opening 232 is selected based upon a shape of the conductive structure to be formed in the opening 232. The manner in which the opening 232 is formed may depend upon the materials from which the resist layer 230 is provided (e.g., positive or negative photoresist materials), as discussed above in connection with FIG. 1.

Conductive layer 240, which is provided from one or more superconducting materials (e.g., niobium (Nb)), is disposed in the opening 232 formed in the resist layer 230 and disposed over edges of the opening 232 and the second surface of the resist layer 230. The conductive layer 240 is electrically coupled to the second surface of interconnect pad 220. The conductive layer 240 may be disposed using one or more physical (e.g., sputter) and chemical (e.g., electroless) deposition processes. Additionally, the conductive layer 240 may be patterned using an etching (e.g., flash etching) process. The conductive layer 240 is electrically coupled to the second surface of interconnect pad 220. A conductive structure 1240 may be formed from the conductive layer 240, as will be discussed below in connection with FIG. 2A.

Referring now to FIG. 2A, interconnect structure 1200 results after the lift off technique used to remove resist 230 and all material disposed over the resist layer 230.

That is, selected portions of conductive layer 240 of structure 200 of FIG. 2 are lifted-off or etched (e.g., through a flash etch process) to produce conductive structure 1240 of FIG. 2A. Additionally, resist layer 230 of semiconductor structure 1200 is removed (e.g., stripped with a solvent) from the second surface the interconnect pad 220 and from the second surface of the substrate 210 to expose the interconnect pad 220 and the substrate 210.

Conductive structure 1240 has first and second opposing portions, with the first portion of the conductive structure 1240 disposed over and electrically coupled to the second surface of interconnect pad 220. Conductive structure 1240 also has a predetermined shape, with the predetermined shape taking the form of a trapezoidal prism in the illustrated embodiment. It follows that the cross section of the conductive structure 1240 shown in FIG. 2A takes the form of a trapezoid.

Conductive structure 1240 has a first dimension D1 corresponding to a distance between the first and second portions (here, first and second bases B1, B2) of the conductive structure 1240. Conductive structure 1240 also has a second dimension D2 corresponding to a dimension of the first portion of the conductive structure 1240 which is disposed over the second surface of the interconnect pad 220 (here, a width or length of first base B1). In one aspect of the concepts, systems, circuits and techniques sought to be protected herein, an aspect ratio of the first dimension D1 of the conductive structure 1240 to the second dimension D2 of the conductive structure 1240 is substantially greater than or equal to about one. In other words, the conductive structure 1240 has an aspect ratio of about one to one (1:1) or greater. For example, the first dimension D1 may have a value of about thirty micrometers and the second dimension D2 may have a value of about forty micrometers to provide for an aspect ratio of about four to three (4:3).

The number of spin cycles performed in method 100 to produce resist layer 230 (and subsequently the conductive structure 1240) may, for example, be based, at least in part, on a desired aspect ratio. As discussed above, in one embodiment, the predetermined distance DR1 of resist layer 230 shown in FIG. 2 is selected to be less than a predetermined height or thickness (here, dimension D1) of the conductive structure 1240 shown in FIG. 2A. In one example, double spin coated resist layer thickness around 30 micron may be used to produce a micro bump having a height in the range of about 6 to about 40 micron (e.g. a 6-40 micron tall microbump). In another example, around 10 micron thick single resist coating may be used to provide a micro bump having a height of about 15 micron (e.g. around a 15 micron tall microbumps). In another example, around 10 micron thick resist targeted for 15 micron diameter bump having a top resist opening around 10-16 and bottom resist opening around 16-22 micron able to produce 6-15 micron tall microbumps. In another example, around 6-9 micron thick resist targeted for 5-7 micron diameter bump having top resist opening around 4-8 and bottom resist opening around 6-10 micron able to produce 4-12 micron tall microbumps.

Figure 9:
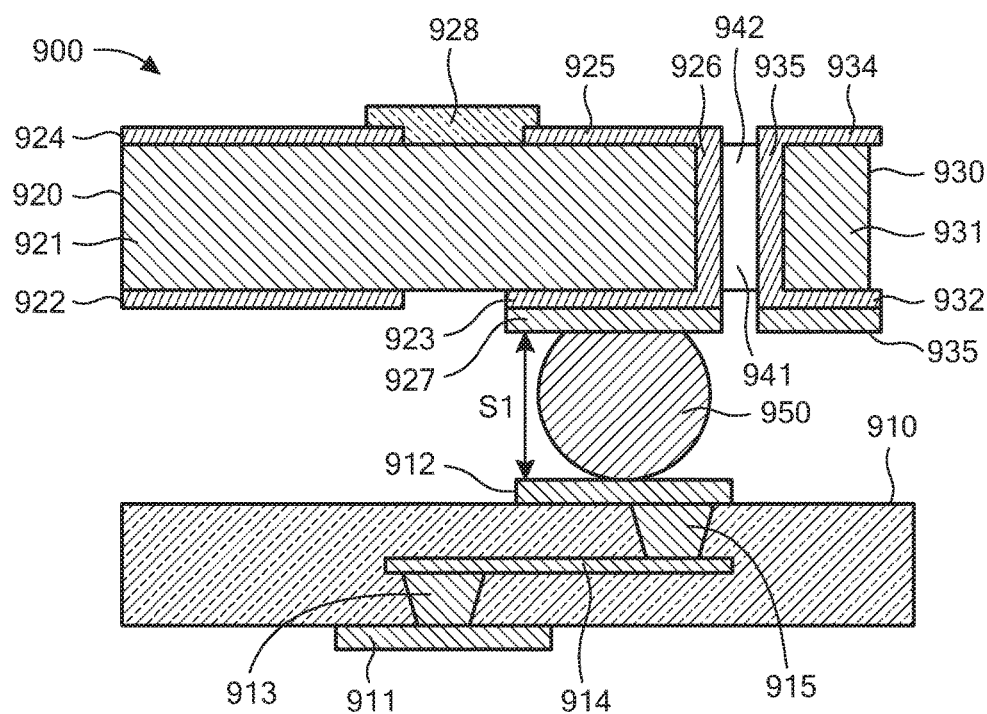
FIG. 9 is a block diagram of an example semiconductor structure as may be formed using an interconnect structure according to the disclosure.

While conductive structure 1240 is shown and described as having a generally trapezoidal prism shape in the illustrated embodiment, it should be appreciated that the conductive structure 1240 may take the form of a variety of different shapes. For example, the conductive structure 1240 may take the form of a sphere, a cube, a cylinder, a pyramid, a cone, or any number of other shapes, including irregular shapes, or shapes with fences, as will be apparent to those of ordinary skill in the art. In one embodiment, the shape of the conductive structure 1240 depends upon the fabrication process used to fabricate the conductive structure 1240. Additionally, in one embodiment, the shape of the conductive structure 1240 depends upon a shape of a conductive structure or interconnect pad to which the conductive structure 1240 may be coupled to in fabricating a multi-layer semiconductor structure (e.g., 900, as shown in FIG. 9).

The above-described conductive structure 1240, interconnect pad 220 and substrate 210 collectively form an interconnect structure (here, interconnect structure 1200) for electrically and mechanically coupling a semiconductor structure to one or more other semiconductor structures (e.g., to form a multi-layer semiconductor structure, as will be discussed).

Additional aspects of the concepts, systems, circuits and techniques sought to be protected herein, with particular emphasis on interconnect structures (e.g., 1200, shown in FIG. 2) formed according to various methods of the disclosure (e.g., 100, shown in FIG. 1), are described in conjunction with the figures below.

Figure 3:
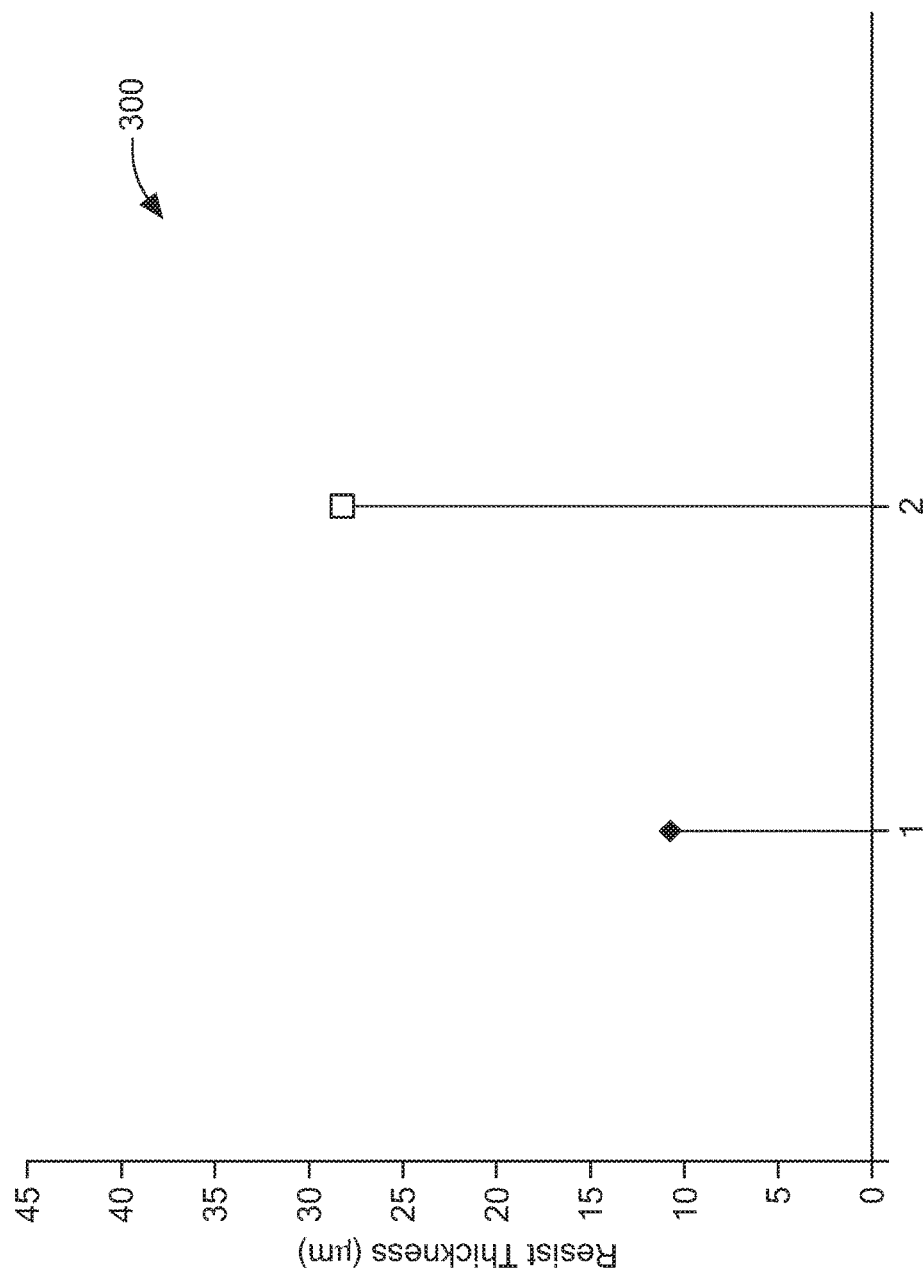
FIG. 3 is a plot illustrating an example relationship between number of spin resist and bake cycles and resist thickness.

Referring to FIG. 3, a plot 300 shows an example relationship between number of spin resist and bake cycles (e.g., first and next spin and bake cycles performed at blocks 110 and 115 of method 100) and resist thickness of a resist layer (e.g., 230, shown in FIG. 2) resulting from the spin and bake cycles. The plot 300 has a horizontal axis corresponding to the number of spin resist and bake cycles (e.g., N=1, 2, etc.). Additionally, the plot 300 has a vertical axis with a scale in resist thickness units (e.g., micrometers (μm)). Each of the spin cycles is performed at a predetermined frequency (here, a frequency of about two thousand rotations per minute) in the plot shown.

As illustrated, resist thickness of the resist layer substantially increases from about ten μm to about thirty μm when the number of spin resist and bake cycles is increased from one cycle to two cycles. In other words, the resist thickness increases in response to a corresponding increase in number of resist layer portions (e.g., resist layer portions 230a, 230b, shown in FIG. 2) provided in the resist layer. It should be appreciated that resist thickness will further increase in response to an increased number of cycles (e.g., three or more cycles) and an increased number of resist layer portions provided in the resist layer.

A first resist may, for example, experience a first bake cycle (110) and second bake cycle (115) before expose. Optimization temperatures, times and other characteristics of the bake cycles may necessary for a multiple coating process. In one example, a first bake cycle (110) is performed at a temperature of about one hundred fifty degrees Celsius for about one minute, and a second bake cycle (115) is performed at a temperature of about one hundred fifty degrees Celsius for about one minute. As discussed in FIG. 1, above, baking is the step during which almost all of the solvents are removed from the photoresist coating of the semiconductor structure and become photosensitive, or imageable. Overbaking may degrade the photosensitivity of resists by either reducing the developer solubility or actually destroying a portion of the sensitizer. Additionally, underbaking may prevent light from reaching the sensitizer.

It should also be appreciated that the resist thickness is related to the predetermined frequency. It follows that resist thickness will vary based upon the predetermined frequency. Further, it should be appreciated that the spin cycles need not be performed at a same or similar frequency.

As discussed in figures above, the number of spin cycles to be performed may be based on a desired aspect ratio of a conductive structure (e.g., 1240, shown in FIG. 2A) to be formed in an opening of the resist layer (e.g., 230, shown in FIG. 2).

Figure 4:
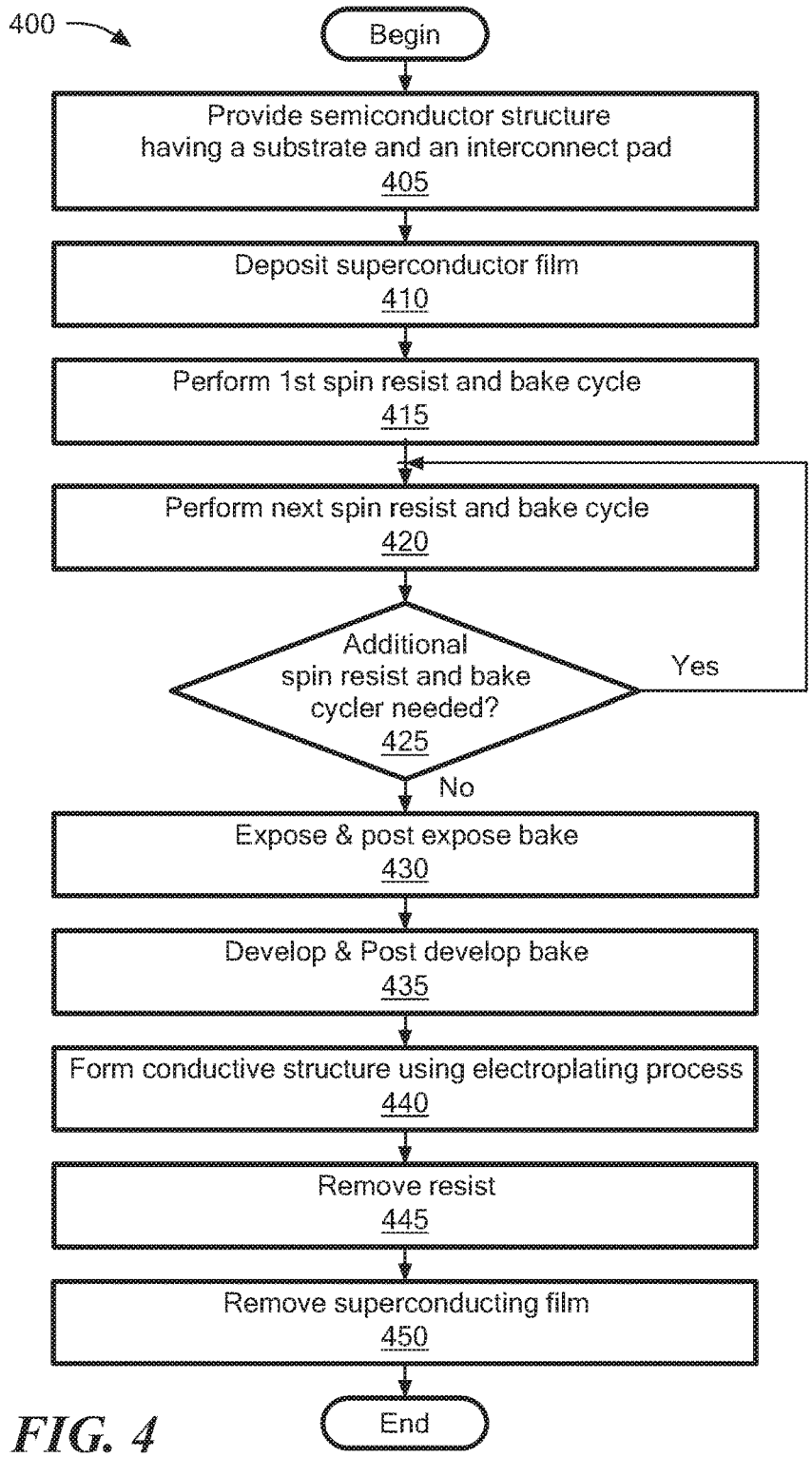
FIG. 4 is a flowchart illustrating another example method for fabricating a interconnect structure in accordance with an embodiment of the disclosure.

Another example method of fabricating an interconnect structure according to the disclosure (e.g., interconnect structure 1500, shown in FIG. 5A) is shown in FIG. 4.

As illustrated in FIG. 4, another example method 400 for fabricating a interconnect structure (e.g., 1500, shown in FIG. 5A) begins at block 405. At block 405, a semiconductor structure including a substrate (e.g., 510, shown in FIG. 5) having at least one interconnect pad (e.g., 520, shown in FIG. 5) is provided. The substrate may be a single or multi-layer substrate. Additionally, the interconnect pad may be provided from one or more UBM materials. The interconnect pad is disposed over a surface of the substrate.

At block 410, a superconducting film (e.g., 550, shown in FIG. 5) is deposited over one or more portions (e.g., interconnect portions) of the semiconductor structure provided at block 405. The superconducting film (e.g., a thin, substantially continuous film) may, for example, form an electrical connection between the interconnect pad and a power source of an electroplating circuit for an electroplating process, as will be discussed further below in connection with block 440.

At block 415, a first spin resist and bake cycle (also sometimes referred to herein as a "first cycle") is performed on the semiconductor structure. The first cycle comprises disposing a first predetermined amount of resist material over one or more portions of the semiconductor structure. Additionally, the first cycle comprises disposing (or spreading) the resist material over one or more surfaces of the semiconductor structure using spin coating techniques. The spin coating techniques may comprise rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The first cycle performed at block 415 further comprises baking the semiconductor structure at a predetermined temperature and for a predetermined time period to form a first resist layer (or a first portion of a resistor layer) from the resist material disposed over the semiconductor structure. The first resist layer (e.g., 530*a*, shown in FIG. 5) has first and second opposing surfaces, with the first surface of the first resist layer disposed (or formed) over a surface of the interconnect pad and over a surface of the substrate. In some embodiments, the first cycle performed at block 415 is the same as or similar to the first cycle performed at block 110 of method 100.

At block 420, a next spin resist and bake cycle (also sometimes referred to herein as a "next cycle") is performed on the semiconductor structure. The next cycle comprises disposing a second predetermined amount of a resist material over one or more portions of the second surface of the first resist layer formed at block 415. Additionally, the next cycle comprises disposing (or spreading) the resist material over one or more surfaces of the first resist layer using spin coating techniques. The spin coating techniques may comprise rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 420 further comprises baking the semiconductor structure at a predetermined temperature and for a predetermined time period to form a next resist layer (or next portion of a resist layer) from the resist material. In one embodiment, the next resist layer has a thickness (e.g., a distance between first and second opposing surfaces) which is substantially greater than a thickness of the first resist layer formed at block 415. Additionally, the next resist layer may have a more uniform surface than the first resist layer. In some embodiments, the next cycle performed at block 420 is the same as or similar to the next cycle performed at block 115 of method 100.

At block 425, it is determined whether any additional spin resist and bake cycles are needed. If it is determined that additional spin resist and bake cycles are needed, the method 400 returns to block 420 and blocks 420 and 425 are repeated until it is determined that no additional spin resist and bake cycles are needed. Alternatively, if it is determined that no additional spin resist and bake cycles are needed, the method 400 may proceed to a block 430.

Similar to method 400, a number of spin resist and bake cycles performed in method 400 may be selected to achieve a resist layer (i.e., a resist layer comprising the first resist layer and at least one next resist layer) having a predetermined thickness. Additionally, similar to method 400, the number of spin resist and bake cycles performed in method 400 may be based, at least in part, on a desired aspect ratio of a conductive structure (e.g., 540, shown in FIG. 5A) to be formed in the interconnect structure (e.g., 1500, shown in FIG. 5A).

Referring now to block 430, at block 430 a mask is disposed over the second surface of the resist layer and the resist layer is exposed to an exposure energy (e.g., thermal energy) to form an opening (e.g., 532, shown in FIG. 5) in the resist layer. The opening, which is formed according to a pattern in the mask, has a predetermined shape which is suitable for receiving conductive materials as may be used to form a conductive structure (e.g., 540, shown in FIG. 5A).

In embodiments in which the resist layer is provided from a positive photoresist material, exposure to the exposure energy causes the resist layer to become more soluble (e.g., easier to dissolve when developed at block 435). In contrast, in embodiments in which the resist layer is provided from a negative photoresist material, exposure to the exposure energy causes the resist layer to become polymerized and, thus, more difficult to dissolve.

It follows that a pattern of the mask disposed over the resist layer at block 430 is based upon the material from which the resist layer is provided. For example, the mask of a resist layer provided from a positive photoresist material should have a pattern which corresponds to a pattern of the resist layer to remain on the semiconductor structure (e.g., subsequent to development at block 435). In contrast, the mask of a resist layer provided from a negative photoresist material should have a pattern which is the inverse (i.e., a photographic negative) of a pattern of the resist layer to remain on the semiconductor structure.

At block 430, a post expose bake (PEB) process is also performed on the semiconductor structure. In particular, the semiconductor structure is baked at a predetermined temperature and for a predetermined time period. The PEB process may, for example, be used to induce diffusion of the photogenerated compound in order to smooth out the interference effect on the resist profile.

At block 435, the resist layer of the semiconductor structure is developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 435, subsequent to the resist layer being developed in the developer solution, the semiconductor structure may also be rinsed (e.g., with deionized water) to remove leftover developer solution from the semiconductor structure. The semiconductor structure may also be rinsed to prepare the semiconductor structure for the post development bake process performed at block 435. In particular, at block 435, the semiconductor structure is baked at a predetermined temperature and for a predetermined time period (e.g., to solidify the resist layer). The post develop bake process performed at block 435 may, for example, reduce or eliminate residual developer from the resist opening and may be necessary in order to harden the photoresist and improve adhesion of the photoresist to the wafer surface.

At block 440, a conductive structure (e.g., 540, shown in FIG. 5) is formed or otherwise provided on a surface of the interconnect pad (e.g., 520, shown in FIG. 5) using an electroplating process. The electroplating process may, for example, include forming an electroplating circuit from the interconnect pad, a structure (e.g., a rod) containing a conductive material to be deposited on the interconnect pad, and a power source (e.g., a battery). In particular, the electroplating circuit may be formed by coupling the interconnect pad to a negative terminal (i.e., an anode) of the power source (e.g., via a superconducting film, such as film 550, shown in FIG. 5). Additionally, the electroplating circuit may be formed by coupling the structure containing the conductive material to be deposited on the interconnect pad to a positive terminal (i.e., a cathode) of the power source. The structure containing the conductive material and the interconnect pad form positive and negative electrodes of the circuit, respectively.

The electroplating process may also include completing the electroplating circuit by immersing the positive and negative electrodes of the circuit (i.e., the structure containing the conductive material and the interconnect pad) into an electrolyte solution contained in a "cell" or tank. The electrolyte solution comprises a salt of a same material (e.g., Al) as the interconnect pad to be plated by the conductive material. As electricity passes through the cell, positively charged ions of the conductive material are attracted to the negatively charged interconnect pad. The foregoing results in the conductive material dissolving from the structure containing the conductive material (e.g., by oxidation) and in the conductive material being deposited on or plating one or more surfaces of the interconnect pad. Strength of the power source and concentration of the electrolyte may, for example, be increased or decreased to control a speed at which ions and electrons move through the circuit and to control a speed of the plating process.

After a predetermined time period, a predetermined amount of the conductive material is deposited on the interconnect pad to form a conductive structure (e.g., 540, shown in FIG. 5). The conductive structure has a first portion which is disposed over and coupled to a surface of the interconnect pad and a second, opposing portion. The second portion of the conductive structure may, for example, have a substantially convex (or mushroom like) surface (e.g., 540a, shown in FIG. 5) in embodiments in which the resist layer has a thickness which is less than a height of the conductive structure (e.g., due to spill over of the conductive materials).

It should be appreciated that the electroplating process described above is but one of many potential processes which may be used to form the conductive structure. Upon completion of block 440, the method proceeds to a block 445.

At block 445, remaining portions of the resist layer are removed from the semiconductor structure. Additionally, in some embodiments, selected portions of the conductive structure are etched with the resist stripper at block 445 to further define a shape of the conductive structure.

At block 450, the superconducting film deposited at block 410 is removed (e.g., etched through a flash etch process) from the semiconductor structure. Upon completion of block 450, the method 400 may end. Additionally, in some embodiments, selected portions of the conductive structure are etched (e.g., through a flash etch process) at block 450 to pattern the conductive structure. The method 400 ending may, for example, be indicative of completion of the fabrication process of the interconnect structure (e.g., 1500, shown in FIG. 5A). The method 400 may be repeated (e.g., in response to a processor in the semiconductor manufacturing equipment receiving or generating a control signal) for fabricating additional interconnect structures.

Alternatively, for electroplating of uniform bumps, substantially all contact (or interconnect) pads may use a continuous top Al and or Nb layer of a TSV carrier and a MCM to perform electroplating. Firstly, a UBM may be formed on a continuous top Al and or Nb layer of TSV and MCM by a lift-off process and e-beam evaporation. In one embodiment, a lift-off mask used during the lift-off process includes an AZ photoresist. After the lift-off process, a new photolithography may be performed to create substantially circular (or other shaped) openings in the photoresist for electroplating of bumps on the UBM.

In one example, indium bump electroplating uses an electrolytic cell with indium sulfamate bath and a solid Indium anode. Alternatively, tin-lead bump electroplating uses an electrolytic cell with a Rohm and Haas tin-lead electrolytic solution bath and a tin-lead rod is used as the anode. After the plating, the photoresist is removed and the wafer (or semiconductor structure) is cleaned. At the end of the process (or near the end of the process), the top Al and or Nb layer of the TSV carrier or MCM may be patterned by using photolithography and dry and or wet etching.

In another embodiment, it is possible to deposit a very thin, substantially continuous Al and or Nb layer through the passivation opening on top of patterned Al and or Nb pad of the TSV carrier or MCM. The thin continuous Al and or Nb layer may create an electrical contact wherever UBM creates an electrical contact with a patterned Al and or Nb pad of the TSV carrier or MCM. Firstly, a UBM may be formed on continuous top Al and or Nb layer of TSV and MCM by a lift-off process and e-beam evaporation. In one embodiment, a lift-off mask used during the lift-off process includes an AZ photoresist. After the lift-off process, a new photolithography may be performed to create substantially circular (or other shaped) openings in the photoresist for electroplating of bumps on the UBM.

In one example, indium bump electroplating uses an electrolytic cell with indium sulfamate bath and a solid In anode. After the plating, the photoresist may be removed and the wafer (or semiconductor structure) may be cleaned. At the end of the process (or near the end of the process), the top Al and or Nb layer of TSV carrier or MCM may be removed by dry and or wet etching. In one embodiment, Indium and a UBM may act as a mask.

In one aspect of the disclosure, method 400 is a selective plating process which is more economical than method 100. Method uses a minimum amount of material for plating whereas method 100 uses a liftoff process which may have a lot of conducive material wastage. Method 100 is a dry process which has minimum impact to the active and or passive and or superconducting circuits and or their properties. In contrast, method 400 uses (and structures fabricated used method 400 may be exposed to) various chemicals which may impact the active and or passive and or superconducting circuits and or their properties.

Referring now to FIGS. 5 and 5A, in which like elements are provided having like reference designations, cross-sections of an example semiconductor structure (500, shown in FIG. 5) and of an example interconnect structure (1500, shown in FIG. 5A) as may be fabricated in accordance with method 400 are shown.

Referring now to FIG. 5, a semiconductor structure 500 includes a substrate 510, an interconnect pad 520 and a resist layer 530. Semiconductor structure 500 also includes a conductive structure 540 and a conductive film 550. Substrate 510 (e.g., a Silicon (Si) substrate) has first and second opposing surfaces and a plurality of electrical connections (e.g., vias) extending between the first and second surfaces. Additionally, interconnect pad 520 (e.g., an under bump metal) has first and second opposing surfaces, with the first surface of the interconnect pad 520 disposed over or beneath (e.g., attached or otherwise coupled to) a selected portion of the second surface of the substrate 510.

The first surface of the interconnect pad 520 may also be electrically coupled to selected ones of the electrical connections in substrate 510. The electrical coupling may, for example, occur through bond wires or via contacts spaced between the first surface of interconnect pad 520 and the electrical connections in a region beneath the interconnect pad 520. Selected portions of the interconnect pad 520 are also coupled to conductive film 550 (e.g., a superconducting film) in the illustrated embodiment (e.g., for forming conductive structure 540, as will be discussed further below).

Resist layer 530, which may be provided from a negative photoresist material or a positive photoresist material (or another polymer that has a property of becoming more soluble when exposed to ultraviolet light), has first and second opposing surfaces. Resist layer 530 is disposed over the second surface of interconnect pad 520 and the second surface of substrate 510. Additionally, resist layer 530 comprises a plurality of resist layer portions (here, two portions 530a, 530b). Each of the resist layer portions 530a, 530b is formed during a respective spin resist and bake cycle (e.g., first cycle 415 or next cycle 420 of method 400) of a plurality of spin resist and bake cycles (i.e., of at least two cycles). For example, resist layer portion 530a may be formed during first cycle 415 of method 400. Additionally, resist layer portion 530b may be formed during next cycle 420 of method 400.

Each of the resist layer portions 530a, 530b of resist layer 530 also has an associated height or thickness (here, distances DRP1, DRP2 between first and second opposing surfaces of resist layer portions 530a, 530b, respectively).

Additionally, a predetermined distance DR2 exists between the first and second surfaces of the resist layer 530. The predetermined distance DR2 corresponds to a height or thickness of the resist layer 530 (and a sum of the heights or thicknesses of resist layer portions 530a, 530b). In one embodiment, the predetermined distance DR2 is selected to be less than a predetermined height or thickness of the conductive structure 540 formed in an interconnect structure according to method 400 (e.g., 1500, shown in FIG. 5A). Additionally, a number of spin and bake cycles used to produce the resist layer 530 is selected based upon the predetermined distance DR2 to be achieved. The predetermined distance DR2 may also be selected to achieve a particular shaped conductive structure 540, as will be discussed further below.

An opening 532 having a predetermined shape is formed or otherwise provided in a selected portion of the resist layer 530 for receiving conductive materials as may be used to form conductive structure 540. In the illustrated embodiment, the opening 232 extends between the second surface of the resist layer 530 and the second surface of the interconnect pad 520 (and, thus, the first surface of the resist layer 530). Additionally, the predetermined shape of the opening 532 is selected based upon a shape of the conductive structure to be formed in the opening 532. The manner in which the opening 532 is formed may depend upon the materials from which the resist layer 530 is provided (e.g., positive or negative photoresist materials), as discussed above in connection with FIG. 4.

Conductive structure 540, which comprises one or more superconducting materials (e.g., niobium (Nb)), is formed or otherwise provided on a surface of interconnect pad 520 exposed by resist opening 232 using an electroplating process. The electroplating process may comprise coupling conductive film 550 of semiconductor structure 500 and a structure comprising a conductive material to respective terminals of a power source. Additionally, the electroplating process may comprise immersing the semiconductor structure and the structure comprising the conductive material into an electrolyte solution. A resulting conductive structure 540 will form on the exposed interconnect pad surface after a predetermined time period.

The conductive structure 540 has a first portion which is disposed over and coupled to a surface of the interconnect pad and a second, opposing portion. As illustrated, the second portion of the conductive structure 540 may "spill over" the resist opening 232 in embodiments in which the resist layer 530 has a thickness (here, a predetermined distance DR2) which is less than a height of the conductive structure 540 (i.e., a distance between the first and second portions of conductive structure 540). Additionally, as illustrated, a result of the foregoing may be the second portion of the conductive structure 540 having a substantially convex (or mushroom like) surface 540a.

Referring now to FIG. 5A, interconnect structure 1500 results after conductive film 550, resist layer 530 and all materials disposed over the resist layer 530 are removed from semiconductor structure 500.

That is, resist layer 530 of semiconductor structure 500 is removed (e.g., stripped with a solvent) from the second surface the interconnect pad 520 and from the second surface of the substrate 510 to expose the interconnect pad 520 and the substrate 510. Additionally, conductive film 550 is removed (e.g., etched) from semiconductor structure 500. In some embodiments, selected portions of conductive structure 540 are further etched (e.g., through a flash etch process) to produce a conductive structure having a particular shape.

Conductive structure 540 has a first dimension D1 corresponding to a distance between the first and second portions of the conductive structure 540. Conductive structure 540 also has a second dimension D2 corresponding to a dimension of the first portion of the conductive structure 540 which is disposed over the second surface of the interconnect pad 520. In one aspect of the concepts, systems, circuits and techniques sought to be protected herein, an aspect ratio of the first dimension D1 of the conductive structure 540 to the second dimension D2 of the conductive structure 540 is substantially greater than or equal to about one. In other words, the conductive structure 540 has an aspect ratio of about one to one (1:1) or greater. For example, the first dimension D1 may have a value of about thirty micrometers and the second dimension D1 may have a value of about forty micrometers to provide for an aspect ratio of about four to three (4:3).

The number of spin cycles performed in method 400 to produce resist layer 530 (and subsequently the conductive structure 540) may, for example, be based, at least in part, on a desired aspect ratio. As discussed above, in one embodiment, the predetermined distance DR1 of resist layer 530 shown in FIG. 5 is selected to be less than a predetermined height or thickness (here, dimension D1) of the conductive structure 540 shown in FIG. 5A. In one embodiment, the greater the ratio between the height or thickness D1 of the conductive structure 540 with respect to the height or predetermined distance DR2 of resist layer 530, the greater the mushroom effect (or radius of curvature of the second portion of conductive structure 540).

While conductive structure 540 is shown and described as having a particular shape in the illustrated embodiment (e.g., a mushroom like shape), it should be appreciated that the conductive structure 540 may take the form of a variety of different shapes. For example, the shape of the conductive structure 540 may depend upon a thickness of the resist layer 530 provided on semiconductor structure 500 (which may substantially reduce or increase the above-described "spill over"). Additionally, the shape of the conductive structure 540 may depend upon the electroplating process used to fabricate the conductive structure 540. Further, the shape of the conductive structure 540 may depend upon a shape of a conductive structure or interconnect pad to which the conductive structure 540 may be coupled to in fabricating a multi-layer semiconductor structure (e.g., 900, as shown in FIG. 9).

The above-described conductive structure 540, interconnect pad 520 and substrate 510 collectively form an interconnect structure (here, interconnect structure 1500) for electrically and mechanically coupling a semiconductor structure to one or more other semiconductor structures (e.g., to form a multi-layer semiconductor structure, as will be discussed).

In one embodiment, semiconductor structures to which the interconnect structure 1500 may be coupled (e.g., semiconductor structure 910 and 920, shown in FIG. 9) each have an associated semiconductor package pitch, and the interconnect structure 1500 may have one or more characteristics (e.g., dimensions) selected in accordance with the package pitch, as will be further discussed in connection with FIGS. 9-9A below.

Additional aspects of the concepts, systems, circuits and techniques sought to be protected herein, with particular emphasis on interconnect structures (e.g., 1500, shown in FIG. 5A) formed according to various methods of the disclosure (e.g., 400, shown in FIG. 4), are described in conjunction with the figures below.

Figure 6:
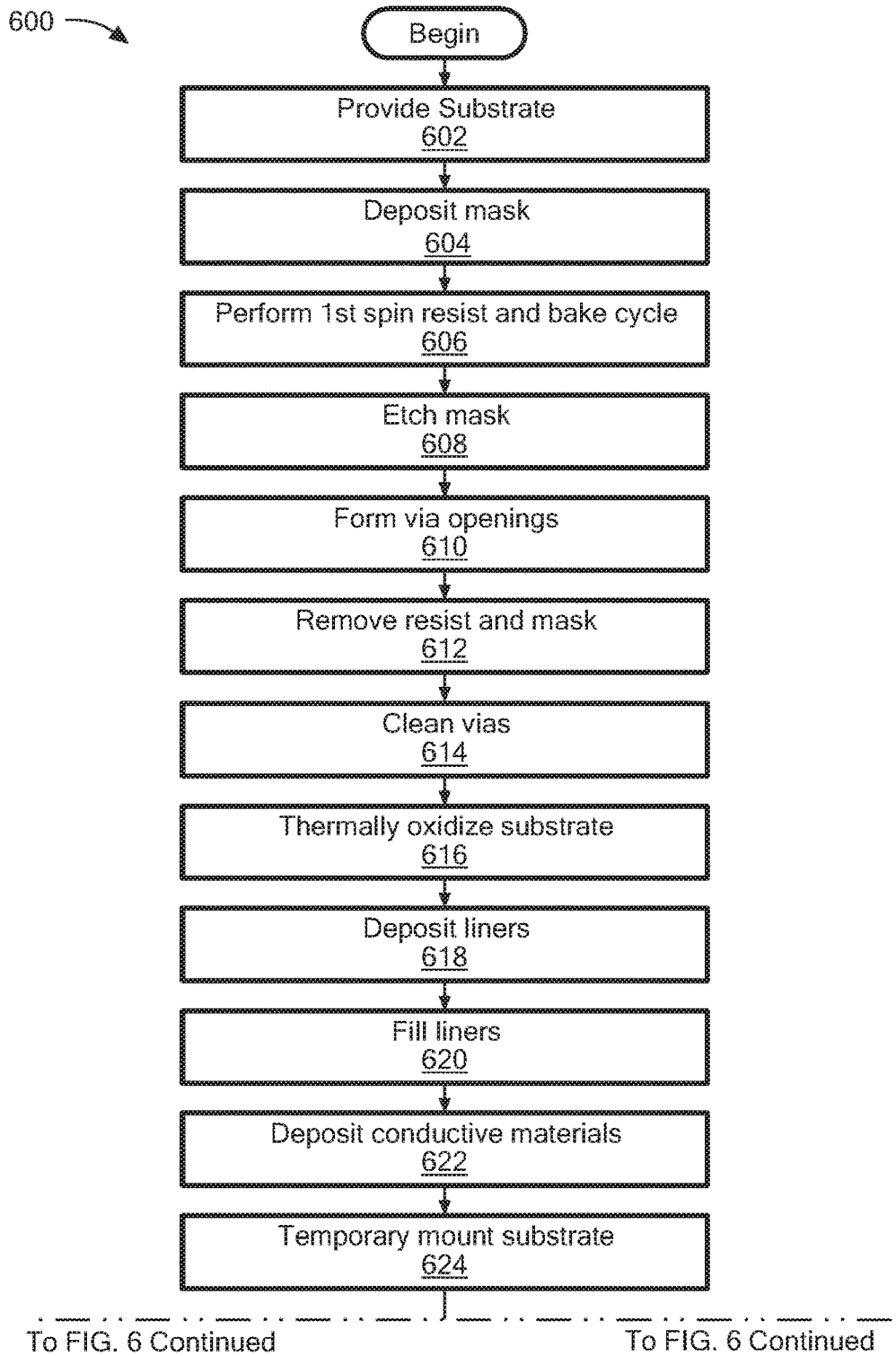
FIG. 6 is a flowchart illustrating a further example method for fabricating a interconnect structure in accordance with an embodiment of the disclosure.
Figure 6:
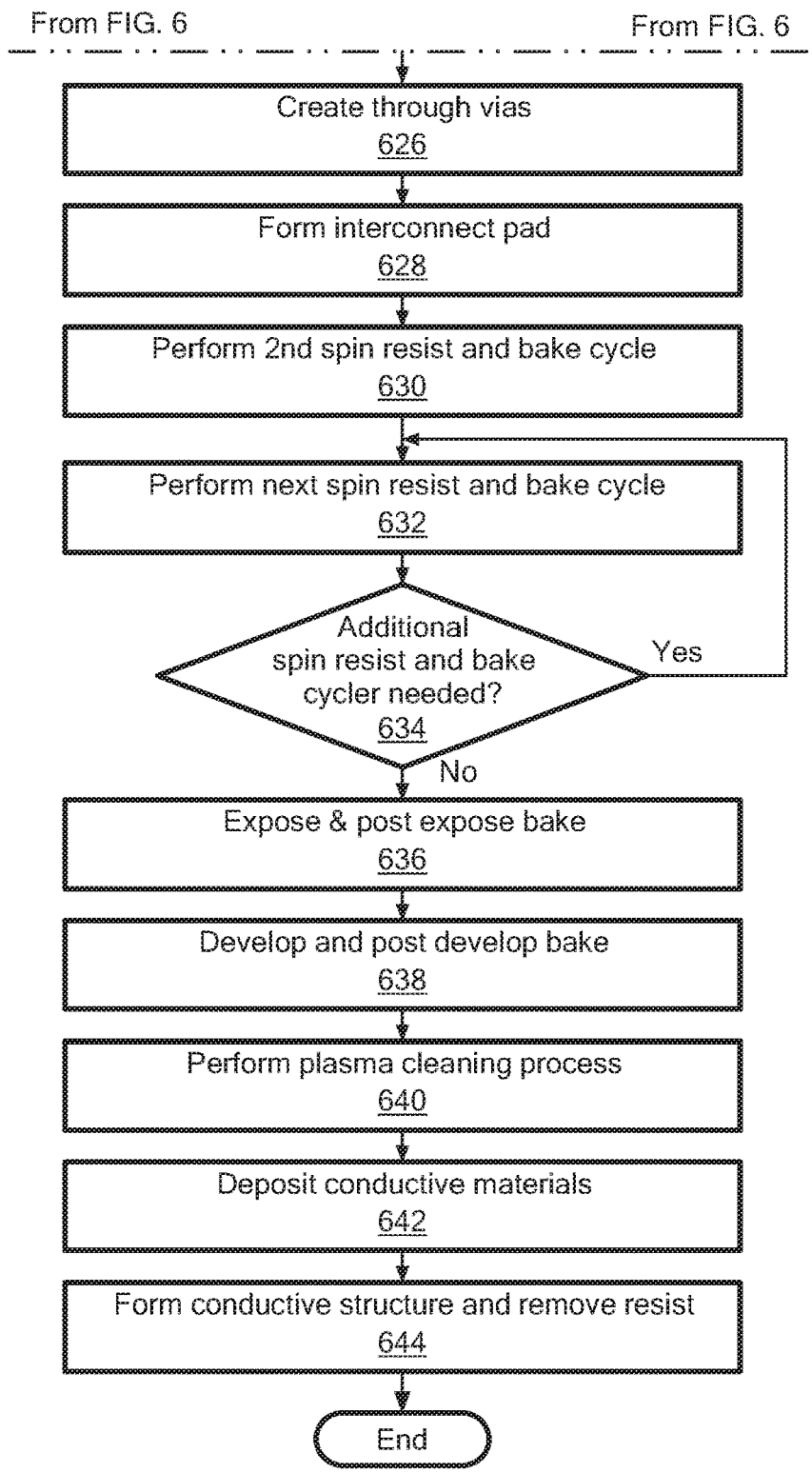

Another example method of fabricating an interconnect structure according to the disclosure (e.g., interconnect structure 1500, shown in FIG. 5A) is shown in FIG. 6.

As illustrated in FIG. 6, another example method 600 for fabricating a interconnect structure (e.g., 1500, shown in FIG. 5A) begins at block 602.

At block 602, a substrate (e.g., 510, shown in FIG. 5A) is provided. The substrate (e.g., a high resistive or regular Si substrate may be a single or multi-layer substrate. In one embodiment in which the substrate is provided as a high resistive substrate, the substrate has a resistance in a range of about three kilo-ohms to about one hundred kilo-ohms at about room temperature.

At block 604, a mask (e.g., a hard oxide mask) to be used to create opening for forming vias in the substrate is deposited or otherwise disposed over a surface of the substrate provided at block 602. The mask may be provided from a silicon oxide. Additionally, a pattern of the mask may be based upon a material (or materials) from which resist materials are provided at block 606. For example, the mask of a resist layer provided from a positive photoresist material should have a pattern which corresponds to a pattern of a resist layer to remain on the substrate (e.g., subsequent to development at block 606). In contrast, the mask of a resist layer provided from a negative photoresist material should have a pattern which is the inverse (i.e., a photographic negative) of a pattern of the resist layer to remain on the substrate.

At block 606, a first spin resist cycle and bake cycle is performed (e.g., for providing a resist layer for forming the vias in the substrate). In particular, at block 606, a first predetermined amount of resist material (e.g., a photoresist material) is disposed over one or more portions (e.g., a center portion) of the substrate. At block 606, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate. In particular, the substrate may be rotated until a desired thickness of the resist material (i.e., a distance between first and second surfaces of the resist material) is achieved on the substrate.

Additionally, at block 606, subsequent to the resist material being spread over the substrate, the substrate is baked at a predetermined temperature and for a predetermined time period to form a resist layer from the resist material disposed over the substrate. Further, at block 606, the resist layer is exposed to an exposure energy (e.g., thermal energy) to form an opening in the resist layer. The opening, which is formed according to a pattern in the mask, has a predetermined shape which is suitable for receiving conductive materials as may be used to form vias in the substrate. Additionally, the exposure energy has a predetermined intensity distribution and the resist layer is exposed to the exposure energy for a predetermined time period.

Further, at block 606, the resist layer is developed. The resist layer may be developed by immersing the substrate including the resist layer in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 606, subsequent to the resist layer being developed in the developer solution, the substrate and remaining portions of the resist layer may also be rinsed (e.g., with deionized water) to remove the developer solution from the substrate and the resist layer. The substrate and remaining portions of the resist layer may also be rinsed to prepare the substrate and the resist layer for the mask etching process performed at block 608.

At block 608, the mask is etched through the resist opening formed at block 606 to create openings which may define via diameter. Additionally, at block 610, via openings having a predetermined shape and aspect ratio (e.g., a high aspect ratio) are formed or otherwise provided in selected portions of the substrate for receiving conductive materials as may be used to form vias. In other words, at block 610 vias (or via openings) are created or etched through the openings created at block 608. The via openings have a first dimension D1 corresponding to a height or depth of the openings. The via openings also have a second dimension D2 corresponding to a width or diameter of the openings.

In one embodiment, an aspect ratio of the first dimension D1 of the openings to the second dimension D2 of the openings is substantially greater than or equal to about one. In other words, the openings have an aspect ratio of about one to one (1:1) or greater. For example, the first dimension D1 of the openings may have a value of about ten microns to about five hundred microns and the second dimension D2 of the openings may have a value of about four microns to about two hundred microns to provide for an aspect ratio of about 1:1 to about 1:40. In one example, a 10 micron diameter and 200 micron deep via with a pitch ranging from about 20 microns to about 500 microns if formed or otherwise provided. In another example, a 50 micron diameter and 500 micron deep via with a pitch ranging from 100 microns to 1000 microns is formed or otherwise provided.

The via openings may be etched in the selected portions of the substrate. The via openings may also be drilled or grinded in the selected portions of the substrate. It should be appreciated that the manner in which the via openings are formed or otherwise provided may depend upon the materials from which the substrate is provided.

At block 612, remaining portions of the resist layer are removed (e.g., stripped with a solvent, such as acetone) from the substrate to expose the substrate. Additionally, the mask is removed from the substrate solvent and or wet and or dry etching process.

At block 614, the vias formed in blocks above are cleaned using one or more plasma and/or chemical cleaning processes. The cleaning processes may, for example, prepare the substrate for providing of an interconnect pad on the substrate.

At block 616, the substrate is thermally oxidized to produce a thin layer of oxide (e.g., silicon dioxide ($SiO_2$)) on a surface of the substrate. In one embodiment, the substrate has a thickness (e.g., a distance between first and second surfaces of the substrate) of about one hundred nanometers. A number of oxide and or nitride or inorganic or organic or a combination of dielectric materials having a thickness in a range of about one hundred nanometers (nm) to about one thousand nm can be used to insulate the via. Via dielectrics may be required in some embodiments to provide for vias having substantially good step coverage (e.g., at least 50% through the depth of the trench), substantially good thickness uniformity (e.g., <3% variation across the wafer), a high deposition rate (e.g., >100 nm/min), low stress (e.g., <200 MPa), low leakage current (e.g., <1 nA/cm2), and a high breakdown voltage (e.g., >5 MV/cm).

At block 618, a liner (e.g., a Ti or TiN liner) or insulator to be used for forming vias is deposited or otherwise disposed in each of the openings formed in the substrate.

At block 620, the liners or insulators provided at block 618 are at least partially filled with a conductive material (e.g., using via-last techniques) to form corresponding vias (or electrical connections) in the substrate. The conductive material may be a superconducting material or a non-superconducting material.

Plasma-enhanced chemical vapor deposition (PECVD) of SiO2 or SiN, or sub-atmospheric chemical vapor depositions (SACVD) of SiO2, are some examples of insulator or liner depositions at block 618. The most commonly used conductors to fill vias (e.g., at bock 620) are doped polysilicon (180 lohm-cm), tungsten (5.6 lohm-cm), or copper (1.7 lohm-cm). W deposited by CVD has a good fill of the via and can be integrated with the contacts to which the vias are to be coupled. A TiN liner may be required to ensure that the WF6 precursor does not attack the Si substrate in the via. A disadvantage of W compared to Cu is that it has a high intrinsic stress (1400 MPa for W, 20 MPa for Cu).

The vias which are formed can be superconducting during qubit operation. A superconducting via comprises a Titanium Nitride (TiN) and or poly Si and or Al and or high Q metal. The vias can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc.

Reactive-ion-etching (RIE) may be used to create high aspect ratio vias and deep trench structures in the Si (i.e., for capacitors or for isolation) in which the vias are provided. In one embodiment, a RIE Bosch process may be used to fabricate the vias, with the process alternating between deposition and etching steps to fabricate deep vias. SF6 isotropic etching of Si may not be suitable for forming vias (which require a highly anisotropic etch). Fluorocarbon chemistry (e.g., C4F8) may be used for anisotropic etching achieved through the deposition of a chemically inert passivation on the sidewall of the vias.

Chemical mechanical polishing (CMP) may be used for planarization of metal filled vias (e.g., micro vias), for example. Additionally, a metal contact (i.e. pad) in an upper device layer (e.g., the second device layer) may be an annulus with an about a one point five micrometer (μm) opening that also functions as a self-aligned mask (e.g., hard mask) during the plasma etch of the oxide beneath it to reach a corresponding metal contact in a lower device layer (e.g., the first device layer). In order to fully dispose and electrically couple the vias, the size of the metal contacts, and thus the pitch of the vertical interconnect, may be made proportional to about twice the misalignment of the wafers (or semiconductor structures).

Returning now to method 600, at block 622, one or more conductive materials are deposited over selected ones of the vias formed at block 620 to form corresponding conductive layers over the vias. The conductive layers may, for example be patterned using a photo process.

At block 624, the substrate is removably coupled to a mounting surface or structure of semiconductor manufacturing equipment used fabricate an interconnect pad and a conductive structures (or bump) of an interconnect structure at blocks 626 to 644 below.

At block 626, selected portions of the substrate are grinded, etched or planarized through a chemical mechanical planarization or polishing (CMP) process to create one or more through vias in selected portions of the substrate. In one embodiment, the vias formed from the via openings formed at block 610 are vias going through some depth of Si a wafer. Grinding, etching and CMP may reveal the vias from backside and also convert the via openings formed at block 610 to through vias at block 626.

At block 628, an electrically conductive material (e.g., a superconducting metal) is deposited or otherwise disposed over the selected portions of the substrate in which the through vias are created at block 626. At block 628, the conductive material is also patterned to form an interconnect pad over the substrate. The interconnect pad is electrically coupled to the through vias (e.g., using bond wires or via contacts spaced between the interconnect pad and the through vias). Additionally, the interconnect pad may take the form of a sphere, a cube, a cylinder, a pyramid, a cone, a rectangular prism or any number of other shapes, including irregular shapes, as will be apparent to those of ordinary skill in the art.

At block 630, a process for forming or otherwise providing one or more conductive structures or "bumps" on the substrate and the interconnect pad (collectively, a semiconductor structure) provided at block 628 begins. In particular, at block 630, a spin resist and bake cycle (here, a second spin resist and bake cycle) is performed on the semiconductor structure provided at block 628. The second spin resist and bake cycle may be the same as or similar to the first spin resist and bake cycle performed at block 110 of method 100 (as described above in connection with FIG. 1).

Specifically, during the second spin resist and bake cycle, a first predetermined amount of resist material is disposed over one or more portions of the semiconductor structure. Additionally, during the second spin resist and bake cycle, the resist material is disposed (or spread) over one or more surfaces of the semiconductor structure using spin coating techniques. The spin coating techniques may comprise the semiconductor structure being rotated about a platform of a spin coater machine at a predetermined rate and for a predetermined time period in order to spread the resist layer over interconnect pad and the substrate of the semiconductor structure. The semiconductor structure may, for example, be rotated until a desired thickness of the resist material (i.e., a distance between first and second surfaces of the resist material) is achieved on the semiconductor structure.

At block 630, subsequent to the resist material being spread over the semiconductor structure, the semiconductor structure is baked at a predetermined temperature and for a predetermined time period to form a first resist layer (or a first portion of a resistor layer) from the resist material. The first resist layer formed at block 630 (e.g., 530, shown in FIG. 2) has first and second opposing surfaces, with the first surface of the first resist layer disposed (or formed) over the second surface of the interconnect pad and over the second surface of the substrate.

At block 632, a next spin resist and bake cycle is performed on the semiconductor structure. The next spin resist and bake cycle performed at block 632—may be the same as or similar to the next spin resist and bake cycle performed at block 115 of method 100.

In particular, during the next spin resist and bake cycle, a second predetermined amount of a resist material is disposed over one or more portions of the second surface of the resist layer formed at block 630. Additionally, during the next spin resist and bake cycle, the semiconductor structure is rotated by the spin coater machine at a second predetermined rate for a second predetermined time period. Similar to the first spin resist and bake cycle, the semiconductor structure may be rotated until a desired thickness of the resist material is achieved on the semiconductor structure (here, on the resist layer of the semiconductor structure).

At block 632, the semiconductor structure is also baked at a predetermined temperature and for a predetermined time period to form a second resist layer (or second portion of a resist layer). The second resist layer has a thickness (e.g., a distance between first and second opposing surfaces) which is substantially greater than a thickness of the first resist layer formed at block 630. Additionally, the second resist layer may have a more uniform surface than the first resist layer.

At block 634, it is determined whether any additional spin resist and bake cycles are needed. If it is determined that additional spin resist and bake cycles are needed, the method 600 returns to block 630 and blocks 630 and 632 are repeated until it is determined that no additional spin resist and bake cycles are needed. Alternatively, if it is determined that no additional spin resist and bake cycles are needed, the method 600 may proceed to a block 636.

A number of spin resist and bake cycles performed in method 600 may be selected to achieve a resist layer (i.e., a resist layer comprising the first resist layer and the second resist layer) having a predetermined thickness. Additionally, the number of spin resist and bake cycles performed in method 600 may be based, at least in part, on a desired aspect ratio of a conductive structure (e.g., 540, shown in FIG. 5A) to be formed in the interconnect structure (e.g., 1500, shown in FIG. 5A).

At block 636, a mask is disposed over the second surface of the resist layer and the resist layer is exposed to an exposure energy to form an opening (e.g., 532, shown in FIG. 5) in the resist layer. The opening, which is formed according to a pattern in the mask, has a predetermined shape which is suitable for receiving conductive materials as may be used to form a conductive structure (e.g., 1540, shown in FIG. 5A). Additionally, the exposure energy has a predetermined intensity distribution and the resist layer is exposed to the exposure energy for a predetermined time period.

A pattern of the mask disposed over the resist layer at block 636 is based upon the material from which the resist layer is provided. For example, the mask of a resist layer provided from a positive photoresist material should have a pattern which corresponds to a pattern of the resist layer to remain on the semiconductor structure (e.g., subsequent to development at block 638). In contrast, the mask of a resist layer provided from a negative photoresist material should have a pattern which is the inverse (i.e., a photographic negative) of a pattern of the resist layer to remain on the semiconductor structure.

At block 636, a post expose bake process is also performed on the semiconductor structure. In particular, the semiconductor structure is baked at a predetermined temperature and for a predetermined time period.

At block 638, the resist layer of the semiconductor structure is developed through a development process (e.g., in a resist developer). The resist layer may, for example, be developed by immersing the semiconductor structure in a developer solution for a predetermined time period (e.g., about two minutes). In embodiments in which the resist layer is provided from a positive photoresist material, exposed portions of the resist layer are generally removed (or washed away) during the development process. In contrast, in embodiments in which the resist layer is provided from a negative photoresist material, unexposed portions of the resist layer are generally removed during the development process.

At block 638, subsequent to the resist layer being developed, the semiconductor structure may be rinsed to prepare the semiconductor structure for the post development bake process which is also performed at block 638. In particular, during the post development bake process performed at block 638, the semiconductor structure is baked at a predetermined temperature and for a predetermined time period. The post development (or develop) bake process performed at block 638 may, for example, substantially reduce (or, ideally eliminate) residual developer from the resist opening and may necessary in order to harden the photoresist and improve adhesion of the photoresist to the wafer surface.

At block 640, one or more surfaces of the semiconductor structure are cleaned through a cleaning process (e.g., a plasma cleaning process) for a predetermined time period. The cleaning process may, for example, prepare the semiconductor structure for receiving conductive materials or layers at block 642.

At block 642, conductive materials (e.g., superconducting materials) are deposited or otherwise disposed in the openings formed in the resist layer. The conductive materials may form a conductive layer (e.g., 240, shown in FIG. 2), which conductive layer may be electrically coupled to the interconnect pad and used to form one or more conductive structures at block 644. The conductive materials and conductive layers may also be formed using a thermal evaporation or an electroplating process.

At block 644, one or more conductive structures (e.g., 540, shown in FIG. 5A) are formed from the conductive material or layer. For example, selected portions of the conductive material or layer may be lifted-off or etched (e.g., through a flash etch process) to produce the conductive structures Shapes of the conductive structures may, for example, be based on the processes used to form the conductive structures. Methods 100 and 400, as described above in connection with FIGS. 1 and 4, respectively, will create two different shape of conductive structure.

Additionally, at block 644, the resist layer of the semiconductor structure may be removed (e.g., stripped with a solvent, such as acetone) from the second surface of the interconnect pad and from the second surface of the substrate to expose the interconnect pad and the substrate. Further, at block 644, the semiconductor structure may be removed from the temporary mounting surface or structure to which the semiconductor structure was coupled at block 624.

Upon completion of block 644, the method 600 may end. The method 600 ending may, for example, be indicative of completion of the fabrication process of the interconnect structure (e.g., 1500, shown in FIG. 5A). The method 600 may be repeated (e.g., in response to a processor in the semiconductor manufacturing equipment receiving or generating a control signal) for fabricating additional interconnect structures.

Figure 7:
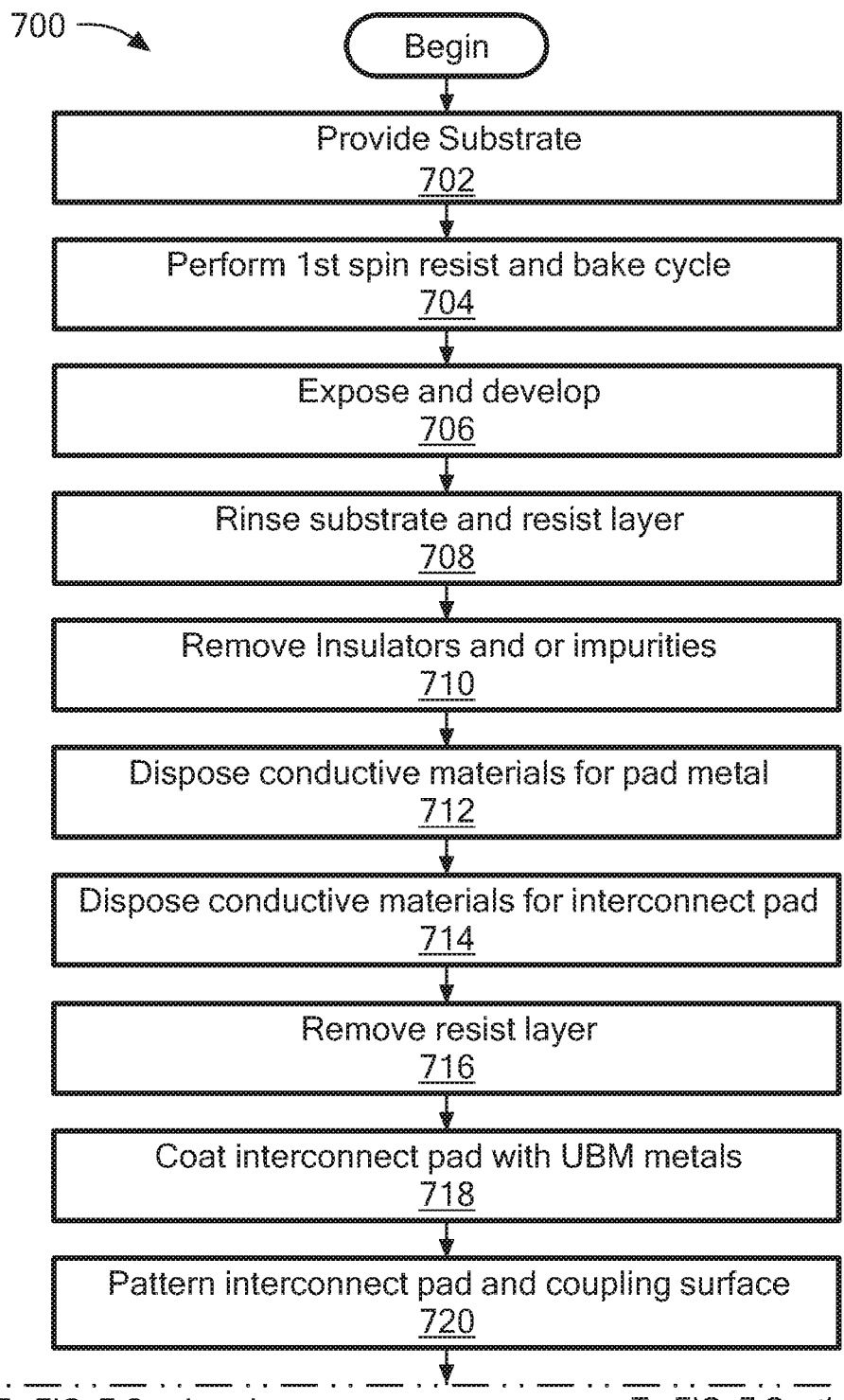
FIG. 7 is a flowchart illustrating another example method for fabricating a interconnect structure in accordance with an embodiment of the disclosure.
Figure 7:
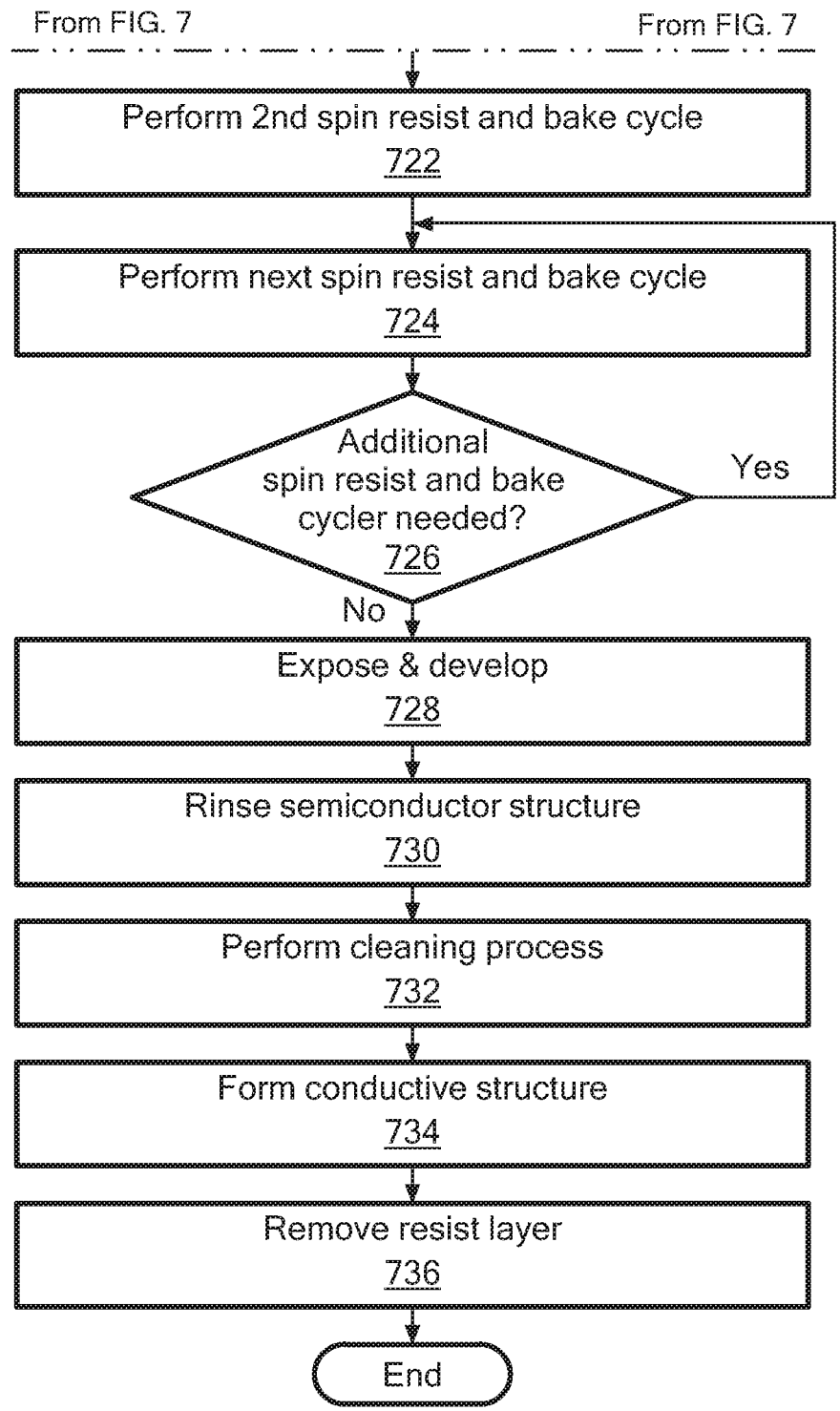

A further example method of fabricating an interconnect structure according to the disclosure (e.g., interconnect structure 1500, shown in FIG. 5A) is shown in FIG. 7.

As illustrated in FIG. 7, a method 700 for fabricating a interconnect structure (e.g., 1500, shown in FIG. 5A) begins at block 702.

At block 702, a substrate (e.g., 510, shown in FIG. 5A) is provided. The substrate (e.g., a high resistive or regular Si substrate) may be a single or multi-layer substrate. The substrate has first and second opposing surfaces and includes one or more electrical connections (or vias) disposed between the first and second surfaces.

At block 704, a first spin resist cycle and bake cycle is performed (e.g., for providing a resist layer for forming an interconnect pad on the substrate). In particular, at block 704, a first predetermined amount of resist material (e.g., a photoresist material) is disposed over one or more portions (e.g., a center portion) of the substrate. At block 704, the resist material is also disposed over or spread across one or more surfaces of the substrate using spin coating techniques as may be performed in a spin coater machine for example. The spin coater machine may, for example, rotate the substrate about a platform at a predetermined rate (e.g., angular speed) and for a predetermined time period in order to spread the resist material over the substrate.

Additionally, at block 704, subsequent to the resist material being spread over the substrate, the substrate is baked at a predetermined temperature and for a predetermined time period to form a resist layer from the resist material disposed over the substrate.

At block 706, the resist layer is exposed to an exposure energy to form an opening in the resist layer. The opening has a predetermined shape which is suitable for receiving conductive materials as may be used to form an interconnect pad on the substrate. Additionally, the exposure energy has a predetermined intensity distribution and the resist layer is exposed to the exposure energy for a predetermined time period.

At block 706, the resist layer is also developed. The resist layer may be developed by immersing the substrate in a developer solution for a predetermined time period. The resist layer may also be developed by spraying the substrate with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 708, the substrate and remaining portions of the resist layer may also be rinsed (e.g., with deionized water) to prepare the substrate for deposition of conductive materials to form the interconnect pad. Additionally, at block 710, insulators and impurities are removed from the substrate (e.g., using plasma and/or sputter etch processes).

At block 712, conductive materials as may be used to form a pad metal beneath the interconnect pad to be formed may be disposed in the opening in the resist layer. The pad metal may, for example, serve as an conductive interface between the interconnect and the pad on top of the vias in the substrate.

At block 714, conductive materials as may be used to form an interconnect pad are disposed in the opening in the resist layer. Additionally, at block 716 the resist layer may be removed from the substrate. Further, at block 718, selected portions of the interconnect pad are coated with one or more UBM metals to produce a corresponding coupling surface or structure on the interconnect pad formed at block 714.

At block 720, the interconnect pad and the coupling surface or structure of the interconnect pad are patterned and covered with UBM. For thermal or e-beam evaporation or sputtering UBM, block 718 and block 720 may be substantially the same. For electroplated UBM, there will be an etching step between block 718 and block 720. A top layer of a UBM must be readily wettable by the bump metals for solder reflow. In one embodiment, a UBM (or UBM layer (s)) uses multiple different metal layers, such as an adhesion layer, a diffusion barrier layer, a solderable layer, and an oxidation barrier layer. It is further possible that the UBM or UBM layer(s) is/are compatible metals which in combination have low internal mechanical stresses.

Examples of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In, etc.

Block 718 may be for forming a UBM on superconducting metal pad. Additionally, block 712 may be optional. In one example, at block 712 Aluminum (Al) can be deposited on a milled Al surface through the resist. In another example, at block 712 Titanium (Ti) can be deposited on a milled Al or Nb surface through the resist and Al or Nb can be deposited on top of Ti. In one example, the conductive materials disposed at blocks 712 and 714 alone, or in combination, can be used to form structures which include materials which provide a low resistance electrical connection to the superconducting pad. The structures may adhere well both to the underlying superconducting pad and to the surrounding superconducting circuit's passivation layer, hermetically sealing the superconducting circuits from the environment. In some cases, the conductive materials disposed at blocks 712 and 714 alone, or in combination, may provide a strong barrier to prevent the diffusion of other bump metals into the superconducting circuits. In one embodiment, the conductive materials disposed at blocks 712 and 714 alone, or in combination, may provide a better electrical connection with the superconducting circuits.

At block 722, a process for forming or otherwise providing one or more conductive structures or "bumps" on the substrate and the interconnect pad (collectively, a semiconductor structure) provided at block 720 begins. In particular, at block 720, a spin resist and bake cycle (here, a second spin resist and bake cycle) is performed on the semiconductor structure provided at block 720.

The second spin resist and bake cycle (also sometimes referred to herein as "second cycle") comprises disposing a first predetermined amount of resist material over one or more portions of the semiconductor structure. Additionally, the second cycle comprises disposing (or spreading) the resist material over one or more surfaces of the semiconductor structure using spin coating techniques. The spin coating techniques may comprise rotating the semiconductor structure about a platform of a spin coater machine at a first predetermined rate and for a first predetermined time period in order to spread the resist material. The semiconductor structure may, for example, be rotated by the spin coater machine until a desired thickness of the resist material (i.e., a distance between first and second opposing surfaces of the resist material) is achieved on the semiconductor structure.

The second cycle performed at block 722 further comprises baking the semiconductor structure at a predetermined temperature and for a predetermined time period to form a first resist layer (or a first portion of a resistor layer) from the resist material disposed over the semiconductor structure. The first resist layer (e.g., 530a, shown in FIG. 5) has first and second opposing surfaces, with the first surface of the first resist layer disposed (or formed) over a surface of the interconnect pad and over a surface of the substrate.

At block 724, a next spin resist and bake cycle (also sometimes referred to herein as a "next cycle") is performed on the semiconductor structure. The next cycle comprises disposing a second predetermined amount of a resist material over one or more portions of the second surface of the first resist layer formed at block 722. Additionally, the next cycle comprises disposing (or spreading) the resist material over one or more surfaces of the first resist layer using spin coating techniques. The spin coating techniques may comprise rotating the semiconductor structure about a platform of a spin coater machine at a second predetermined rate and for a second predetermined time period in order to spread the resist material. The semiconductor structure may, for example, be rotated by the spin coater machine until a desired thickness of the resist material (i.e., a distance between first and second opposing surfaces of the resist material) is achieved on the first resist layer.

The next cycle performed at block 724 further comprises baking the semiconductor structure at a predetermined temperature and for a predetermined time period to form a next resist layer (or next portion of a resist layer) from the resist material. In one embodiment, the next resist layer has a thickness (e.g., a distance between first and second opposing surfaces) which is substantially greater than a thickness of the first resist layer formed at block 722. Additionally, the next resist layer may have a more uniform surface than the first resist layer.

At block 726, it is determined whether any additional spin resist and bake cycles are needed. If it is determined that additional spin resist and bake cycles are needed, the method 700 returns to block 722 and blocks 722 and 724 are repeated until it is determined that no additional spin resist and bake cycles are needed. Alternatively, if it is determined that no additional spin resist and bake cycles are needed, the method 700 may proceed to a block 730.

Similar to method 600, a number of spin resist and bake cycles performed in method 700 may be selected to achieve a resist layer (i.e., a resist layer comprising the first resist layer and at least one next resist layer) having a predetermined thickness. Additionally, similar to method 600, the number of spin resist and bake cycles performed in method 600 may be based, at least in part, on a desired aspect ratio of a conductive structure (e.g., 540, shown in FIG. 5A) to be formed in the interconnect structure (e.g., 1500, shown in FIG. 5A).

Referring now to block 728, at block 728 a mask is disposed over the second surface of the resist layer and the resist layer is exposed to an exposure energy (e.g., thermal energy) to form an opening (e.g., 532, shown in FIG. 5) in the resist layer. The opening, which is formed according to a pattern in the mask, has a predetermined shape which is suitable for receiving conductive materials as may be used to form a conductive structure (e.g., 540, shown in FIG. 5A).

At block 728, the resist layer is also developed. The resist layer may be developed, for example, by immersing the semiconductor structure in a developer solution for a predetermined time period. The resist layer may also be developed by spraying the semiconductor structure with the developer solution for the predetermined time period. In embodiments in which the resist layer is provided from a positive photoresist material, exposed portions of the resist layer are generally removed (or washed away) by the developer solution. In contrast, in embodiments in which the resist layer is provided from a negative photoresist material, unexposed portions of the resist layer are generally removed by the developer solution.

At block 730, the semiconductor structure is rinsed (e.g., with deionized water) to remove leftover developer solution from the semiconductor structure. The semiconductor structure may also be rinsed to prepare the semiconductor structure for a cleaning process performed at block 732. In particular, at block 732, the semiconductor structure is cleaned (e.g., using a plasma cleaning process) to prepare the semiconductor structure for receiving conductive materials for forming one or more conductive structures at block 734.

At block 734, one or more conductive structures are formed on a surface of the interconnect pad using a thermal evaporation or an electroplating process. Additionally, at block 736, remaining portions of the resist layer are removed from the semiconductor structure to form an interconnect structure.

Upon completion of block 736, the method 700 may end. The method 700 ending may, for example, be indicative of completion of the fabrication process of the interconnect structure (e.g., 1500, shown in FIG. 5A). The method 700 may be repeated (e.g., in response to a processor in the semiconductor manufacturing equipment receiving or generating a control signal) for fabricating additional interconnect structures.

Figure 8:
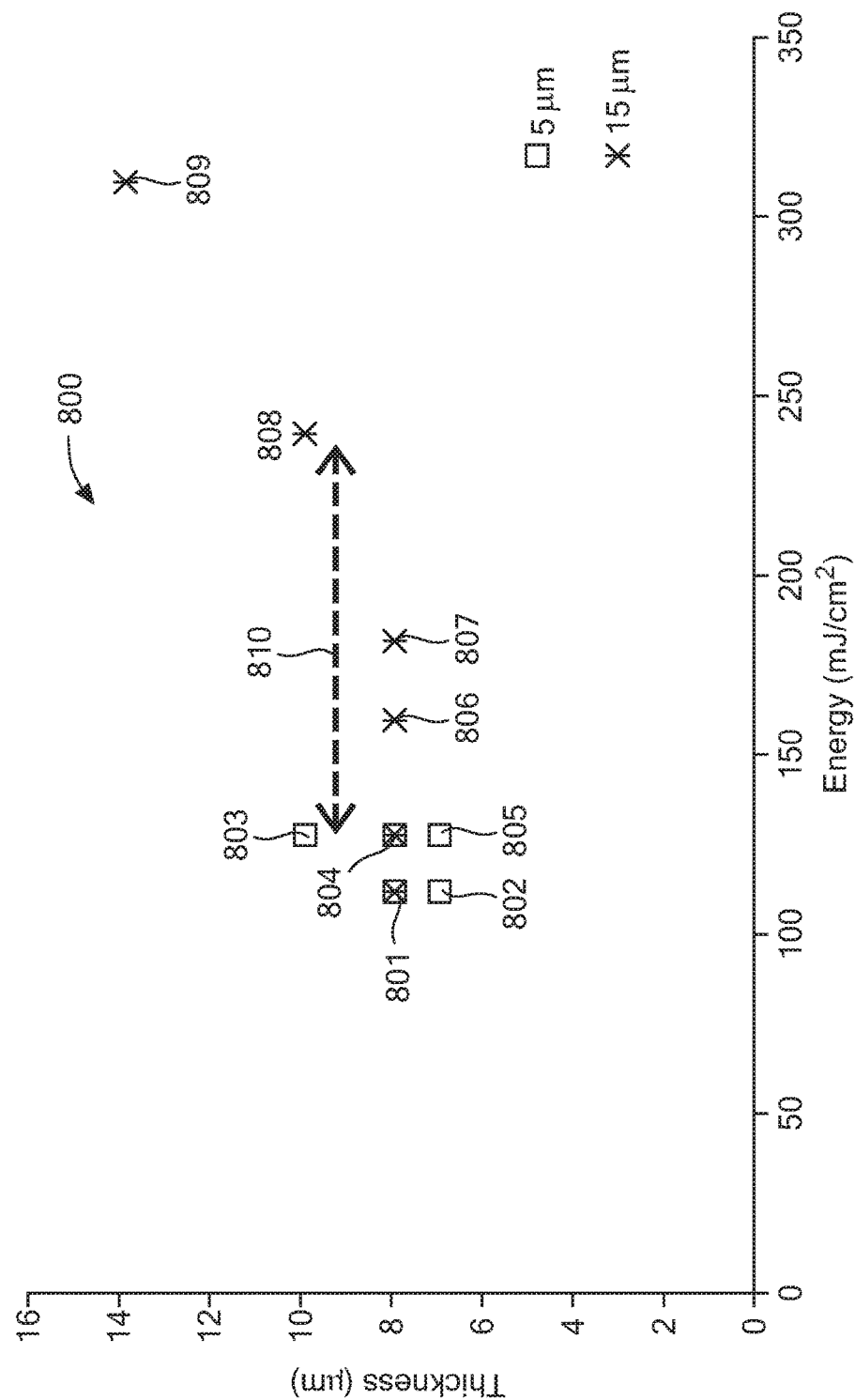
FIG. 8 is a plot illustrating an example relationship between exposure energy and resist thickness.

Referring to FIG. 8, a plot 800 shows an example relationship between exposure energy and resist thickness of a resist layer (e.g., 530, shown in FIG. 5) subjected to the exposure energy. Plot 800 also has a horizontal axis with a scale in exposure energy units (e.g., millijoule per square centimeter (mJ/cm$^2$). Additionally, plot 800 has a vertical axis with a scale in resist thickness units (e.g., micrometers μm). The vertical axis may, for example, be illustrative of resist thickness of a resist layer resulting from the spin resist and bake cycles performed at blocks 722 to 726 of method 700. Additionally, the horizontal axis may be illustrative of a level of exposure energy to which the resist layer is exposed at block 728 of method 700.

The plot 800 includes a plurality of points (e.g., 801, 802, 803, 804, 805, 806, 807, 808, 809) representative of different sized openings (e.g., 532, shown in FIG. 5) formed in the resist layer in response to different resist thicknesses and exposure energies. Point 803 may, for example, be representative of a five μm opening formed in a resist layer having a thickness of about ten μm and which is subjected to an exposure energy of about one hundred forty mJ/cm². Additionally, point 808 may be representative of a fifteen μm opening formed in a resist layer having a thickness of about ten μm and which subjected to an exposure energy of about two hundred forty mJ/cm². A larger resist opening (e.g., a fifteen μm opening versus a five μm opening) may, for example, provide for the ability for multiple conductive structures (e.g., 540, shown in FIG. 5) to be formed on an interconnect pad (e.g., 520, shown in FIG. 5) to which the resist opening leads to.

Dimensions of the resist opening may, for example, be selected based upon a size and/or shape of the interconnect pad to which the resist opening leads to and/or a number of conductive structures to be formed on the interconnect pad. For example, a twenty μm circular interconnect pad comprising three conductive structures may call for a resist opening of about five μm or less. Additionally, a fifteen μm circular interconnect pad comprising two conductive structures may call for a resist opening of about five μm or less. Further, a five μm circular pad comprising a single conductive structure may call for a resist opening of about five μm.

In one embodiment, the foregoing illustrates a variable density and pitch multi microbump approach where a photolithography process may provide a bump for a lowest pitch pad structure and a same (or similar) bump may be repeated multiple times on a same pad for larger pitch structure. This approach may minimize solder spreading in larger pads and may also minimize electrical shorts. Additionally, this approach may be capable of maintaining finer pitch and larger pitch structure. In one example, an about 15 micron pitch structure and an about 35 micron pitch structure can use an about 4-6 micron single bump for an about 15 micron pitch. Additionally, multiple 4-6 micron bumps can be used for an about 35 micron pitch. In another example, an about 15 micron pitch structure can use an about 4-6 micron single bump and an about 35 micron pitch structure can use an about 10-20 micron bump.

Referring now to FIG. 9, an example multi-layer semiconductor structure 900 as may be fabricated using interconnect structures according to the concepts, systems, circuits, and techniques sought to be protected herein is shown. Multi-layer semiconductor structure 900 includes a first semiconductor structure 910, a second semiconductor structure 920, and a third semiconductor structure 930. Multi-layer semiconductor structure 900 also includes a first interconnect structure 950 (e.g., a superconducting or partially superconducting interconnect) for coupling the second semiconductor structure 920 to the first semiconductor structure 910.

Multi-layer semiconductor structure 900 additionally includes a plurality of wire bonding structures (here, wire bonding structures 941, 942) for coupling the third semiconductor structure 930 to the second semiconductor structure 920. Here, wire bonding structures 941 and 942 show two sides of an open superconducting via attached with a superconducting and or normal metal UBM. Additionally, semiconductor structures 920 and 930 may represent two sides of a same structure.

First semiconductor structure 910 (e.g., a multi-chip module (MCM)) has first and second opposing surfaces and includes interconnect pads 911, 912, 914 (e.g., conventional Al, Ti, Pt, and/or Au interconnect pads) which also have first and second opposing surfaces. Interconnect pad 911 has a surface disposed over or otherwise coupled to the first surface of first semiconductor structure 910. Additionally, interconnect pad 912 has a surface disposed over or otherwise coupled to the second surface of the first semiconductor structure 910. Further, interconnect pad 914 is disposed between the first and second surfaces of the first semiconductor structure 910.

First semiconductor structure 910 additionally includes a plurality of electrical connections or via structures (here, via structures 913, 915) disposed between the first and second surfaces of the first semiconductor structure 910. Via structure 913 is electrically coupled to interconnect pads 911, 914. Additionally, via structure 915 is electrically coupled to interconnect pads 914, 913.

Second semiconductor structure 920 (e.g., a superconducting IC) has first and second opposing surfaces and includes a substrate (e.g., a high resistive silicon (Si) substrate) which also has first and second opposing surfaces. The substrate, which has an associated thickness (e.g., of about two inches for a Titanium Nitride (TiN) substrate), has a plurality of electrical connections or via structures (e.g., partially filled or open vias) extending between the first and second surfaces of the substrate 921. Partially filled vias may, for example, provide for a larger pitch, e and filled superconducting vias may need longer deposition and processes. Open vias will provide sufficient superconductivity. The via structures may include one or more high Q metals (e.g., Niobium (Nb) or Indium (In)). Openings in which the via structures are formed may, for example, be etched in the substrate 921, and the substrate 921 may be cleaned and annealed prior to deposition of the high Q metals used to form the via structures.

High Q metals having a predetermined thickness (e.g., between about forty nanometers (nm) and about five hundred nm) are also deposited or otherwise disposed over selected portions of the second semiconductor structure 920 (e.g., using one or more physical (e.g., sputter) and chemical (e.g., electroless) processes). The predetermined thickness may, for example, be selected to provide for sufficient shielding which is substantially easy to achieve with less (or reduced) processing time. The high Q metals are patterned (e.g., using a photo process) to form a plurality of high Q metal structures (here, metal structures 922, 923, 924, 925, 926) on the substrate 921. The high Q metal structures may be electrically coupled to selected ones of the via structures formed in the substrate 921. In one embodiment, an adhesion layer (e.g., a Titanium (Ti) or Chromium (Cr) adhesion layer) is disposed between the selected portions of the second semiconductor structure 920 over which the high Q metals are disposed.

An interconnect pad 941 which may be provided from one or more under bump metal (UBM) materials (e.g., a Niobium pad) has a surface disposed over or otherwise coupled to the first surface of semiconductor structure 920. Additionally, a Josephson Junction (JJ) structure 928 (e.g., an aluminum (Al) JJ structure) is disposed over and otherwise coupled to selected portions of high Q metal structures 924, 925. In one embodiment, the substrate 921 has a "bulk" resistance of greater than about ten thousand ohms centimeter, an orientation of one hundred plus or minus zero point five degrees, and a thickness between about two hundred sixty and about three hundred micrometers.

Third semiconductor structure 930 (e.g., a superconducting IC), which may be the same as or similar to interconnect structure 920 in some embodiments, has first and second opposing surfaces and includes a substrate 931 (e.g., a high resistive silicon (Si) substrate) which also has first and second opposing surfaces. The substrate 931 has a plurality of electrical connections or via structures extending between the first and second surfaces of the substrate. Additionally, high Q metals having a predetermined thickness are deposited or otherwise disposed over selected portions of the third semiconductor structure 930. The high Q metals are patterned to form a plurality of high Q metal structures (here, metal structures 932, 933, 934) on the substrate 931. An interconnect pad 935 (e.g., a Niobium pad) has a surface disposed over or otherwise coupled to the first surface of semiconductor structure 930.

In the illustrated embodiment, second semiconductor structure 920 is coupled to first semiconductor structure 910 via interconnect structure 950 (here, a conductive structure 950). In particular, interconnect structure 950, which is a superconducting or partially superconducting interconnect structure according to the disclosure, has a first portion coupled to interconnect pad 912 of first semiconductor structure 910. Additionally, interconnect structure 950 has a second opposing portion coupled to interconnect pad 927 (e.g., a superconducting pad) of second semiconductor structure 920. In embodiments, at least one of interconnect pads 912, 927 is provided as part of the interconnect structure 950. It is further possible that interconnect pads 912 and or 927 are provided from conventional metals and make the interconnect 950 partially superconducting. It is also possible that interconnect pads 912 and 927 are superconducting and make the interconnect 950 superconducting.

Second semiconductor structure 920 is coupled to third semiconductor structure 930 via wire bonding structures 941, 942. In particular, wire bonding structure 941 has a first portion coupled to metal structure 926 of semiconductor structure 920 and a second opposing portion coupled to metal structure 934 of semiconductor structure 930. Additionally, wire bonding structure 942 has a first portion coupled to metal structure 926 of semiconductor structure 920 and a second opposing portion coupled to metal structure 934 of semiconductor structure 930.

Semiconductor structures 910 and 920 may be coupled together via interconnect structure 950 through a coupling process. In particular, during the coupling process, interconnect structure 950 may melt and form an electrical connection between interconnect pads 912, 927 of first semiconductor structure 910 and second semiconductor structure 920, respectively. In one example, interconnect pads 912 and 927 are UBMs and can create several high temperature and or low temperature melt interfaces during flip-chip bonding. It is possible that interconnect pads 912 and 927 and interconnect structure 950 have high temperature melting but create a low temperature melt interface between interconnect pad 912 and interconnect structure 950, and between interconnect pad 927 and interconnect structure 950. Thus, it is possible to bond interconnect structure 950 at a lower temperature but still can create meltable robust interface for a superconducting and or partially superconducting interconnect.

In one embodiment, the size and shape of at least one of the above-described interconnect pads (e.g., 912) and interconnect structure 950 is selected to achieve a desired pitch (e.g., a pitch requirement of semiconductor structure 910 or semiconductor structure 920). Additionally, in one embodiment, the size and shape of at least one of the above-described interconnect pads (e.g., 912) and interconnect structure 950 is selected to achieve a desired spacing S1 between semiconductor structures 910 and 920. The desired spacing S1 may be selected, for example, to achieve a predetermined inductive coupling between semiconductor structure 910 and semiconductor structure 920.

In one embodiment, the desired spacing S1 and height of the interconnect structure 950 (e.g., a bump) should generally be good enough to compensate for nonunifomity within chip+nonunifomity within MCM+nonunifomity among the bumps. For the structures shown in FIGS. 2 and 2A, for example, an area of atop surface of conductive structure 1240 will be less than area of resist opening which helps to maintain finer pitch even with taller conductive structure. Similarly, for the structures shown in FIGS. 5 and 5A, an area of a top surface (e.g., 540a) of conductive structure 540 will be more than area of resist opening for taller conductive structure.

In the illustrated embodiment, semiconductor structure 910 has first package pitch and semiconductor structure 920 has a second package pitch. Interconnect structure 950 has one or more characteristics (e.g., dimensions) selected in accordance with the first or second package pitches.

Figure 9A:
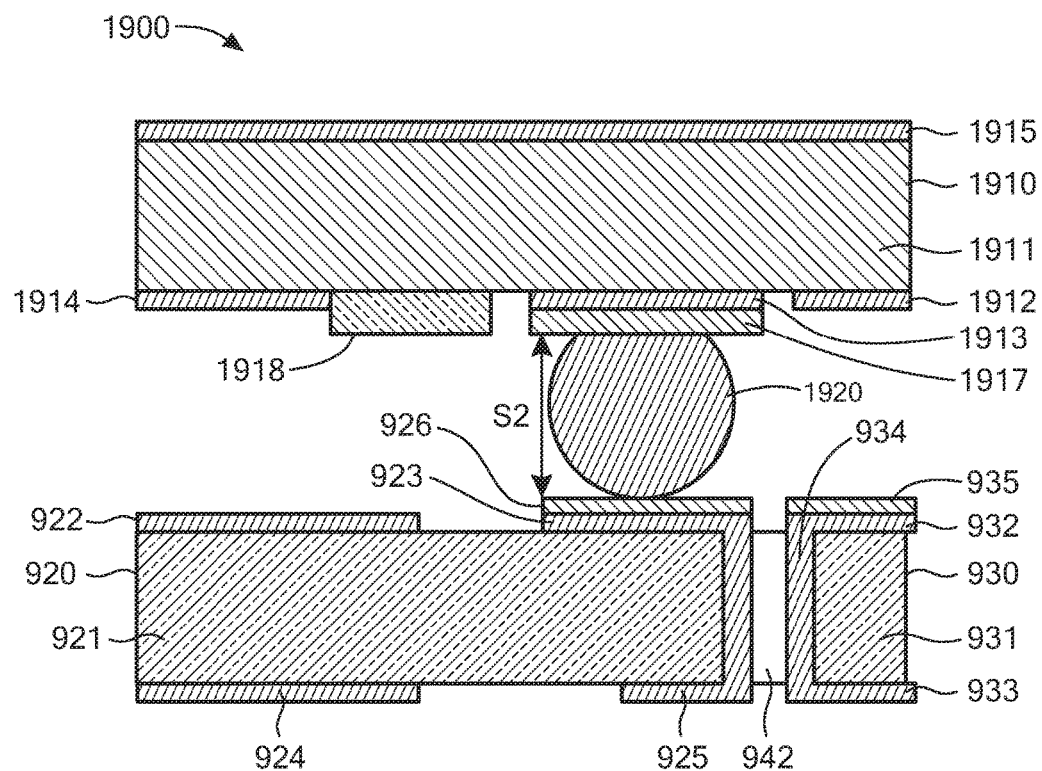
FIG. 9A is a block diagram of another example semiconductor structure as may be formed using an interconnect structure according to the disclosure.

Referring now to FIG. 9A, in which like elements of FIG. 9 are provided having like reference designations, another example multi-layer semiconductor structure 1900 as may be fabricated using interconnect structures according to the disclosure includes interconnect structure 920 (here, a first interconnect structure 920), interconnect structure 930 (here, a second interconnect structure 930) and a third interconnect structure 1910.

Third interconnect structure 1910, similar to first interconnect structure 920 and second interconnect structure 930, has first and second opposing surfaces and includes a substrate 931 (e.g., a high resistive silicon (Si) substrate) which also have first and second opposing surfaces. The substrate 1911 has a plurality of electrical connections or via structures extending between the first and second surfaces of the substrate 1911. High Q metals having a predetermined thickness are deposited or otherwise disposed over selected portions of the third semiconductor structure 1910 (e.g., using one or more physical (e.g., sputter) and chemical (e.g., electroless) processes). Additionally, the high Q metals are patterned (e.g., using a photo process) to form a plurality of high Q metal structures (here, metal structures 1912, 1913, 1914, 1915) on the substrate 1911. The metal structures 1912, 1913, 1914, 1915 may be coupled to selected ones of the via structures formed in the substrate 1911.

An interconnect pad 1917 (e.g., a Niobium pad) has a surface disposed over or otherwise coupled to a surface of metal structure 1913. Additionally, a Josephson Junction (JJ) structure 1918 (e.g., an aluminum (Al) JJ structure) is disposed over and otherwise coupled to selected portions of high Q metal structure 1914.

Third semiconductor structure 1910 is coupled to first semiconductor structure 920 via interconnect structure 1920 (here, a conductive structure 1920). Interconnect structure 1920 is a superconducting interconnect structure according to the disclosure (e.g., 1200, shown in FIG. 2A, or 1550, shown in FIG. 5A). The size and shape of at least one of the interconnect pads (e.g., 926) and interconnect structure 1920 may be selected to achieve a desired pitch (e.g., a pitch requirement of semiconductor structure 920 or semiconductor structure 1910). Additionally, the size and shape of at least one of the interconnect pads (e.g., 916) and interconnect structure 1920 is selected to achieve a desired spacing S2 between semiconductor structures 920 and 1910. Similar to spacing S1 of multi-layer semiconductor structure 900 of FIG. 9, spacing S2 may be selected to achieve a predetermined inductive coupling between semiconductor structure 920 and semiconductor structure 1910.

Provided below is a table illustrating example compositions of interconnect structures or portions thereof (e.g., conductive structures or bumps) formed according to the disclosure (e.g., as shown in FIGS. 5 and 5A). The first and second interconnect portions shown in the first two columns of the table below may, for example, be heated (e.g., with or without pressure) to form the resulting interconnect structures shown in the third column of the table.

| First Interconnect Portion | Second Interconnect Portion | Resulting Interconnect |
|---|---|---|
| 4.5 micrometer (μm) Tin (Sn) bump | 4.5 μm Indium (In) bump | <9 μm InSn bump |
| 8 μm Sn bump | 1 μm In bump/pad | <9 μm interconnect having InSn interface, InSn concentration gradient and Sn bump |
| 8 μm Sn bump | 1 μm In bump/pad | <9 μm interconnect having InSn interface, InSn concentration gradient and In bump |
| 8 μm Lead (Pb) bump | 1 μm Sn bump/pad | <9 μm interconnect having PbSn interface, PbSn concentration gradient and Pb bump |
| 8 μm Pb coated Sn bump | 1 μm In pad | <9 μm interconnect having PbSn at Pb interface and SnIn at In pad interface, Sn concentration gradient and Sn bump |
| 4.5 μm Au (Gold) coated Tin (Sn) bump | 4.5 μm Au coated Indium (In) bump | <9 μm InSn bump, Au diffuse within matrix |
| 8 μm Au coated Sn bump | 1 μm Au coated In bump/pad | <9 μm interconnect having InSn interface, InSn concentration gradient, Sn bump, Au diffuse within matrix |
| 8 μm Au coated Sn bump | 1 μm Au coated In bump/pad | <9 μm interconnect having InSn interface, InSn concentration gradient and In bump |
| 8 μm Lead (Pb) bump | 1 μm Sn bump/pad | <9 μm interconnect having PbSn interface, PbSn concentration gradient and Pb bump |
| 8 μm Au coated Copper (Cu) bump | 1 μm Au coated In pad | <9 μm interconnect having CuSn interface, Sn concentration gradient, Cu bump, and Au diffuse within matrix |

Figure 10:
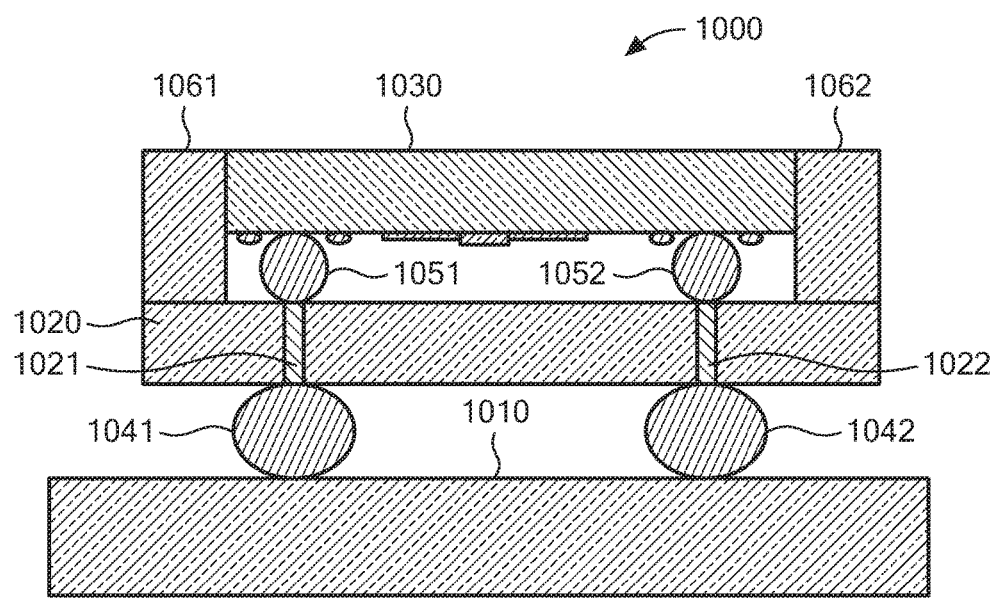
FIG. 10 is a block diagram of an example semiconductor structure as may be formed using an interconnect structure and a spacer according to the disclosure.

Referring now to FIG. 10, an example multi-layer semiconductor structure 1000 as may be fabricated using interconnect structures and interconnect spaces (also sometimes referred to herein as "spacers") according to the concepts, systems, circuits, and techniques sought to be protected herein is shown. Multi-layer semiconductor structure 1000 includes a first semiconductor structure 1010, a second semiconductor structure 1020 and a third semiconductor structure 1030. Additionally, multi-layer semiconductor structure 1000 includes first interconnect structures 1041, 1042, second interconnect structure 1051, 1052, and a plurality of spacers (here, spacers 1061, 1062).

First semiconductor structure 1010 (e.g., a functional SMCM) has first and second opposing surfaces and includes one or more electrical connections disposed between the first and second surfaces. Additionally, second semiconductor structure 1020 (e.g., a TSV substrate) has first and second opposing surfaces and includes a plurality of TSV structures (here, TSV structures 1021, 1022) disposed between the first and second surfaces. TSV structure 1021 may be coupled to first selected electrical connections in the second semiconductor structure 1020. Additionally, TSV structure 1022 may be coupled to second selected electrical connections in the second semiconductor structure 1020. The first and second electrical connections may the same as or similar to each other in some embodiments. Third semiconductor structure (e.g., a Qubit IC) has first and second opposing surfaces and one or more sides.

In the illustrated embodiment, second semiconductor structure 1020 is electrically coupled to first semiconductor structure 1010 through first interconnect structures 1041, 1042. Additionally, third semiconductor structure 1030 is electrically coupled to second semiconductor structure 1020 through second interconnect structures 1051, 1052. First interconnect structures 1041, 1042 and second interconnect structures 1051, 1052 may be the same as or similar to interconnect structures described in connection with figures above (e.g., 1200, shown in FIG. 2A).

First interconnect structures 1041, 1042 are disposed or otherwise provided (e.g., deposited) between the first surface of second semiconductor structure 1020 and the second surface of first semiconductor 1010. Interconnect structure 1041 is coupled to TSV structure 1021 in second semiconductor structure 1020. Additionally, interconnect structure 1042 is coupled to TSV structure 1022 in second semiconductor structure 1020.

Second interconnect structures 1051, 1052 are disposed between the first surface of third semiconductor structure 1030 and the second surface of second semiconductor 1020. Interconnect structure 1051 is coupled to TSV structure 1021 in second semiconductor structure 1020. Additionally, interconnect structure 1052 is coupled to TSV structure 1022 in second semiconductor structure 1020.

In the illustrated embodiment, third semiconductor structure 1030 is also coupled (e.g., mechanically and/or electrically) to second semiconductor structure 1020 through spacers 1061, 1062. The spacers 1061, 1062, which may be provided as oxide spacers, are coupled to selected portions of the first and second semiconductor structures 1020, 1030. In particular spacer 1061 has a first portion coupled to a first selected portion of the second surface of second semiconductor structure. Additionally, spacer 1061 has a second opposing portion coupled to a first side (or edge) of third semiconductor structure 1030. Spacer 1061 may, for example, be coupled to second and third semiconductor structures 1020, 1030 using an adhesive in some embodiments (e.g., a cryogenically stable adhesive).

Similarly, spacer 1062 has a first portion coupled to a second selected portion of the second surface of second semiconductor structure. Additionally, spacer 1062 has a second opposing portion coupled to a second side (or edge) of third semiconductor structure 1030. Spacer 1062 may also be coupled to second and third semiconductor structures 1020, 1030 using an adhesive in some embodiments.

In one embodiment, spacers 1061, 1062 are used to improve bond stability between second semiconductor structure 1020 and third semiconductor structure 1030, without providing or resulting in signal loss. Additionally, in one embodiment, spacers 1061, 1062 are used to protect at least one of the second and third semiconductor structures 1020, 1030 during assembly of multi-layer semiconductor structure 1000. As one example, spacers 1061, 1062 may protect Josephson junctions (or other structures) which may be provide in the third semiconductor structure 1030.

Further, in one embodiment, spacers 1061, 1062 may be used to control a thickness or distance between the second surface of second semiconductor structure 1020 and third semiconductor structure 1030. Interconnect structures (e.g., 1051, 1052) having a predetermined height or thickness (i.e., a distance between first and second opposing portions) may, for example, be established based upon a package pitch of the second semiconductor structure 1020 and/or a package pitch of the third semiconductor structure 1030. The predetermined height or thickness of the interconnect structures may control the thickness or distance between the second and third semiconductor structures 1020, 1030. In one embodiment, an interconnect structure having a height or thickness of between about six micrometers and about eight micrometers is established for an about thirty five micrometer package pitch. Additionally, in one embodiment, an interconnect structure having a height or thickness of between about four micrometers and about six micrometers is established for an about fifteen micrometer package pitch.

The predetermined height or thickness of the interconnect structures disposed between the second and third semiconductor structure 1020, 1030 may be controlled by the spacers 1061, 1062. For example, the predetermined height or thickness of the interconnect structures may be controlled by adjusting a distance between first and second opposing portions of the spacers 1061, 1062.

Additional aspects of spacers according to the disclosure, and alternative embodiments of spacers according to the disclosure, are discussed in connection with figures below.

Figure 11:
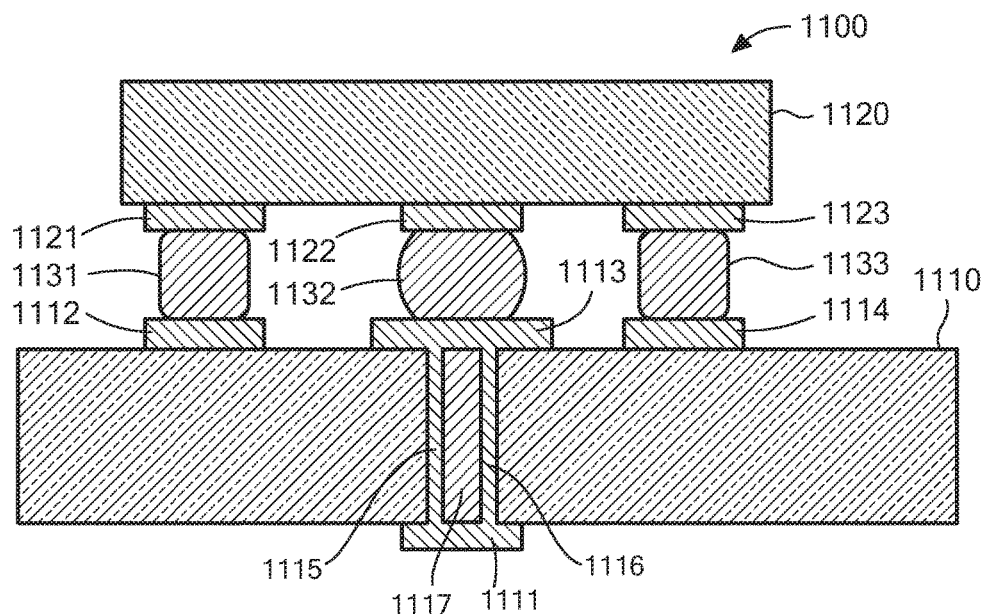
FIG. 11 is a block diagram of another example semiconductor structure as may be formed using an interconnect structure and a spacer according to the disclosure.

Referring now to FIG. 11, another example multi-layer semiconductor structure 1100 as may be fabricated using interconnect structures and spacers according to the disclosure includes a first semiconductor structure 1110, a second semiconductor structure 1120, an interconnect structure 1132 and spacers 1131, 1133.

First semiconductor structure 1110 (e.g., a TSV/MCM containing active device) has first and second opposing surfaces and includes interconnect pads 1111, 1112, 1113, 1114 which also have first and second opposing surfaces. The first surface of interconnect pad 1111 is disposed over or beneath a select portion of the first surface of first semiconductor structure 1110. Additionally, the first surface of each of interconnect pads 1112, 1113, 1114 is disposed over or beneath select portions of the second surface of first semiconductor structure 1110.

First semiconductor structure 1110 also includes a first pad interconnect 1115 which extends from a first select portion of the first surface of interconnect pad 1111 to a first select portion of interconnect pad 1113. Additionally, first semiconductor structure 1110 includes a second pad interconnect 1116 which extends from a second select portion of the first surface of interconnect pad 1111 to a second select portion of interconnect pad 1113. First semiconductor structure 1110 further includes a through silicon via (TSV) structure 1117 which is disposed in a cavity formed between the first and second pad interconnects 1115, 1116. TSV structure 1117 is electrically coupled to the first surfaces of each of interconnect pads 1111, 1113.

Second semiconductor structure 1120 (e.g., a Qubit chip) has first and second opposing surfaces and includes interconnect pads 1121, 1122, 1123 which also have first and second opposing surfaces. The first surface of each of interconnect pads 1121, 1122, 1123 is disposed over or beneath select portions of the first surface of second semiconductor structure 1120. In one embodiment, the interconnect pads 1121, 1122, 1123 are each provided from or include Aluminum (Al) and/or copper doped Al and/or an under bump material.

Interconnect structure 1132, which may be the same as or similar to interconnect structures described in figures above (e.g., 1200, shown in FIG. 2A), is provided as an interconnect (e.g., a superconducting interconnect) for electrically and mechanically coupling the second semiconductor structure 1120 to the first semiconductor structure 1110. Interconnect structure 1132 has first and second opposing portions. In the illustrated embodiment, interconnect structure 1132 has a first portion coupled to the second surface of interconnect pad 1112 of first semiconductor structure 1110 and a second opposing portion coupled to the second surface of interconnect pad 1121 of second semiconductor structure 1120. Additionally, interconnect structure 1132 may include one or more superconducting or partially superconducting materials (e.g., In).

Spacers 1131, 1133, which are provided as so-called "interconnect spacers," each have first and second opposing portions and are coupled to respective surfaces of first semiconductor structure 1110 and second semiconductor structure 1120. In particular, spacer 1131 has a first portion coupled to the second surface of interconnect pad 1112 of first semiconductor structure 1110 and a second opposing portion coupled to the second surface of interconnect pad 1121 of second semiconductor structure 1120. Additionally, spacer 1133 has a first portion coupled to the second surface of interconnect pad 1114 of first semiconductor structure 1110 and a second opposing portion coupled to the second surface of interconnect pad 1123 of second semiconductor structure 1120. In one embodiment, spacers 1131, 1133 include one or more electrically and thermally conductive materials (e.g., Au, Al and Cu).

Spacers 1131, 1133 may, for example, mechanically couple the second semiconductor structure 1120 to the first semiconductor structure 1110 and provide for efficient heat dissipation between the first and second semiconductor structures 1110, 1120 during system operation. In particular, the materials from which the spacers 1131, 1133 are provided may be efficient at low and high temperatures and at wide temperature ranges, providing for efficient heat dissipation.

Spacers 1131, 1133 may also control pitch between the first surface of second semiconductor structure 1120 and the second surface of first semiconductor structure 1110. The spacers 1131, 1133 may further control a height (e.g., a distance between first and second opposing portions) of the interconnect structure 1120 (e.g., an Indium (In) microbump) during flip-chip bonding of second semiconductor structure 1120 to first semiconductor structure 1110. The interconnect spacers may also keep a corresponding semiconductor structure (e.g., second semiconductor structure 1120) away from "lossy" Silicon (Si).

In one embodiment, at least one of spacers 1131, 1133 is a wire (e.g., an Au or Al wire) which acts as a spacer. The wire can, for example, create a 3D wall to isolate specific devices or semiconductor structures (e.g., isolate semiconductor structure 1120 from one or more other semiconductor structures). 3D wall isolation can use dielectric bridges. Additionally, an Al wire can make or provide a superconducting 3D wall. In some embodiments, it is possible for the wire to act as a spacer an inductor. The wire can be a 3D transmission line and/or a spiral and/or a solenoid inductor.

During coupling or bonding of the second semiconductor structure 1120 to the first semiconductor structure 1110, interconnect structure 1132 may melt and react with a UBM to produce a reliable interconnect with substantially no interface issues at a relatively low temperature (e.g., about two hundred fifty degrees Celsius) and, thus, create a high performance interconnect. Additionally, interconnect structure 1132 may create a low resistance interconnect between the first and second semiconductor structures 1110, 1120 (e.g., due to the material(s) from which the interconnect structure 1132 is provided).

It should be appreciated that in some embodiments at least one of spacers 1131, 1133 may be provided as an interconnect structure for electrically and mechanically coupling the second semiconductor structure 1120 to the first semiconductor structure 1110. Additionally, in other embodiments interconnect structure 1132 may be provided as an interconnect spacer as described above.

Further, in one embodiment, spacers 1131, 1132 are each coupled to or provided as part of second semiconductor structure 1110 and interconnect structure 1132 is coupled to or provided as part of first semiconductor structure 1110, or vice versa, or a combination thereof. A height of interconnect structure 1132 (i.e., a distance between first and second opposing portions in the illustrated embodiment) may be larger than a corresponding height of spacer 1131 and spacer 1133 prior to bonding. Additionally, in one embodiment, spacers 1131, 1133 are each provided as solder (e.g. Indium, tin-lead, indium-tin etc.) coated bumps (gold, silver, etc) as spacer. Here solder will provide superconductivity and gold will provide high thermal conductivity necessary for heat dissipation. In another example gold bump can be replaced with UBM coated etched or deposited Si. In one example, around 35 micron tall, 30 micron diameter Indium bump when bonded with 12 micron tall around 60 micron diameter coined gold bump spacer, it produces flip-chip with around 12 micron spacing. In general tolerance of spacing in entire flip-chip will depend on thickness variation of spacer. In general, spacer with less than 250 nm thickness variation can produce flip-chip spacing within 1 micron variation. In one example, spacer thickness ranges from about 2 microns to about 20 microns. Wire or stacking multiple gold ball can increase spacer thickness above 20 microns.

Figure 12:
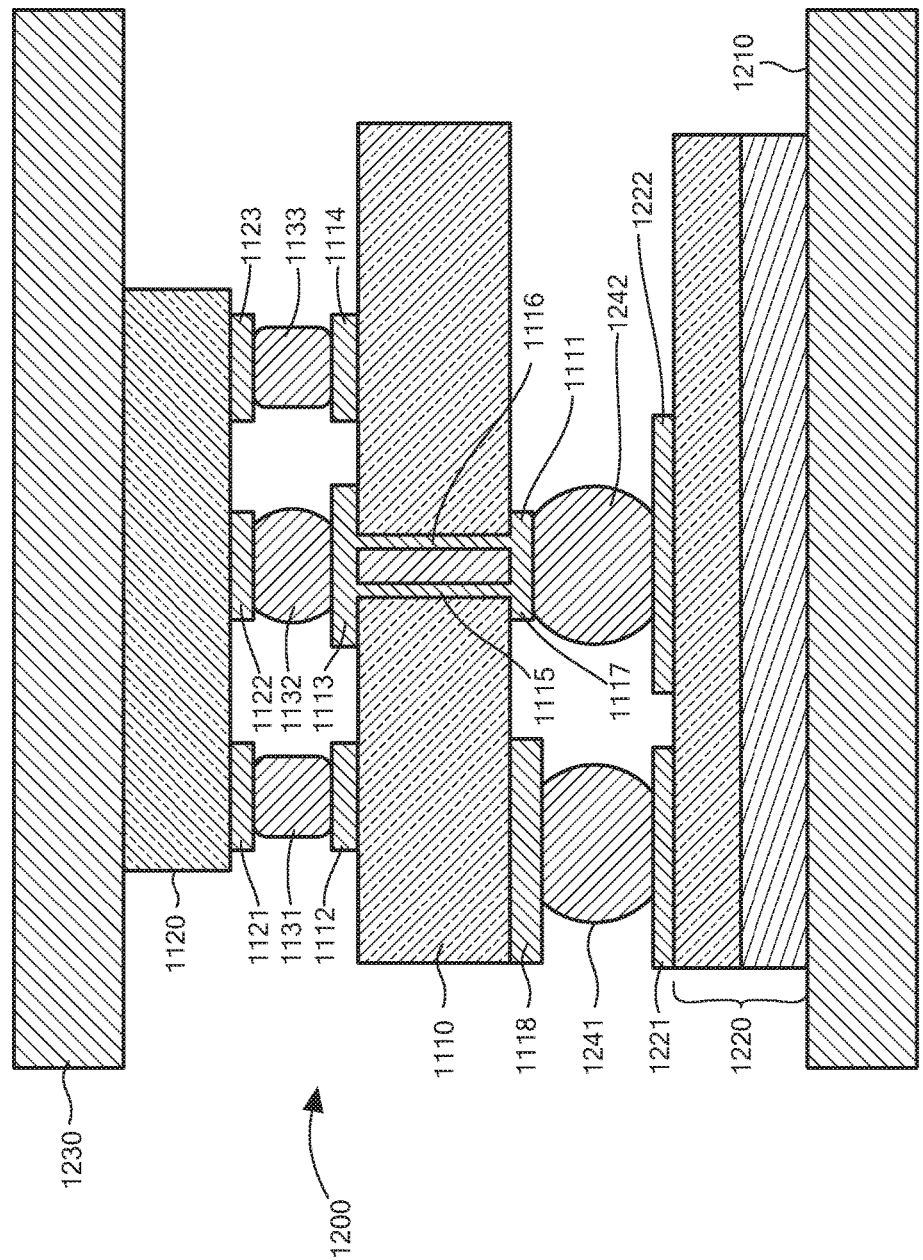
FIG. 12 is a block diagram of a further example semiconductor structure as may be formed using an interconnect structure and a spacer according to the disclosure.

Referring now to FIG. 12, in which like elements of FIG. 11 are provided having like reference designations, an example multi-layer semiconductor structure 1200 includes first semiconductor structure 1110 and second semiconductor structure 1120. Semiconductor device 1200 also includes interconnect structure 1132 and spacers 1131, 1132. In the illustrated embodiment, semiconductor structure 1200 further includes a first heat dissipation structure 1210, a third semiconductor structure 1220 and a second heat dissipation structure 1230. Additionally, semiconductor structure 1200 further includes an interconnect structure 1242 and a spacer 1241.

Third semiconductor structure 1220 (e.g., an MCM or PCB) has first and second opposing surfaces and includes interconnect pads 1221, 1222. Interconnect pad 1221, 1222, which each may be the same as or similar to interconnect pad 1121 of second semiconductor structure 1120, for example (e.g., including Cu, or Cu/Ni/Au), have a first surface which is disposed over or beneath selected portions of the second surface of third semiconductor structure 1220. The first surface of interconnect pad 1221 may be electrically coupled to first selected electrical connections in the third semiconductor structure 1220. Additionally, the first surface of interconnect pad 1222 may be electrically coupled to second selected electrical connections in the third semiconductor structure 1220.

Interconnect structure 1242, which may be the same as or similar to interconnect structure 1132, for example, is disposed between the first surface of first semiconductor structure 1110 and the second surface of third semiconductor structure 1220. Interconnect structure 1242 is also electrically coupled to the second surface of interconnect pad 1111 of first semiconductor structure 1110, and to the second surface of interconnect pad 1222 of third semiconductor structure 1220.

Additionally, spacer 1241, which may be the same as or similar to spacer 1131 and/or spacer 1133, is disposed between the first surface of first semiconductor structure 1110 and the second surface of third semiconductor structure 1220. Spacer 1241 is also electrically coupled to the second surface of an interconnect pad 1118 of first semiconductor structure 1110, and to the second surface of interconnect pad 1221 of third semiconductor structure 1220. Similar to spacers 1131 and 1133, spacer 1241 may be used to provide increased heat dissipation between the semiconductor structures.

First heat dissipation structure 1210 (e.g., a heat sink device or cold pate) has a surface (e.g., a second surface) which is disposed beneath and thermally coupled to the first surface of third semiconductor structure 1220. In one embodiment, the second surface of first heat dissipation structure 1210 is directly coupled to the first surface of third semiconductor structure 1220 (e.g., for efficient heat dissipation).

Additionally, in one embodiment, a thermal interface structure (not shown) and/or thermal interface materials (e.g., Indium (In) preform) (not shown) may be disposed between the second surface of first heat dissipation structure 1210 and the first surface of third semiconductor structure 1210. The thermal interface structures and/or thermal interface materials may, for example, provide mechanical strength to the bond(s) formed between the first heat dissipation structure 1210 and the third semiconductor structure 1220 (i.e., resulting from the coupling). The thermal interface structures and/or thermal interface materials may also reduce air gaps or spaces which may form between the first heat dissipation structure 1210 and the third semiconductor structure 1220.

Additionally, in some embodiments a thermally conductive adhesive material (e.g., a Nickel (Ni) or Gold (Au) adhesive material) (not shown) is disposed between the second surface of first heat dissipation structure 1210 and the first surface of third semiconductor structure 1220. Such may, for example, provide for increased heat dissipation between the third semiconductor structure 1220 and the first heat dissipation structure 1210.

Second heat dissipation structure 1230, which may be the same as or similar to first heat dissipation structure 1210 in some embodiments, has a surface (e.g., a first surface) which is disposed over and thermally coupled to the second surface of second semiconductor structure 1120 (e.g., a Qubit chip). Additionally, similar to first heat dissipation structure 1210, in one embodiment the second surface of second heat dissipation structure 1230 is directly coupled to the second surface of second semiconductor structure 1120 (e.g., for efficient heat dissipation). Second heat dissipation structure 1230 may, for example, remove heat from each of the first semiconductor structure 1110 and the second semiconductor structure 1120 during system operation (e.g., to minimize noise and increase performance of the first semiconductor structure 1110 and the second semiconductor structure 1120). It is to be appreciated that heat removal from the semiconductor structures during system operation may be critical to minimize noise and increase performance of the semiconductor structure 1200.

In one embodiment first semiconductor structure 1110 can be provided as an organic laminate chip carrier, and third semiconductor structure 1120 can be provided as an organic printed circuit board (PCB). Examples of organic materials suitable for use in such structures include fiberglass-reinforced or non-reinforced epoxy resins (sometimes referred to simply as FR4 material, meaning its Flame Retardant rating), poly-tetrafluoroethylene (Teflon), polyimides, polyamides, cyanate resins, photoimageable materials, and other like materials, or combinations thereof. Examples of electrically conductive materials for the circuit layers include copper or copper alloy. If the dielectric is a photoimageable material, it is photoimaged or photopatterned, and developed to reveal the desired circuit pattern, including the desired opening(s) as defined herein, if required. The dielectric material may be curtain coated or screen applied, or it may be supplied as a dry film or in other sheet form.

First semiconductor structure 1110, second semiconductor structure 1120 and third semiconductor structure 1220 can each have one or more Cu filled through vias, stacked vias, and/or staggered vias with a minimum spacing of about seventy micron between vias. Such vias may, for example, further increase heat dissipation in semiconductor structure 1200. As one example, heat may be dissipated from top and bottom portions of the semiconductor structure 1200 through use of the vias, first and second heat dissipation structures 1210, 1230, and the interconnect structures and/or spacers of semiconductor structure 1200.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application (e.g., circuitry in mobile phones, tablets, digital cameras and the like). In contrast, the concepts, systems, circuits and techniques sought to be protected herein may be found useful in substantially any application where a semiconductor manufacturer desires to fabricate multi-layer semiconductor structures (and devices) including superconducting semiconductor structures or integrated circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An interconnect structure formed on a semiconductor structure having a substrate and an interconnect pad, the interconnect structure comprising:
    a conductive structure having first and second opposing portions, wherein the first portion of the conductive structure is disposed over a surface of the interconnect pad and the second portion of the conductive structure extends a predetermined distance from the interconnect pad surface, and wherein the predetermined distance is substantially greater than a thickness of a resist layer disposed over the interconnect pad surface during fabrication of the conductive structure, the resist layer thickness corresponding to a distance between first and second opposing surfaces of the resist layer, the resist layer having an opening formed therein for receiving conductive materials used to form the conductive structure, the resist layer opening extending between the first and second resist layer surfaces, wherein the second portion of the conductive structure is disposed over the resist layer opening and onto the second surface of the resist layer during the conductive structure fabrication, such that the second portion of the conductive structure has a surface with a dimension greater than a width or radius of at least a first portion of the resist layer opening proximate to the second surface of the resist layer;
    wherein the conductive structure has an aspect ratio of a first dimension corresponding to a distance between the first and second portions to a second dimension corresponding to width of the conductive structure, the aspect ratio is a function of the thickness of the resist layer.

2. The interconnect structure of claim 1 wherein the resist layer corresponds to a double spin coated resist layer comprising: a first spin resist layer having first and second opposing surfaces and comprised of a resist material, and a second spin resist layer having first and second opposing surfaces and comprised of the same resist material of the first spin resist layer, wherein the first surface of the first spin resist layer is disposed over the interconnect pad surface, and the first surface of the second spin resist layer is disposed over the second surface of the first spin resist layer, the second spin resist layer reducing non-uniformities in the first spin resist layer and providing for the double spin coated resist layer having a substantially smooth surface for contact lithography.

3. The interconnect structure of claim 2 wherein the interconnect structure is coupled to another semiconductor structure to form a multi-layer semiconductor structure, the multi-layer semiconductor structure comprising a spacer disposed between the semiconductor structure and the second semiconductor structure to control an interconnect height of the interconnect structure during flip-chip bonding.

4. The interconnect structure of claim 3 wherein the spacer comprises a solder coated metal bump spacer wherein solder provides superconductivity and metal provides a high thermal conductivity to promote heat dissipation.

5. The interconnect structure of claim 3 wherein the spacer comprises at least one metal coating on etched or deposited silicon, and wherein the conductive structure comprises solder and the solder provides a superconductivity characteristic and the silicon provides a high thermal conductivity characteristic for heat dissipation.

6. The interconnect structure of claim 3 wherein the spacer is comprised of at least one of: silicon, deposited silicon, high resistive silicon, oxide coated silicon, silicon dioxide, glass, etched silicon, annealed oxide, oxide etched recrystallized silicon, aluminum oxide and metal.

7. The interconnect structure of claim 3 wherein the spacer comprises a gold or aluminum wire.

8. The interconnect structure of claim 7 wherein the gold or aluminum wire is disposed to provide a three-dimensional wall to isolate or partially isolate the semiconductor device from the second semiconductor device of the multi-layer semiconductor structure.

9. The interconnect of claim 7 wherein the gold or aluminum wire is disposed such that it provides an inductive characteristic.

10. The interconnect of claim 7 wherein the gold or aluminum wire is disposed such that it provides at least one of: a three-dimensional transmission line; a spiral inductor; and a solenoid inductor.

11. The interconnect structure of claim 3 wherein the spacer includes one or more thermally conductive materials.

12. The interconnect structure of claim 2 wherein the first spin resist layer has a first thickness corresponding to a distance between the first and second surfaces of the first spin resist layer, and the second spin resist layer has a second thickness corresponding to a distance between the first and second surfaces of the second spin resist layer, wherein the second thickness is greater than the first thickness, and the first and second spin resist layers are spread onto respective surfaces at a substantially same spin speed during formation of the double spin coated resist layer.

13. The interconnect structure of claim 1 wherein the resist layer thickness corresponds to a single resist coating having a thickness of about 10 micron such that the predetermined distance corresponds to a distance of up to about 15 micron.

14. The interconnect structure of claim 1 wherein the resist layer thickness corresponds to a thickness of about 10 micron and wherein the resist layer has a top resist opening of about 10-16 micron and a bottom resist opening of about 16-22 micron such that the predetermined distance corresponds to a distance of about 15 micron, the top resist opening corresponding to the first portion of the resist layer opening, and the bottom resist opening corresponding to a second opposing portion of the resist layer opening proximate to the first surface of the resist layer and the interconnect pad surface.

15. The interconnect structure of claim 1 wherein the resist layer thickness corresponds to a thickness of about 6-9 micron and wherein the resist layer has a top resist opening of about 4-8 micron and a bottom resist opening of about 6-10 micron such that the predetermined distance correspondence to a distance of about 4-12 micron, the top resist opening corresponding to the first portion of the resist layer opening, and the bottom resist opening corresponding to a second opposing portion of the resist layer opening proximate to the first surface of the resist layer and the interconnect pad surface.

16. The interconnect structure of claim 1 wherein the semiconductor structure further comprises at least one of: a superconducting device, a qubit and a Josephson junction.

17. The interconnect structure of claim 1 wherein the semiconductor structure further comprises one or more high Q, low loss resonator structures responsive to signals in radio frequency (RF) and/or microwave frequency regions.

18. The interconnect structure of claim 8, wherein the three-dimensional wall comprises at least one of: a metal bridge; a superconducting bridge; and a dielectric bridge.

19. The interconnect structure of claim 1 wherein the semiconductor structure comprises at least one of: a partially superconducting through silicon via (TSV) and a superconducting TSV.

20. The interconnect structure of claim 1 wherein the resist layer thickness corresponds to a thickness of about 30 micron such that the predetermined distance corresponds to a distance of up to about 40 micron.

21. An interconnect structure formed on a semiconductor structure having a substrate and an interconnect pad, the interconnect structure comprising:
a conductive structure having first and second opposing portions, wherein the first portion of the conductive structure is disposed over a surface of the interconnect pad and the second portion of the conductive structure extends a predetermined distance from the interconnect pad surface, and wherein the predetermined distance is substantially greater than a thickness of a resist layer disposed over the interconnect pad surface during fabrication of the conductive structure, the resist layer thickness corresponding to a distance between first and second opposing surfaces of the resist layer, wherein the second opposing portion of the conductive structure forms an archical shaped curve, and wherein the interconnect structure provides a substantially zero resistance interconnect path between the semiconductor structure and one or more other semiconductor structures to which the semiconductor structure is coupled during flip-chip bonding, the interconnect path having substantially no reflections and power losses;
wherein a measure of curvature of the second opposing portion of the conductive structure is a function of a ratio between a height of the conductive structure with respect to a predetermined distance of the resist layer.

* * * * *